US012792101B2

(12) United States Patent
Yoshitani et al.

(10) Patent No.: US 12,792,101 B2
(45) **Date of Patent: *Nov. 10, 2026**

(54) ELECTRONIC DEVICE

(71) Applicant: SEMICONDUCTOR ENERGY LABORATORY CO., LTD., Atsugi (JP)

(72) Inventors: Yusuke Yoshitani, Isehara (JP); Hideaki Kuwabara, Isehara (JP); Natsuko Takase, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/916,826

(22) Filed: Oct. 16, 2024

(65) Prior Publication Data

US 2026/0104740 A1 Apr. 16, 2026

Related U.S. Application Data

(60) Continuation of application No. 17/845,233, filed on Jun. 21, 2022, now Pat. No. 12,153,473, which is a (Continued)

(30) Foreign Application Priority Data

Apr. 23, 2015 (JP) ................................. 2015-088420
Aug. 7, 2015 (JP) ................................. 2015-157021

(51) Int. Cl.
*G06F 1/16* (2006.01)
*G04G 17/04* (2006.01)

(Continued)

(52) U.S. Cl.
CPC ......... *G06F 1/1675* (2013.01); *G04G 17/045* (2013.01); *G04G 21/04* (2013.01);

(Continued)

(58) Field of Classification Search
CPC ...... G06F 1/1675; G06F 1/163; G06F 1/1635; G06F 1/1652; G06F 1/1656;

(Continued)

(56) References Cited

U.S. PATENT DOCUMENTS 5,432,676 A 7/1995 Satoh et al.
5,541,813 A 7/1996 Satoh et al.

(Continued)

FOREIGN PATENT DOCUMENTS

CH 707399 6/2014
CN 001337016 A 2/2002

(Continued)

OTHER PUBLICATIONS

Chinese Office Action (Application No. 202310567843.9) Dated Sep. 11, 2025.

(Continued)

*Primary Examiner* — Menatoallah Youssef
*Assistant Examiner* — Michael J Warmflash
(74) *Attorney, Agent, or Firm* — Fish & Richardson P.C.

(57) ABSTRACT

A highly convenient electronic device used while being worn on a body is provided. The electronic device is an arm-worn electronic device including a display panel, a power storage device, a circuit, and a sealing structure. The display panel displays an image with power supplied from the power storage device. The circuit includes an antenna and charges the power storage device wirelessly. Inside the sealing structure, the display panel, the power storage device, and the circuit are provided. The sealing structure includes a portion that transmits visible light. The sealing structure can be worn on an arm or is connected to a structure body that can be worn on an arm.

6 Claims, 45 Drawing Sheets

Related U.S. Application Data continuation of application No. 16/864,287, filed on May 1, 2020, now Pat. No. 11,397,451, which is a division of application No. 15/095,286, filed on Apr. 11, 2016, now Pat. No. 10,664,020.

(51) Int. Cl.

| | |
|---|---|
| ***G04G 21/04*** | (2013.01) |
| ***G06F 3/041*** | (2006.01) |
| ***G06F 3/044*** | (2006.01) |
| ***G09G 3/36*** | (2006.01) |
| ***H10K 102/00*** | (2023.01) |

(52) U.S. Cl.

CPC ............ *G06F 1/163* (2013.01); *G06F 1/1635* (2013.01); *G06F 1/1652* (2013.01); *G06F 1/1656* (2013.01); *G06F 1/1694* (2013.01); *G06F 3/0412* (2013.01); *G06F 3/0446* (2019.05); *G09G 3/3611* (2013.01); *G06F 2203/04102* (2013.01); *G06F 2203/04103* (2013.01); *G09G 2300/046* (2013.01); *G09G 2300/0495* (2013.01); *G09G 2380/02* (2013.01); *H10K 2102/311* (2023.02)

(58) Field of Classification Search

CPC .... G06F 1/1694; G06F 3/0412; G06F 3/0446; G06F 2203/04102; G06F 2203/04103; G04G 17/045; G04G 21/04; G04G 17/00; G04G 9/00; G04G 9/12; G04G 17/04; G04G 17/08; G04G 19/00; G04G 21/00; G04G 21/02; G04G 21/06; G09G 3/3611; G09G 2300/046; G09G 2300/0495; G09G 2380/02; G09G 3/36; H10K 2102/311; Y02E 60/10; G04R 60/10

See application file for complete search history.

(56) References Cited

U.S. PATENT DOCUMENTS 6,216,490 B1 4/2001 Radley-Smith
6,307,751 B1 10/2001 Bodony et al.
6,619,836 B1 9/2003 Silvant. et al.
6,637,906 B2 10/2003 Knoerzer et al.
6,876,410 B2 4/2005 Kawata
6,886,864 B2 5/2005 Nelson et al.
7,067,976 B2 6/2006 Yamazaki
7,129,102 B2 10/2006 Yamazaki
7,372,200 B2 5/2008 Yamazaki
7,396,049 B2 7/2008 Nelson et al.
7,460,085 B2 12/2008 Ishii
7,518,692 B2 4/2009 Yamazaki et al.
7,583,566 B2 9/2009 Yan
7,623,215 B2 11/2009 Motomatsu
7,652,359 B2 1/2010 Takayama et al.
7,722,245 B2 5/2010 Baba et al.
7,767,048 B2 8/2010 Kanbayashi
7,999,469 B2 8/2011 Kase et al.
8,082,003 B2 12/2011 Jee
8,311,595 B2 11/2012 Takatsuka et al.
8,319,725 B2 11/2012 Okamoto et al.
8,415,208 B2 4/2013 Takayama et al.
8,559,182 B2 10/2013 Ohira
8,604,907 B2 12/2013 Ludwig et al.
8,698,262 B2 4/2014 Tsurume et al.
8,738,104 B2 5/2014 Yeates
8,810,508 B2 8/2014 Okamoto et al.
8,814,754 B2 8/2014 Weast et al.
8,902,597 B2 12/2014 Sato
8,974,349 B2 3/2015 Weast et al.
9,011,292 B2 4/2015 Weast et al.
9,024,184 B2 5/2015 Kajiya et al.
9,024,863 B2 5/2015 Okamoto et al.
9,116,567 B2 8/2015 Alberth, Jr. et al.
9,134,704 B2 9/2015 Aizawa et al.
9,209,491 B2 12/2015 Kim et al.
9,259,615 B2 2/2016 Weast et al.
9,289,649 B2 3/2016 Weast et al.
9,314,665 B2 4/2016 Weast et al.
9,375,608 B2 6/2016 Weast et al.
9,383,220 B2 7/2016 Crankson et al.
9,397,117 B2 7/2016 Okamoto et al.
9,401,503 B2 7/2016 Kritzer et al.
9,415,266 B2 8/2016 Weast et al.
9,474,955 B2 10/2016 Cobbett et al.
9,521,245 B2 12/2016 Yang
9,539,486 B2 1/2017 Weast et al.
9,568,891 B2 2/2017 Adams et al.
9,616,289 B2 4/2017 Weast et al.
9,651,990 B2 5/2017 Heck. et al.
9,713,271 B2 7/2017 Hiroki et al.
9,734,477 B2 8/2017 Weast et al.
9,735,443 B2 8/2017 Takahashi et al.
9,750,976 B2 9/2017 Weast et al.
9,757,640 B2 9/2017 Weast et al.
9,954,389 B2 * 4/2018 Yoshitani ................ H02J 50/20
9,980,389 B2 5/2018 Okamoto et al.
10,097,245 B2 10/2018 Kim et al.
10,369,730 B2 8/2019 Heck et al.
10,444,791 B2 10/2019 Cobbett et al.
10,456,623 B2 10/2019 Weast et al.
10,580,796 B2 3/2020 Okamoto et al.
10,664,020 B2 * 5/2020 Yoshitani .............. G06F 1/1675
10,665,888 B2 5/2020 Takahashi et al.
10,998,750 B2 * 5/2021 Yoshitani ................ H02J 50/20
11,397,451 B2 * 7/2022 Yoshitani .............. G06F 1/1675
12,153,473 B2 * 11/2024 Yoshitani .............. G06F 1/1675
2001/0011025 A1 8/2001 Ohki et al.
2003/0026171 A1 * 2/2003 Brewer .................. G04G 17/08 368/239
2006/0117458 A1 6/2006 Ishihara et al.
2008/0158217 A1 7/2008 Hata et al.
2008/0227507 A1 9/2008 Joo
2008/0297350 A1 12/2008 Iwasa et al.
2009/0284164 A1 11/2009 Ray et al.
2010/0029327 A1 2/2010 Jee
2010/0066710 A1 3/2010 Koibuchi
2010/0210322 A1 8/2010 Kim et al.
2011/0013491 A1 1/2011 Fujisawa
2012/0201104 A1 8/2012 Amenduni Gresele
2012/0316456 A1 12/2012 Rahman et al.
2013/0126533 A1 5/2013 Klosky
2013/0271390 A1 10/2013 Lyons et al.
2014/0015470 A1 1/2014 Lim et al.
2014/0049882 A1 2/2014 Lin et al.
2014/0143933 A1 5/2014 Low et al.
2014/0247547 A1 9/2014 Jung et al.
2014/0306656 A1 10/2014 Tabata et al.
2014/0375246 A1 12/2014 Boysen, III et al.
2015/0022957 A1 * 1/2015 Hiroki .................... G04G 17/04 361/679.01
2015/0041795 A1 2/2015 Suzuki et al.
2015/0060896 A1 3/2015 Okano et al.
2015/0062525 A1 3/2015 Hirakata
2015/0077438 A1 3/2015 Tamaki et al.
2015/0111558 A1 4/2015 Yang
2015/0138699 A1 5/2015 Yamazaki
2015/0227248 A1 8/2015 Yamazaki et al.
2015/0261254 A1 9/2015 Hiroki et al.
2015/0277496 A1 10/2015 Reeves et al.
2015/0303735 A1 10/2015 Kari
2015/0338831 A1 11/2015 Aizawa et al.
2015/0364938 A1 12/2015 Lapetina et al.
2016/0013457 A1 1/2016 Suh et al.
2016/0048168 A1 2/2016 Choi et al.
2016/0070393 A1 3/2016 Sharma et al.
2016/0072536 A1 3/2016 Wang
2016/0091922 A1 3/2016 Nazzaro et al.
2016/0097501 A1 4/2016 Yoshitani et al.
2016/0098137 A1 4/2016 Kim et al.
2017/0347471 A1 11/2017 Hiroki et al.

(56) References Cited

U.S. PATENT DOCUMENTS

| | | | |
|---|---|---|---|
| 2018/0138558 A1 | 5/2018 | Lu et al. |
| 2019/0366157 A1 | 12/2019 | Weast et al. |
| 2020/0194465 A1 | 6/2020 | Okamoto et al. |

FOREIGN PATENT DOCUMENTS

| | | | |
|---|---|---|---|
| CN | 101159108 A | 4/2008 |
| CN | 101640712 A | 2/2010 |
| CN | 101802890 A | 8/2010 |
| CN | 101897058 A | 11/2010 |
| CN | 202261436 U | 5/2012 |
| CN | 103378337 A | 10/2013 |
| CN | 103399423 A | 11/2013 |
| CN | 103403627 A | 11/2013 |
| CN | 203324699 U | 12/2013 |
| CN | 103869690 A | 6/2014 |
| CN | 104157116 A | 11/2014 |
| CN | 203930353 U | 11/2014 |
| CN | 104395851 A | 3/2015 |
| EP | 1158375 A | 11/2001 |
| EP | 1213629 A | 6/2002 |
| EP | 1220017 A | 7/2002 |
| EP | 1420477 A | 5/2004 |
| EP | 1909253 A | 4/2008 |
| EP | 2150031 A | 2/2010 |
| EP | 2618282 A | 7/2013 |
| EP | 2838045 A | 2/2015 |
| EP | 2863276 A | 4/2015 |
| JP | 05-259656 A | 10/1993 |
| JP | 2001-037518 A | 2/2001 |
| JP | 2001-118674 A | 4/2001 |
| JP | 2001-217732 A | 8/2001 |
| JP | 2002-517848 | 6/2002 |
| JP | 2002-366059 A | 12/2002 |
| JP | 2003-086359 A | 3/2003 |
| JP | 2004-133468 A | 4/2004 |
| JP | 2005-502553 | 1/2005 |
| JP | 2005-250442 A | 9/2005 |
| JP | 2006-253053 A | 9/2006 |
| JP | 2006-280388 A | 10/2006 |
| JP | 2007-233338 A | 9/2007 |
| JP | 2007-278821 A | 10/2007 |
| JP | 3138967 B | 1/2008 |
| JP | 2009-201999 A | 9/2009 |
| JP | 2010-073433 A | 4/2010 |
| JP | 2010-283539 A | 12/2010 |
| JP | 2010-540353 | 12/2010 |
| JP | 2011-239139 A | 11/2011 |
| JP | 2012-043082 A | 3/2012 |
| JP | 2012-118341 A | 6/2012 |
| JP | 2013-062094 A | 4/2013 |
| JP | 2013-120837 A | 6/2013 |
| JP | 2013-239435 A | 11/2013 |
| JP | 2014-111365 A | 6/2014 |
| JP | 2014-132451 A | 7/2014 |
| JP | 3193457 B | 10/2014 |
| JP | 2015-038868 A | 2/2015 |
| KR | 2012-0096780 A | 8/2012 |
| WO | WO-1999/063792 | 12/1999 |
| WO | WO-2003/023807 | 3/2003 |
| WO | WO-2009/078632 | 6/2009 |
| WO | WO-2010/128614 | 11/2010 |
| WO | WO-2011/103317 | 8/2011 |
| WO | WO-2012/061438 | 5/2012 |
| WO | WO-2012/061440 | 5/2012 |
| WO | WO-2013/109577 | 7/2013 |
| WO | WO-2013/109762 | 7/2013 |
| WO | WO-2013/162783 | 10/2013 |
| WO | WO-2014/057241 | 4/2014 |
| WO | WO-2014/073455 | 5/2014 |
| WO | WO-2015/008716 | 1/2015 |
| WO | WO-2015/130127 | 9/2015 |

OTHER PUBLICATIONS

Chinese Office Action (Application No. 201610257086.5) Dated Jun. 8, 2020.

Chinese Office Action (Application No. 202110607702.6) Dated Mar. 1, 2022.

* cited by examiner

ELECTRONIC DEVICE

CROSS-REFERENCE TO RELATED APPLICATIONS

This application is a continuation of U.S. application Ser. No. 17/845,233, filed Jun. 21, 2022, now allowed, which is a continuation of U.S. application Ser. No. 16/864,287, filed May 1, 2020, now U.S. Pat. No. 11,397,451, which is a divisional of U.S. application Ser. No. 15/095,286, filed Apr. 11, 2016, now U.S. Pat. No. 10,664,020, which claims the benefit of foreign priority applications filed in Japan as Serial No. 2015-088420 on Apr. 23, 2015, and Serial No. 2015-157021 on Aug. 7, 2015, all of which are incorporated by reference.

BACKGROUND OF THE INVENTION

1. Field of the Invention

One embodiment of the present invention relates to an electronic device. In particular, one embodiment of the present invention relates to a wearable electronic device, for example, an arm-worn electronic device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

In this specification and the like, electronic devices mean all devices which operate by being supplied with electric power, and electro-optical devices, information terminal devices, and the like including power sources (e.g., power storage devices) are all electronic devices.

In this specification and the like, power storage devices mean all elements and devices that have a function of storing electric power, and a storage battery (also referred to as a secondary battery) such as a lithium-ion secondary battery, a lithium-ion capacitor, an electric double layer capacitor, and the like are all power storage devices.

2. Description of the Related Art

Display devices and electronic devices used while being worn on human bodies have recently been developed and are referred to as wearable displays, wearable devices, and the like. For example, head-mounted displays which are mounted on heads and smart watches which are worn on arms have been developed.

Patent Document 1 discloses a ring-shaped display device that can be used while being worn on a human body.

Since the wearable devices are used while being worn on human bodies, a reduction in weight of the entire device including a display panel, a driver circuit, and a power source is required to achieve high portability and comfort of wearing the wearable devices.

Wearable devices are generally equipped with power storage devices. For example, lithium-ion secondary batteries have been actively developed because the capacity thereof can be increased and the size thereof can be reduced.

Light-emitting elements utilizing electroluminescence (also referred to as EL elements) have features of the ease of being thin, lightweight, and flexible, high-speed response to input signals, capability of DC low voltage driving, and the like, and thus are display elements which are preferably used in wearable displays.

REFERENCE

Patent Document

[Patent Document 1] United States Patent Application Publication No. 2015/0077438

SUMMARY OF THE INVENTION

Wearable devices that can be used in playing water sports (including marine sports), such as swimming and scuba diving, or taking a bath are required.

Wearable devices are used in a variety of environments; therefore, display panels and power storage devices which can be used in a wide temperature range are required. For example, electronic devices do not operate normally in some cases in the following environment: in a place exposed to direct sunlight, such as on a dashboard or by the window of a car; inside of a sun-heated car; a high-temperature environment such as desert; or a low-temperature environment such as a cold region with a glacier.

An object of one embodiment of the present invention is to provide an electronic device which can be used in water. Another object of one embodiment of the present invention is to provide an electronic device having high water resistance. Another object of one embodiment of the present invention is to provide an electronic device used while being worn on a human body. Another object of one embodiment of the present invention is to provide an all-weather electronic device. Another object of one embodiment of the present invention is to provide a highly convenient electronic device. Another object of one embodiment of the present invention is to provide a highly reliable electronic device. Another object of one embodiment of the present invention is to provide an electronic device having high visibility irrespective of surrounding brightness.

Another object of one embodiment of the present invention is to provide an electronic device which can be used in a wide temperature range. Another object of one embodiment of the present invention is to provide a small, lightweight, or flexible electronic device. Another object of one embodiment of the present invention is to provide an electronic device with a high degree of safety. Another object of one embodiment of the present invention is to provide an electronic device with low power consumption. Another object of one embodiment of the present invention is to provide an electronic device which can be used for a long time per charge. Another object of one embodiment of the present invention is to provide a novel electronic device.

Note that the descriptions of these objects do not disturb the existence of other objects. In one embodiment of the present invention, there is no need to achieve all the objects. Other objects can be derived from the description of the specification, the drawings, and the claims.

One embodiment of the present invention is an electronic device including a display panel, a power storage device, a circuit, and a sealing structure. The display panel includes a light-emitting element. The light-emitting element has a function of emitting light with power supplied from the power storage device. The circuit includes an antenna and has a function of charging the power storage device wirelessly. Inside the sealing structure, the display panel, the power storage device, and the circuit are provided. At least part of the sealing structure has a function of transmitting light emitted from the light-emitting element. The sealing structure can be worn on an arm.

In the above-described electronic device, when a user wears the sealing structure on his/her arm, the power storage device, the antenna, and the display panel may be stacked in this order from the arm side.

Another embodiment of the present invention is an electronic device including a display panel, a power storage device, a circuit, a sealing structure, and a structure body. The display panel includes a light-emitting element. The light-emitting element has a function of emitting light with power supplied from the power storage device. The circuit includes an antenna and has a function of charging the power storage device wirelessly. The sealing structure is connected to the structure body. Inside the sealing structure, the display panel, the power storage device, and the circuit are provided. At least part of the sealing structure has a function of transmitting light emitted from the light-emitting element. The structure body can be worn on an arm.

In the above-described electronic device, when a user wears the structure body on his/her arm, the power storage device, the antenna, and the display panel may be stacked in this order from the arm side.

Another embodiment of the present invention is an electronic device including a display panel, a power storage device, a circuit, and a sealing structure. The display panel has a function of displaying an image with power supplied from the power storage device. The circuit includes an antenna and has a function of charging the power storage device wirelessly. Inside the sealing structure, the display panel, the power storage device, and the circuit are provided. At least part of the sealing structure has a function of transmitting visible light. The display panel includes a first display element and a second display element. The first display element includes a reflective layer which has a function of reflecting light. The first display element has a function of controlling light transmission. The reflective layer has an opening portion. The second display element includes a portion overlapping with the opening portion. The second display element has a function of emitting light toward the opening portion. The opening portion preferably has an area greater than or equal to 5% and less than or equal to 20% of the area of the reflective layer.

In the above electronic device, it is preferable that the display panel further include a signal line, a pixel circuit, a first conductive layer, a second conductive layer, and an insulating layer. The second display element is electrically connected to the pixel circuit. The first display element is electrically connected to the first conductive layer. The first conductive layer includes a portion overlapping with the second conductive layer with the insulating layer provided therebetween. The first conductive layer is electrically connected to the second conductive layer. The second conductive layer is electrically connected to the pixel circuit. The pixel circuit is electrically connected to the signal line.

Another embodiment of the present invention is an electronic device including a display panel, a power storage device, a circuit, and a sealing structure. The display panel has a function of displaying an image with power supplied from the power storage device. The circuit includes an antenna and has a function of charging the power storage device wirelessly. Inside the sealing structure, the display panel, the power storage device, and the circuit are provided. At least part of the sealing structure has a function of transmitting visible light. The display panel includes a liquid crystal element and a light-emitting element. The liquid crystal element includes a liquid crystal layer, a first conductive layer, and a second conductive layer. The first conductive layer has a function of reflecting light. The first conductive layer has an opening portion. The light-emitting element includes a layer containing a light-emitting substance, a third conductive layer, and a fourth conductive layer. The light-emitting element includes a portion overlapping with the opening portion. The light-emitting element has a function of emitting light toward the opening portion. The opening portion preferably has an area greater than or equal to 5% and less than or equal to 20% of the area of the first conductive layer.

In the above electronic device, it is preferable that the display panel further include a signal line, a pixel circuit, a fifth conductive layer, a sixth conductive layer, and an insulating layer. The light-emitting element is electrically connected to the pixel circuit. The liquid crystal element is electrically connected to the fifth conductive layer. The fifth conductive layer includes a portion overlapping with the sixth conductive layer with the insulating layer provided therebetween. The fifth conductive layer is electrically connected to the sixth conductive layer. The sixth conductive layer is electrically connected to the pixel circuit. The pixel circuit is electrically connected to the signal line.

In each of the electronic devices having the above structures, the sealing structure is preferably able to be worn on an arm. When a user wears the sealing structure on his/her arm, in the electronic device of one embodiment of the present invention, the power storage device, the antenna, and the display panel may be stacked in this order from the arm side.

Alternatively, in each of the electronic devices having the above structures, a structure body is preferably included. The sealing structure is connected to the structure body. The structure body can be worn on an arm. When a user wears the structure body on his/her arm, in the electronic device of one embodiment of the present invention, the power storage device, the antenna, and the display panel may be stacked in this order from the arm side.

In addition, in each of the above structures, one or more of an audio input portion, a touch sensor, an illuminance sensor, and a member which enables the electronic device to be worn on an arm may be included. The audio input portion or the touch sensor can be positioned inside or outside the sealing structure. The audio input portion, the touch sensor, and the illuminance sensor are each preferably positioned inside the sealing structure. The audio input portion, the touch sensor, and the illuminance sensor may each be connected to the display panel, the power storage device, the circuit, or the like. Alternatively, the display panel may include a touch sensor. The member which enables the electronic device to be worn on an arm is connected to the sealing structure or the structure body.

Furthermore, in each of the above structures, the display panel may have a curved surface whose radius of curvature is larger than or equal to 1 mm and smaller than or equal to 150 mm. Alternatively, in each of the above structures, the display panel may have a curved surface whose radius of curvature is larger than 150 mm. For example, the display panel may have a curved surface whose radius of curvature is larger than 150 mm and smaller than 1 m or a curved surface whose radius of curvature is larger than or equal to 1 m and smaller than or equal to 10 m. The curved surface of the display panel may be a concave surface or a convex surface, or both of them. In addition, in each of the above structures, the display panel may include a flexible portion.

Furthermore, in each of the above structures, the power storage device may have a curved surface whose radius of curvature is larger than or equal to 10 mm and smaller than or equal to 150 mm. In addition, in each of the above structures, the power storage device may include a flexible portion.

In addition, in each of the above structures, the inside of the sealing structure is preferably a reduced pressure atmosphere. Alternatively, in each of the above structures, a buoyancy material is preferably provided inside the sealing structure.

According to one embodiment of the present invention, an electronic device which can be used in water, an electronic device having high water resistance, an electronic device used while being worn on a human body, an all-weather electronic device, a highly convenient electronic device, a highly reliable electronic device, or an electronic device having high visibility irrespective of surrounding brightness can be provided.

Furthermore, according to one embodiment of the present invention, an electronic device which can be used in a wide temperature range, a small, lightweight, or flexible electronic device, an electronic device having high heat resistance, an electronic device with a high degree of safety, an electronic device with low power consumption, an electronic device which can be used for a long time per charge, or a novel electronic device can be provided.

Note that the description of these effects does not disturb the existence of other effects. One embodiment of the present invention does not necessarily have all the effects listed above. Other effects can be derived from the description of the specification, the drawings, and the claims.

BRIEF DESCRIPTION OF THE DRAWINGS

In the accompanying drawings:

FIGS. 20A, 20B, 20C1, and 20C2 illustrate an example of a power storage device;

FIGS. 42A, 42B1, and 42B2 illustrate examples of a display device;

FIGS. 43A, 43B1 and 43B2 illustrate an example of a display device;

DETAILED DESCRIPTION OF THE INVENTION

Figure 1A:
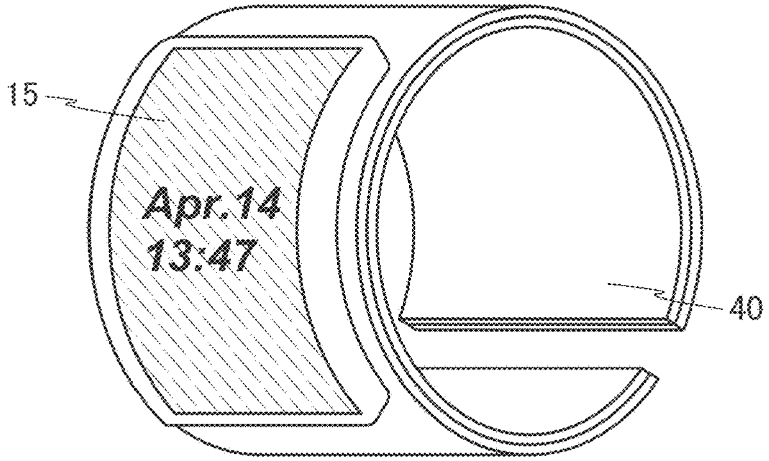
FIGS. 1A to 1G illustrate examples of an electronic device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not limited to the position, size, range, and the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Embodiment 1

In this embodiment, electronic devices of embodiments of the present invention will be described with reference to FIGS. 1A to 1G, FIGS. 2A to 2C, FIGS. 3A to 3F, FIGS. 4A and 4B, FIGS. 5A to 5D, FIGS. 6A to 6D, FIGS. 7A and 7B, FIGS. 8A to 8C, FIGS. 9A to 9D, FIGS. 10A to 10D, and FIGS. 11A to 11C.

In this embodiment, an arm-worn electronic device and a watch-type electronic device are mainly described as examples, and usage of an electronic device of one embodiment of the present invention is not particularly limited. For example, the electronic device may be used without being worn on or may be used while being worn on part other than an arm (a waist, a leg, or the like).

One embodiment of the present invention is an electronic device including a display panel, a power storage device, a circuit, and a sealing structure. The display panel includes a light-emitting element. The light-emitting element has a function of emitting light with power supplied from the power storage device. The circuit includes an antenna and has a function of charging the power storage device wirelessly. Inside the sealing structure, the display panel, the power storage device, and the circuit are provided. At least part of the sealing structure has a function of transmitting light emitted from the light-emitting element. As for the electronic device of one embodiment of the present invention, the sealing structure may be worn on an arm or a structure body connected to the sealing structure may be worn on an arm.

With the use of the sealing structure, the display panel, the power storage device, the circuit, and the like, which are sealed objects, can be protected, so that a sturdy electronic device can be fabricated. Moreover, with the use of a sealing structure having high water resistance, an electronic device which has high water resistance and can be used in water can be fabricated.

Note that in this specification and the like, among components of an electronic device of one embodiment of the present invention, components which are positioned inside the sealing structure and are sealed by the sealing structure are also collectively referred to as a sealed object.

In the fabrication of the electronic device of one embodiment of the present invention, the display panel and the power storage device can be collectively covered with and sealed by the sealing structure. Thus, a highly reliable electronic device can be simply fabricated. In addition, the sealing structure has a shape which can be worn on a human body snugly, such as a belt shape, whereby the sealing structure itself can be worn on a human body and the electronic device can be used as a wearable device.

In the electronic device of one embodiment of the present invention, the power storage device can be charged by contactless power transmission. Therefore, the power storage device does not need to be taken out from the sealing structure in charging. Accordingly, the whole of the sealed object can be completely sealed by the sealing structure, so that water resistance of the electronic device can be further improved.

Note that in one embodiment of the present invention, one or more components of the sealed object may be flexible. For example, the display panel or the power storage device may be flexible or both the display panel and the power storage device may be flexible.

In the case where at least one of the display panel and the power storage device is flexible, the sealing structure, which is flexible, can protect the display panel and/or the power storage device without reducing the flexibility. Using one embodiment of the present invention in such a manner enables fabrication of a flexible electronic device that is highly reliable and highly safe. The flexible electronic device is preferable because effects of putting on and taking off the electronic device easily, wearing comfortably, and the like can be obtained.

In the electronic device in this embodiment, the whole of the sealed object is covered with the flexible sealing structure. When the sealed object is covered with the flexible sealing structure, an electronic device that is not easily broken even after being repeatedly bent and stretched can be fabricated.

In addition, with a sealing structure having high heat resistance, the display panel can be driven even at high temperatures. Furthermore, the electronic device can be reversibly bent even at high temperatures. In that case, the light-emitting element and the power storage device preferably have high heat resistance.

Next, the electronic device of this embodiment is specifically described.

Figure 1B:
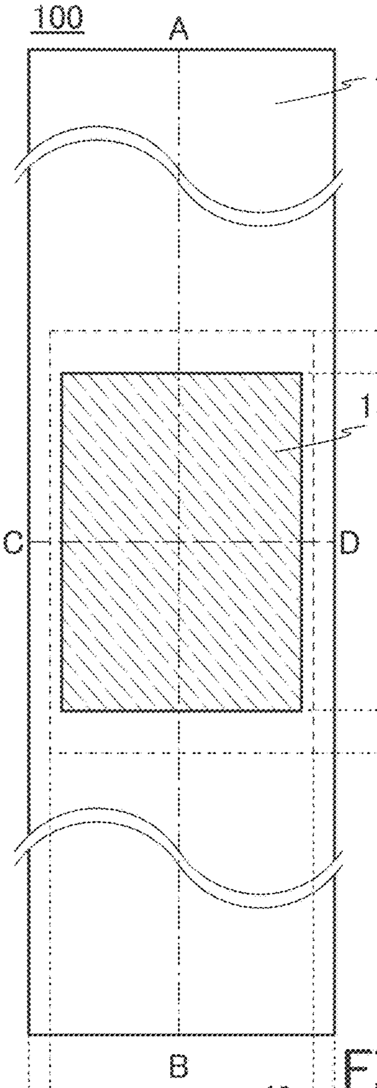
Figure 1C:
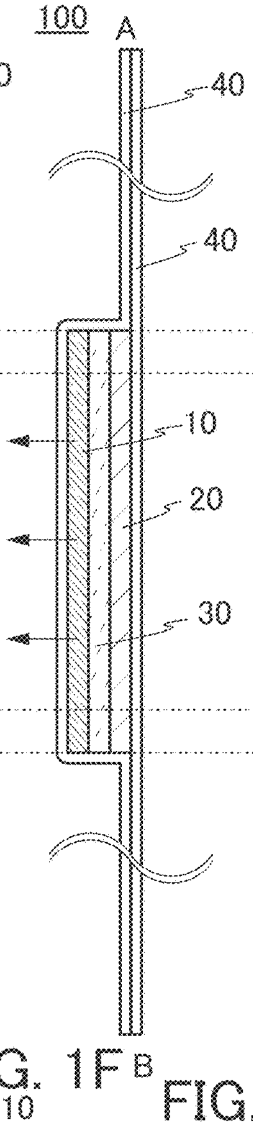

FIG. 1A is a perspective view of an electronic device 100. FIG. 1B is a top view of the electronic device 100. FIG. 1C is a cross-sectional view taken along dashed-dotted line A-B in FIG. 1B, and FIG. 1F is a cross-sectional view taken along dashed-dotted line C-D in FIG. 1B.

The electronic device 100 includes a display panel 10, a power storage device 20, a circuit 30, and a sealing structure 40. In FIG. 1A and the like, a portion of the display panel 10 whose display can be viewed by users is referred to as a display portion 15 of the electronic device 100.

<Display Portion 15>

The electronic device 100 includes the display portion 15. In FIG. 1A, the display portion 15 has a curved surface. In this embodiment, the display panel 10 includes a light-emitting element, for example. In FIG. 1C and the like, a direction in which light emitted from the light-emitting element is denoted by arrows.

The display portion 15 may be flexible. In other words, the display portion 15 may be changed in shape so that the curvature of the display portion 15 can be changed from the curvature of the shape in FIG. 1A. In addition, the display portion 15 may be changed in shape from the shape including the curved surface as shown in FIG. 1A to a flat shape as shown in FIG. 1B. Note that the flexible display portion 15 is not necessarily changed in shape to the flat shape.

Alternatively, the display portion 15 is not necessarily flexible. The display portion 15 which is not flexible may be flat or have a curved surface.

In the case where the flexibility of the display panel is lower than that of the sealing structure, when the electronic device of one embodiment of the present invention is worn on an arm or the like, it is preferable that a radius of curvature of the display portion 15 hardly change and end portions of the electronic device be bent.

<Sealing Structure 40>

The electronic device 100 includes the sealing structure 40. In FIG. 1A, the sealing structure 40 has a curved surface.

The sealing structure 40 has a belt-like portion that can be worn on an arm. The belt-like portion can function as a band of the electronic device 100.

The sealing structure 40 is flexible. In other words, the sealing structure 40 can be changed in shape so that the curvature of the sealing structure 40 can be changed from the curvature of the shape in FIG. 1A. The curvature of the sealing structure 40 may be changed to be larger or smaller than that of the shape in FIG. 1A or may be changed to be larger and smaller than that of the shape in FIG. 1A. In addition, the sealing structure 40 may be changed in shape from the shape including the curved surface as shown in FIG. 1A to a flat shape as shown in FIG. 1B. Note that the flexible sealing structure 40 is not necessarily changed in shape to the flat shape.

The sealing structure 40 is preferably formed using a film. The film has one or more properties selected from a surface protection property, a shape-memory property, an optical property, and a gas barrier property. The film includes one of or both an inorganic film and an organic film. The sealing structure 40 may have a single-layer structure or a stacked-layer structure.

Inside the sealing structure 40, the display panel 10, the power storage device 20, the circuit 30, and the like are provided. The sealed object is sealed by the sealing structure 40 and is isolated from the air outside the electronic device 100.

For example, the sealed object is positioned between surfaces of one film which is folded or the sealed object is positioned between a pair of films, and the film or the pair of films is laminated (e.g., sealed), whereby the sealed object may be sealed.

Alternatively, with an adhesive, surfaces of one film or a pair of films may be bonded to each other to seal the sealed object. As the adhesive, various curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used.

Note that when a surface of the electronic device 100 becomes uneven along the shape of the sealed object, display is difficult to see in some cases. Thus, when the sealed object is put into a case such as a plastic case and the case is sealed by the sealing structure 40, the surface of the electronic device 100 becomes flat, which is preferable.

When a film is used for the sealing structure 40, the flexibility of the sealing structure 40 can be increased.

There is no particular limitation on the material of the sealing structure 40 as long as the material can withstand a temperature in a usage environment. The sealing structure 40 can be formed using a variety of materials such as glass, an organic resin, rubber, plastics, and a metal, for example.

For the sealing structure 40, a material having flexibility and a light-transmitting property with respect to visible light, e.g., polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, or an aramid resin can be used.

The sealing structure 40 preferably has high water resistance. Specifically, it is preferable that a high water-resistant material be used for the sealing structure 40 or a surface of the sealing structure 40 be waterproofed. Thus, entry of moisture from the outside of the electronic device 100 into the display panel 10 and the like is prevented, so that the reliability of the electronic device 100 can be increased. In addition, the water resistance of the sealing structure 40 is improved, whereby the electronic device 100 can be used in water.

The sealing structure 40 can transmit visible light at least in the display portion 15. The users can view display in the display panel 10 through the sealing structure 40. Moreover, the power storage device 20 and the circuit 30 may be seen.

In one embodiment of the present invention, the sealing structure 40 does not necessarily transmit visible light in a portion other than the display portion 15. For example, the sealing structure 40 in a portion other than the display portion 15 may block visible light, and at least one of the power storage device 20 and the circuit 30 is not necessarily seen by the users.

In the electronic device 100, the display panel 10, the power storage device 20, and the circuit 30 are stacked. This stacking order is not particularly limited as long as the display in the display panel 10 can be viewed by the users. Alternatively, these layers are not necessarily stacked, and any two or more of the display panel 10, the power storage device 20, and the circuit 30 may be provided on the same plane.

For example, as illustrated in FIG. 1F and the like, in the electronic device 100, the circuit 30 may be provided over the power storage device 20, and the display panel 10 may be provided over the circuit 30. When the sealing structure 40 is worn on an arm and the power storage device 20, the circuit 30, and the display panel 10 are stacked in this order from the arm side, the users can view the display in the display panel 10. Alternatively, the circuit 30, the power storage device 20, and the display panel 10 may be stacked in this order from the arm side.

A space sealed by the sealing structure 40 is preferably in a reduced-pressure atmosphere or an inert atmosphere. By such an atmosphere, the reliability of the display panel 10 or the like can be increased compared with an air atmosphere.

Figure 1D:
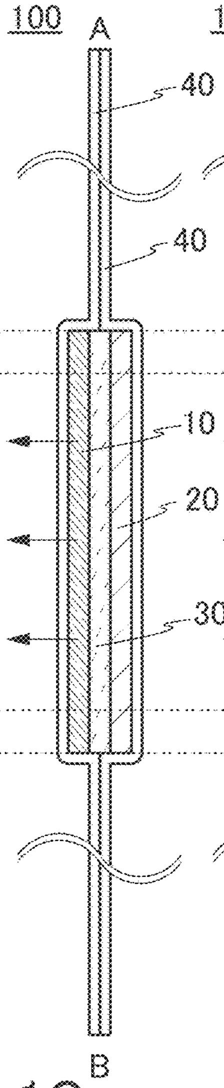
Figure 1E:
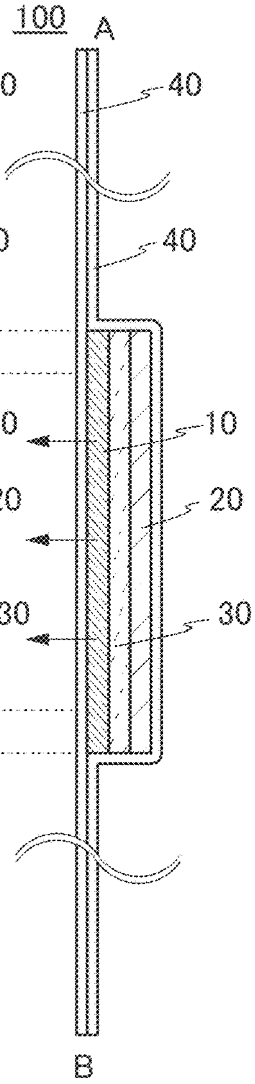
Figure 1F:
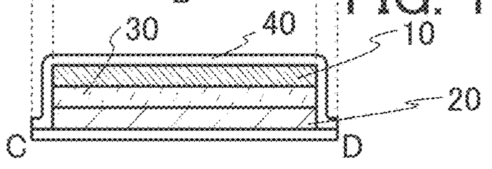
Figure 1G:
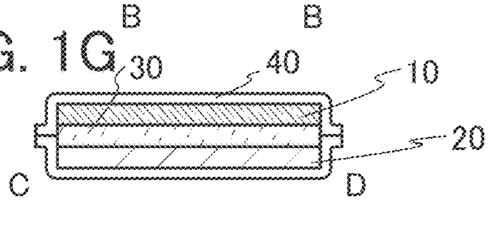

FIGS. 1D and 1E are each a cross-sectional view taken along dashed-dotted line A-B in FIG. 1B, which is different from the cross-sectional view in FIG. 1C. FIG. 1G is a cross-sectional view taken along dashed-dotted line C-D in FIG. 1B, which is different from the cross-sectional view in FIG. 1F.

In FIGS. 1C and 1F, the sealing structure 40 on the front (display surface) side of the electronic device 100 covers side surfaces of the sealed object, and a surface on the rear side of the electronic device 100 is flat; however, the present invention is not limited thereto. As illustrated in FIGS. 1D and 1G, the sealing structure 40 on both the front (display surface) side and the rear side of the electronic device 100 may cover side surfaces of the sealed object, and the electronic device 100 may include portions that project as compared with the other portions (e.g., a band portion) on both the front side and the rear side. Alternatively, as illustrated in FIG. 1E, the sealing structure 40 on the rear side of the electronic device 100 may cover side surfaces of the sealed object and a surface on the front side (display surface) of the electronic device 100 may be flat. Moreover, as illustrated in FIG. 1C, a portion including the display portion 15 of the electronic device 100 may project as compared with the other portions (e.g., a band portion). Alternatively, as illustrated in FIG. 1E, a portion that projects as compared with the other portions (e.g., a band portion) may be provided on the rear side of the electronic device 100.

FIGS. 2A to 2C, FIGS. 3A to 3F, FIGS. 4A and 4B, and FIGS. 5A to 5D illustrate electronic devices which are different from the electronic device 100.

Figure 2A:
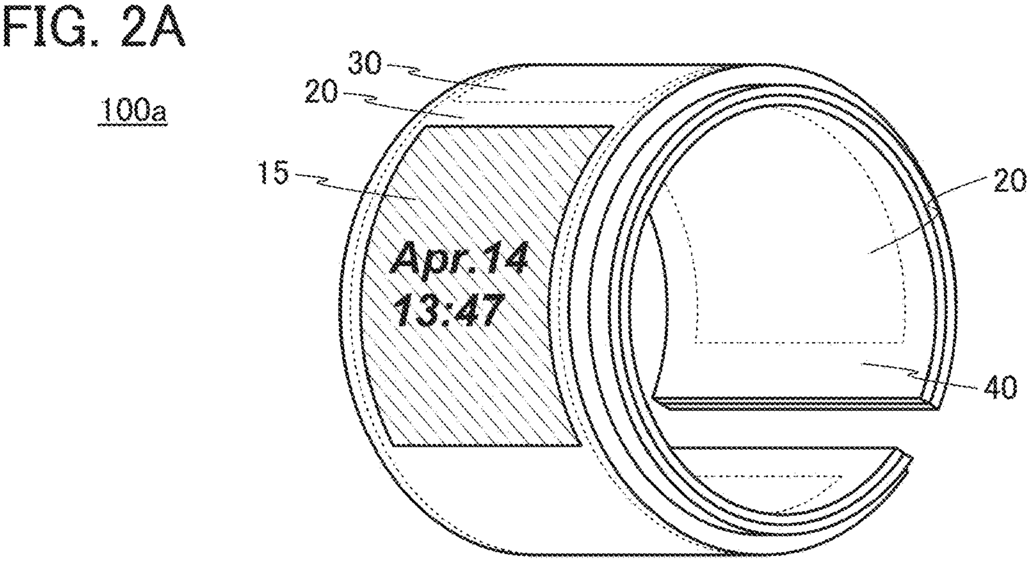
FIGS. 2A to 2C illustrate examples of an electronic device.
Figures 3A, 3B, 3C, 3D, 3E:
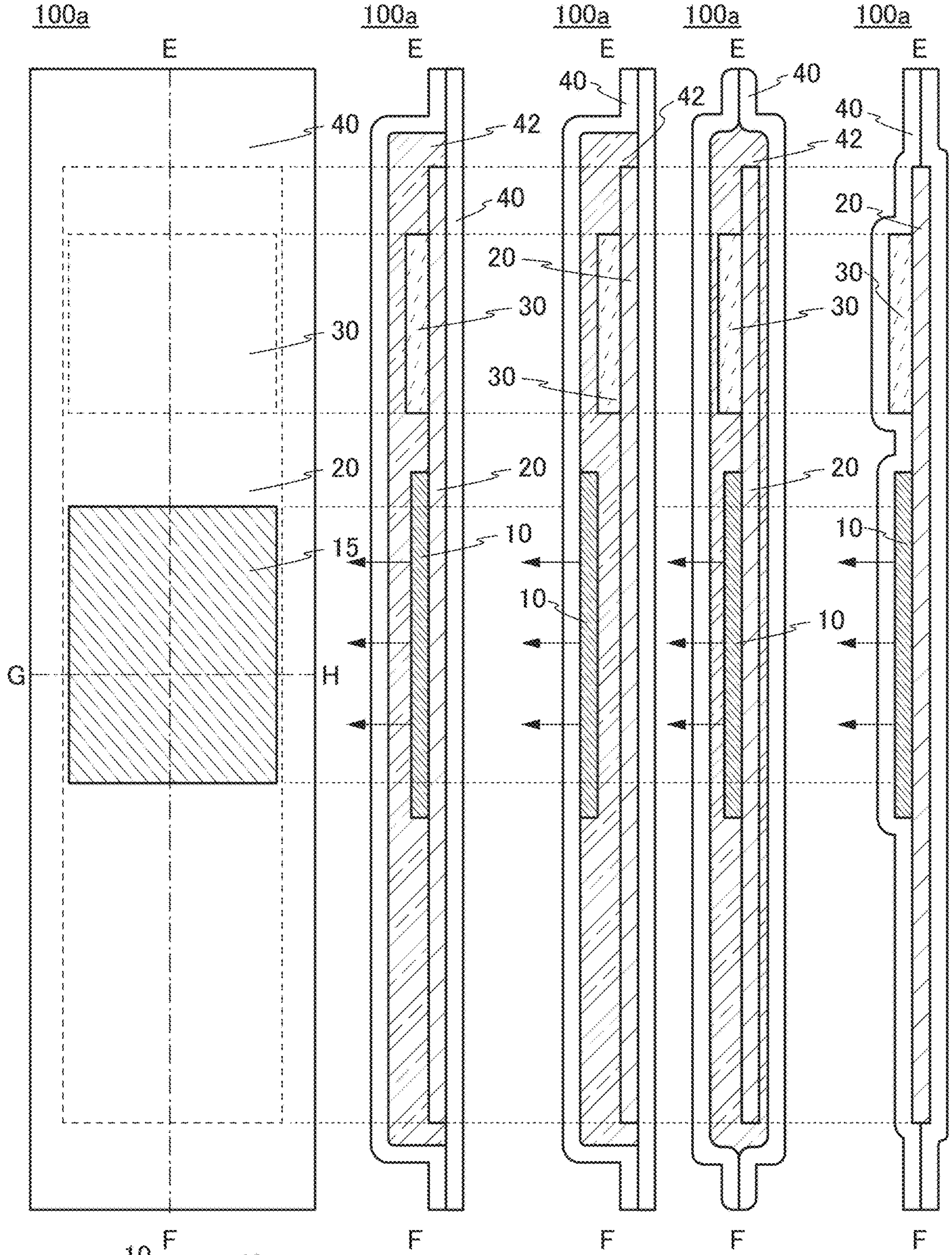
FIGS. 3A to 3F illustrate examples of an electronic device.
Figure 3F:
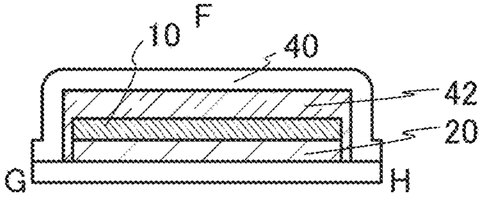

FIG. 2A is a perspective view of an electronic device 100*a*. FIG. 3A is a top view of the electronic device 100*a*, FIG. 3B is a cross-sectional view taken along dashed-dotted line E-F in FIG. 3A, and FIG. 3F is a cross-sectional view taken along dashed-dotted line G-H in FIG. 3A.

The electronic device 100*a* includes the display portion 15. In addition, the electronic device 100*a* includes the sealing structure 40. In the electronic device 100*a*, the display panel 10, the power storage device 20, and the circuit 30 are provided inside the sealing structure 40.

In the electronic device 100*a*, the display panel 10 and the power storage device 20 overlap, the circuit 30 and the power storage device 20 overlap, and the display panel 10 and the circuit 30 do not overlap. In this manner, the sealed object may be positioned in a portion functioning as a band in the sealing structure 40. For example, in the case where the flexible power storage device 20 is used, the power storage device 20 can be positioned in a wide region inside the sealing structure 40, and an electronic device that can be used for a long time per charge can be fabricated.

Inside the sealing structure 40, a buoyancy material may be provided. As the buoyancy material, for example, a solid buoyancy material or a gas-sealed type buoyancy material can be used. As the buoyancy material, a high molecular material (e.g., a resin) or a gas (e.g., a carbon dioxide gas) may be used. As the buoyancy material, a foamed resin obtained by foaming polyethylene, polypropylene, styrol, or the like may be used.

With the buoyancy material, the electronic device of one embodiment of the present invention easily floats in water; thus, when the electronic device is lost in water, it is easily found.

Alternatively, inside the sealing structure 40, a member with rubber elasticity may be provided. The internal stress that is generated when the member with rubber elasticity is changed in its shape is easily dispersed. Thus, the member with rubber elasticity can relieve stress locally imposed on a bent portion of the electronic device of one embodiment of the present invention when the electronic device is bent, and the electronic device can be prevented from being broken. The member with rubber elasticity can also serve as a buffer that disperses external physical pressure or impact.

Note that rubber elasticity refers to elasticity that allows energy to be absorbed under external force and to be stored as energy for restoration. The member with rubber elasticity can be reversibly changed in its shape.

FIGS. 3C to 3E are each a cross-sectional view taken along dashed-dotted line E-F in FIG. 3A, which is different from the cross-sectional view in FIG. 3B.

The buoyancy material or the member with rubber elasticity is preferably provided in a space 42 shown in FIGS. 3B, 3C, 3D, and 3F, for example.

As illustrated in FIG. 3B, the display panel 10 and the power storage device 20 may be in contact with each other or the circuit 30 and the power storage device 20 may be in contact with each other. Alternatively, as illustrated in FIG. 3C, the display panel 10 and the power storage device 20 are not necessarily in contact with each other. Similarly, the circuit 30 and the power storage device 20 are not necessarily in contact with each other. In addition, the display panel 10, the power storage device 20, and the circuit 30 may each be in contact with the sealing structure 40. FIGS. 3B and 3C each show an example where the power storage device 20 is in contact with the sealing structure 40. FIG. 3C shows an example where the display panel 10 is in contact with the sealing structure 40. Alternatively, as illustrated in FIG. 3D, the sealing structure 40 is not necessarily contact with the sealed object. Note that in the case where there is a portion where any two or more of the display panel 10, the power storage device 20, the circuit 30, and the sealing structure 40 are in contact with each other, these may be fixed with an adhesive or the like or may be in contact with each other so that they can be moved relatively.

Alternatively, as illustrated in FIG. 3E, pressure inside the sealing structure 40 may be sufficiently reduced. Thus, degradation of the display panel 10, the power storage device 20, the circuit 30, and the like due to impurities and the like can be suppressed. Moreover, an electronic device can be thinner and more lightweight.

In FIGS. 3B and 3F, the sealing structure 40 on the front (display surface) side of the electronic device 100*a* covers side surfaces of the sealed object, and a surface on the rear side of the electronic device 100*a* is flat; however, the present invention is not limited thereto. As illustrated in FIG. 3D, the sealing structure 40 on both the front (display surface) side and the rear side of the electronic device 100*a* may cover side surfaces of the sealed object, and the electronic device 100*a* may include portions that project as compared with the other portions (e.g., a band portion) on both the front side and the rear side.

The number of each of the display panels 10, the power storage devices 20, and the circuits 30 of the electronic device of one embodiment of the present invention is not limited to one, and may be two or more separately. In addition, the number of the display portions 15 provided in the electronic device of one embodiment of the present invention is also not limited to one, and may be two or more.

Figure 2B:
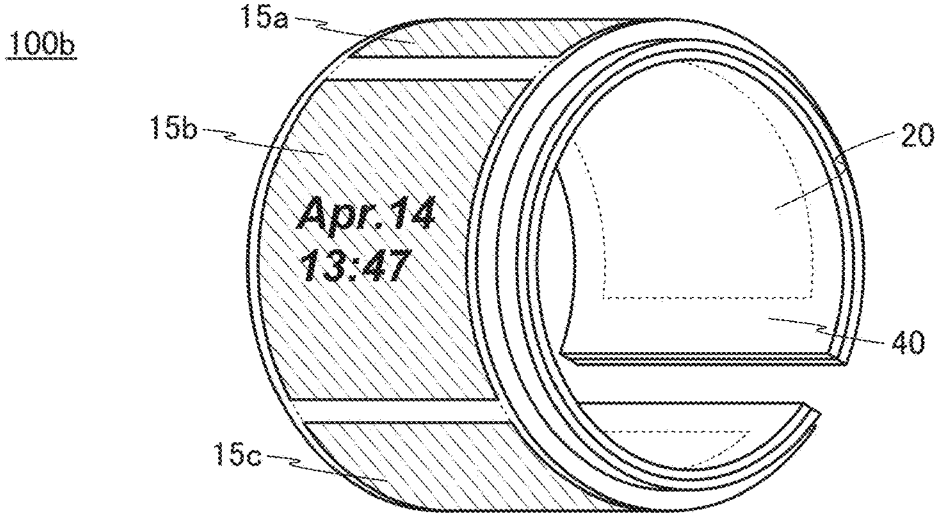

FIG. 2B is a perspective view of an electronic device 100*b* including three display portions (a display portion 15*a*, a display portion 15*b*, and a display portion 15*c*).

The three display portions of the electronic device 100*b* may be formed using one display panel 10 including three display portions or may be formed using three display panels 10 each including one display portion.

In the case where an electronic device includes a plurality of display portions, the variety of display can be increased. The plurality of display portions may be used as separate display portions, and may display different images. Alternatively, the same image may be displayed on each display portion. Alternatively, one image may be displayed on two or more display portions.

The electronic device of one embodiment of the present invention is preferably provided with a sensor which senses a sight line of a user, a vertical direction, a rotation angle, or a rotation direction of the electronic device, or the like. For example, a gyroscope sensor, an image sensor, or the like can be used. Thus, the electronic device can display an image in a direction or on a display portion which is easy to see from a user. Furthermore, a display portion which is difficult to see from the user is turned off, whereby power consumption can be reduced. Note that the user may operate the electronic device to select a display portion to be used or contents displayed on a display portion.

Figure 2C:
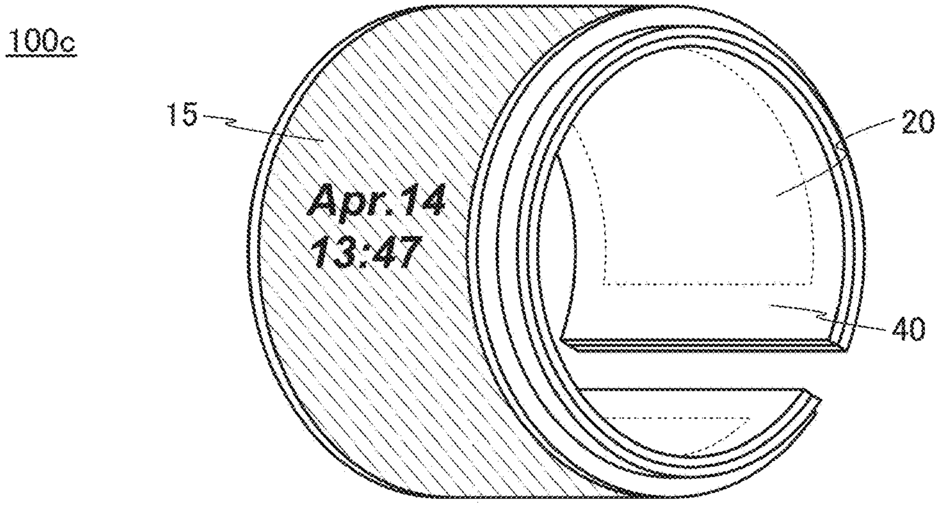

An electronic device 100*c* illustrated in FIG. 2C includes the display portion 15 which is larger than that of the electronic device 100*a*.

Even in the case where the electronic device has a large display portion, when the above sensor is used, the user operates the electronic device, or the like, an image is displayed only on a portion which is easy to see from a user and the other portions are turned off; thus, power consumption can be reduced.

The electronic device of one embodiment of the present invention may have a structure where a sealing structure is worn on an arm or may have a structure where a structure body connected to a sealing structure is worn on an arm. As the structure body, a band (e.g., a string, a wire, a net, and a belt), a spring, and the like are given as examples. Examples of how to wear the electronic device include putting it directly on a skin, putting it on an arm over clothes, sewing it on a portion of clothes that overlaps with an arm, and attaching it with a hook and loop fastener or the like typified by Magic Tape (registered trademark) provided on a portion of clothes that overlaps with an arm.

The sealing structure may have a structure where a film and a belt-like leaf spring which is made of a convex material (e.g., stainless steel) are combined. Alternatively, as the structure body, a belt-like leaf spring which is made of a convex material (e.g., stainless steel) may be used. Thus, the electronic device can be put on or taken off in a moment. In this case, the electronic device is fixed in close contact with a skin or with clothes between it and a skin. By using the leaf spring, the electronic device can be a device in which the length of the band does not need to be adjusted and can be worn regardless of the circumference of an arm.

Figure 4A:
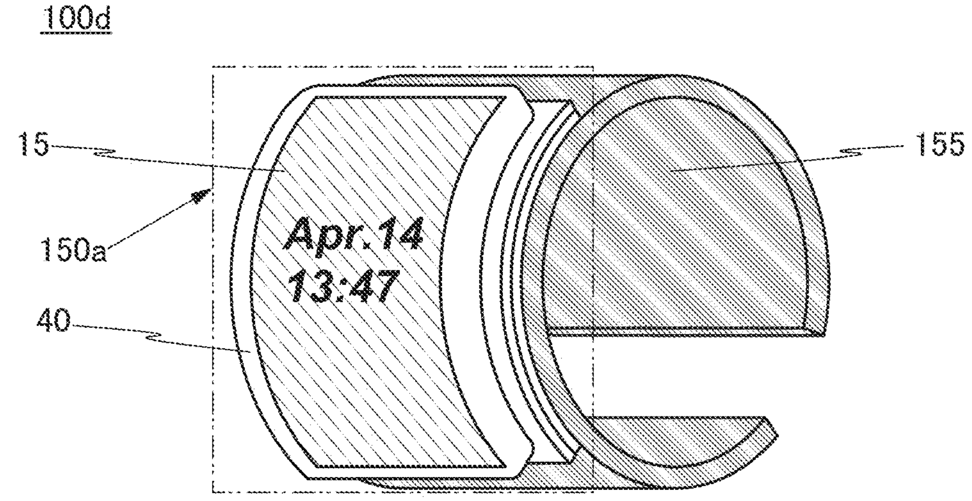
FIGS. 4A and 4B illustrate examples of an electronic device.
Figure 5A:
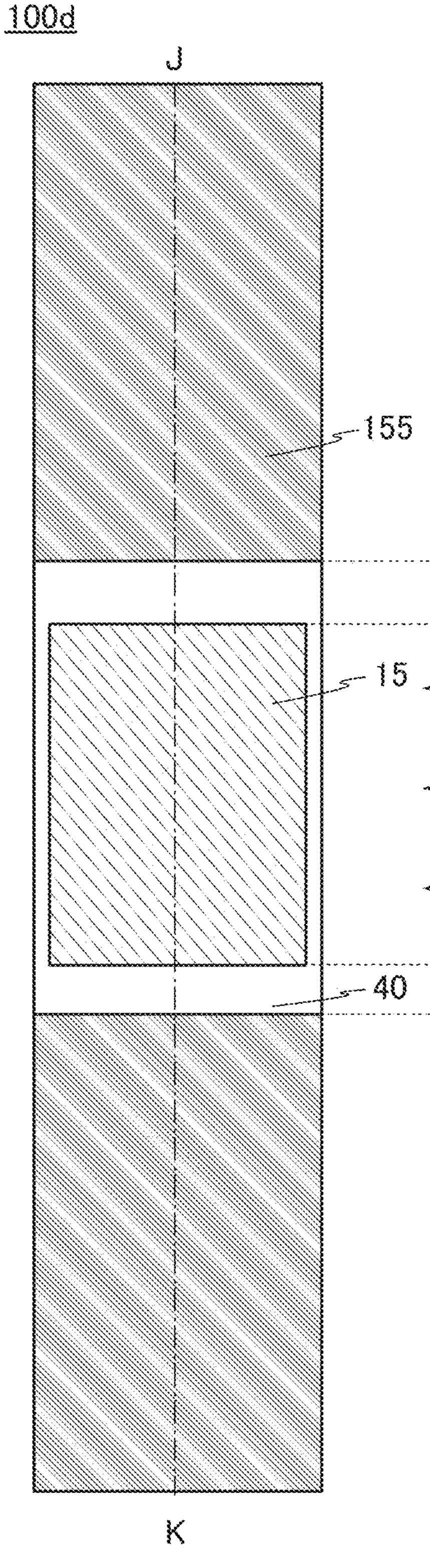
FIGS. 5A to 5D illustrate examples of an electronic device.
Figure 5B:
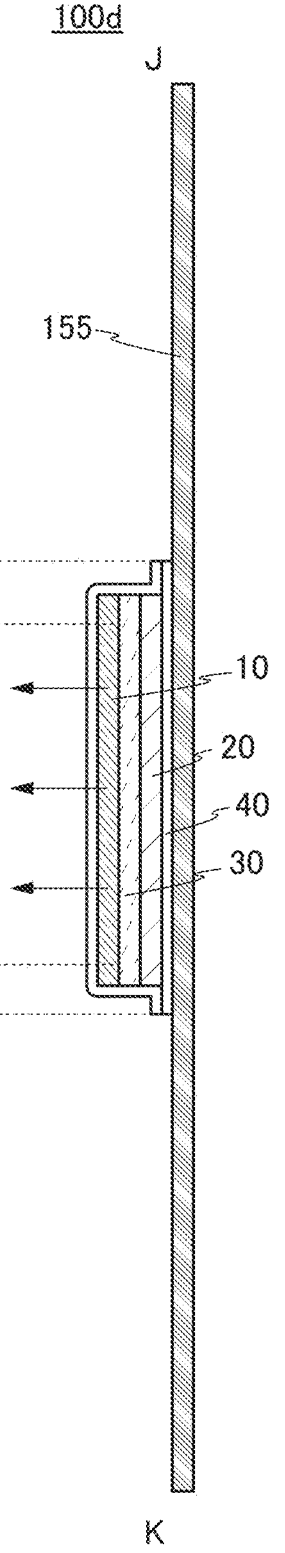

FIG. 4A is a perspective view of an electronic device 100*d*. FIG. 5A is a top view of the electronic device 100*d*, and FIG. 5B is a cross-sectional view taken along dashed-dotted line J-K in FIG. 5A. In FIG. 5B, a direction in which light emitted from the light-emitting element included in the display panel 10 is denoted by arrows.

The electronic device 100*d* includes the sealing structure 40 and a band 155. Inside the sealing structure 40, the display panel 10, the circuit 30, the power storage device 20, and the like are provided. The sealing structure 40 is connected to the band 155.

The sealing structure 40 and the band 155 are preferably connected to each other detachably. For example, a plurality of bands having different designs which can be connected to the sealing structure 40 are prepared, and the band to be connected to the sealing structure 40 is selected depending on the style of clothes or the place, the time, the conditions, or the like when the electronic device is used, whereby opportunities to use the electronic device can be increased. Moreover, the used band 155 can be replaced with a new band. Alternatively, a plurality of sealing structures 40 whose shapes or performance is different may be prepared, and the sealing structure 40 to be connected to the band may be selected depending on the conditions.

Figure 4B:
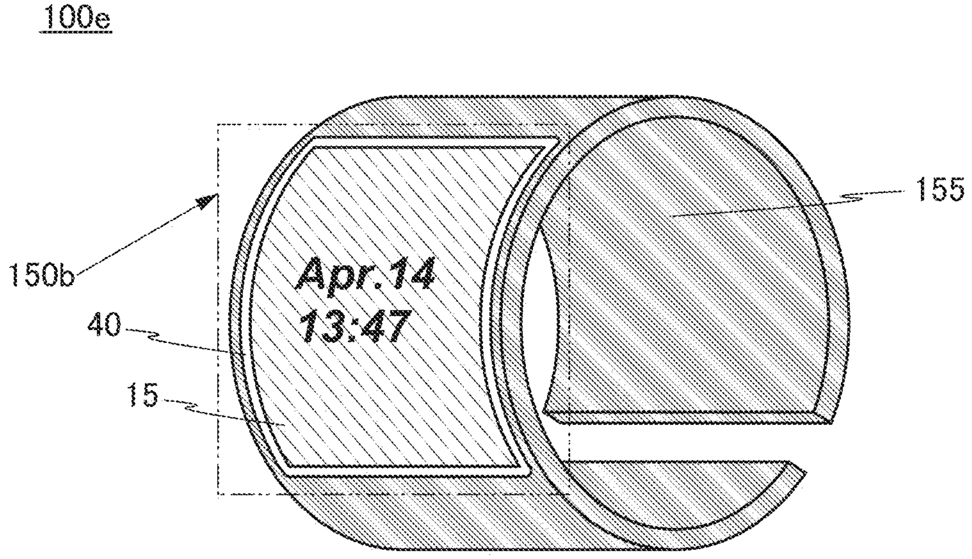

Like an electronic device 100*e* in FIG. 4B, the band 155 may have a depression portion and the sealing structure 40 may be positioned in the depression portion. If the sealing structure 40 projects from the band 155, when the electronic device rubs or bumps against another object while being used, the display portion 15 might be damaged, and moreover, the electronic device might be broken. Thus, the band 155 is preferably connected to the sealing structure 40 so that the surface of the band 155 and the surface of the sealing structure 40 can be in substantially the same plane. Note that the depth of the depression portion of the band 155 may be greater than the thickness of the sealing structure 40.

Figure 5C:
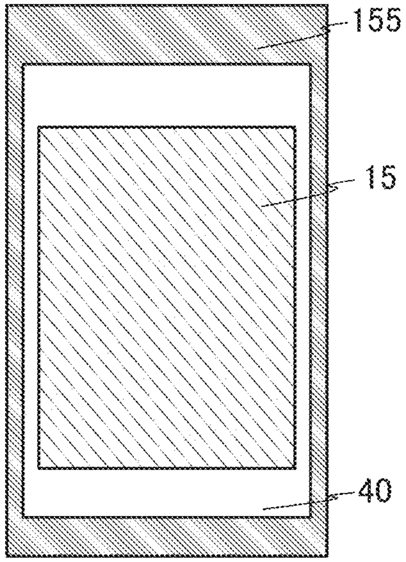
Figure 5D:
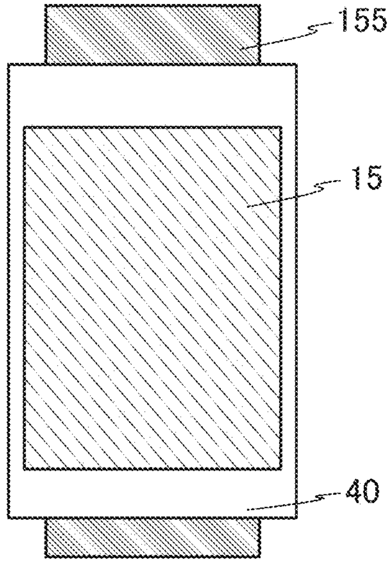

In FIG. 4A and FIG. 5A, an example where the width of the sealing structure 40 is equal to the width of the band 155 is shown; however, one embodiment of the present invention is not limited thereto. As illustrated in FIG. 5C, the width of the sealing structure 40 may be narrower than that of the band 155. Alternatively, as illustrated in FIG. 5D, the width of the sealing structure 40 may be broader than that of the band 155.

Next, examples of components of the electronic device in one embodiment of the present invention are shown.

Figure 6A:
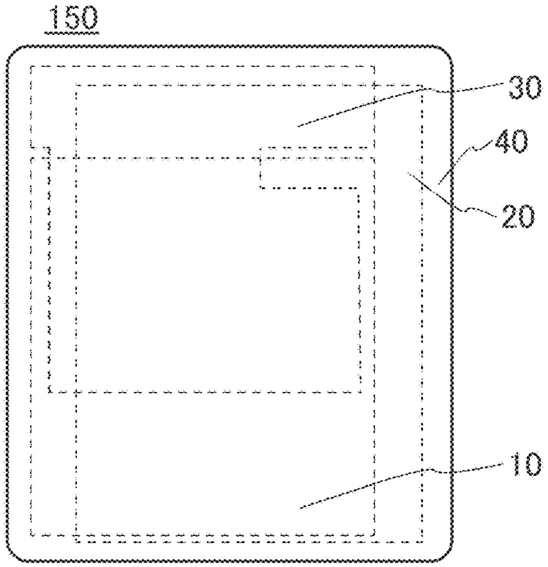
FIGS. 6A to 6D illustrate examples of components of an electronic device.

An element 150 in FIG. 6A includes the display panel 10, the power storage device 20, the circuit 30, and the sealing structure 40. The display panel 10, the power storage device 20, and the circuit 30 are provided inside the sealing structure 40. Hereinafter, the display panel 10, the power storage device 20, and the circuit 30 are collectively referred to as a sealed object in some cases.

The element 150 can be used so that the sealing structure 40 is connected to the band 155, like an element 150*a* in FIG. 4A and an element 150*b* in FIG. 4B. Alternatively, as illustrated in FIGS. 3A to 3E, the sealing structure 40 is formed in a belt shape, whereby the sealing structure 40 itself may be worn on an arm.

Figure 6B:
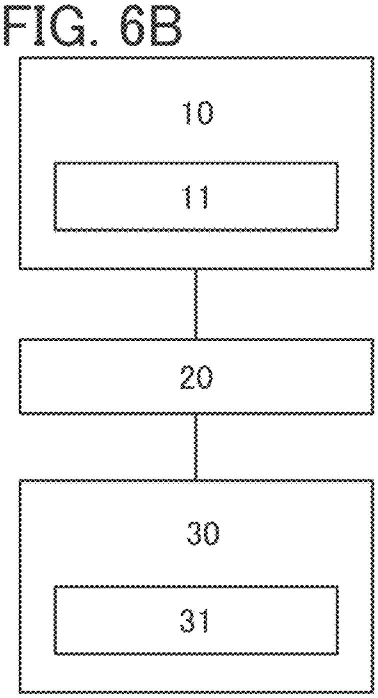

FIG. 6B is a block diagram illustrating an example of the connection relation in the sealed object.

The display panel 10 includes a light-emitting element 11. The light-emitting element 11 has a function of emitting light with power supplied from the power storage device 20.

Note that the display panel 10 may have a function of emitting light with power supplied from a component other than the power storage device 20.

The power storage device 20 includes a portion overlapping with the display panel 10.

Note that the power storage device 20 may have a function of supplying power to a component other than the display panel 10.

The power storage device 20 includes a positive electrode, a negative electrode, a separator, an electrolyte, an exterior body, and the like.

The circuit 30 includes an antenna 31. The antenna 31 includes a portion overlapping with the display panel 10. The circuit 30 can charge the power storage device 20 wirelessly (without contact).

Providing the portion where the display panel 10 and the circuit 30 overlap with each other or the portion where the display panel 10 and the power storage device 20 overlap with each other enables a reduction in size of the element 150. In particular, it is preferred that a portion where the display panel 10, the power storage device 20, and the circuit 30 overlap with one another be provided. A reduction in size of the element 150 is particularly effective in the case where the sealing structure 40 and the band are separately provided. Note that in the case where a reduction in size of the element 150 is not needed, e.g., in the case where the sealing structure 40 is used as the band of the electronic device, the portion where the display panel 10 and the circuit 30 overlap with each other or the portion where the display panel 10 and the power storage device 20 overlap with each other is not necessarily provided.

It is preferred that the power storage device 20 include a portion overlapping with the circuit 30. For example, at least part of the antenna 31 may overlap with the power storage device 20. The display panel 10, the power storage device 20, and the circuit 30 preferably overlap with one another such that the user of the electronic device hardly perceives the antenna 31, e.g., the antenna 31 is provided between the display panel 10 and the power storage device 20, in which case the appearance of the electronic device can be maintained. Even if the display panel 10 is positioned between an external antenna and the antenna 31, radio waves can be transmitted and received. That is, a radio wave transmitted from the external antenna passes through the display panel 10, and the antenna 31 receives the radio wave.

In the case where the usage environment of the electronic device is determined, a light-emitting element capable of emitting light in the environment and a power storage device capable of supplying power to the display panel in the environment are used.

It is preferred that the electronic device of one embodiment of the present invention can be used at low temperatures and at high temperatures. The electronic device of one embodiment of the present invention can be used in a wide temperature range (e.g., higher than or equal to 0° C. and lower than or equal to 100° C., preferably higher than or equal to −25° C. and lower than or equal to 150° C., further preferably higher than or equal to −50° C. and lower than or equal to 200° C.). The electronic device of one embodiment of the present invention can be used either indoors or outdoors.

It is preferred that a light-emitting element of the electronic device of one embodiment of the present invention can emit light at both temperatures of 0° C. and 100° C. Furthermore, it is preferred that a power storage device of the electronic device of one embodiment of the present invention can supply power to the display panel at both temperatures of 0° C. and 100° C.

Figure 6C:
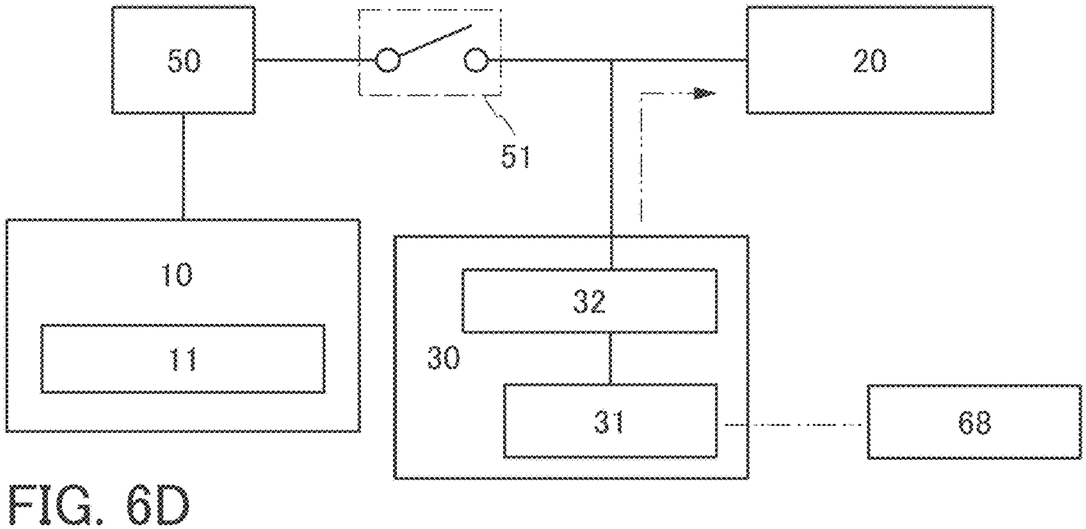
Figure 6D:
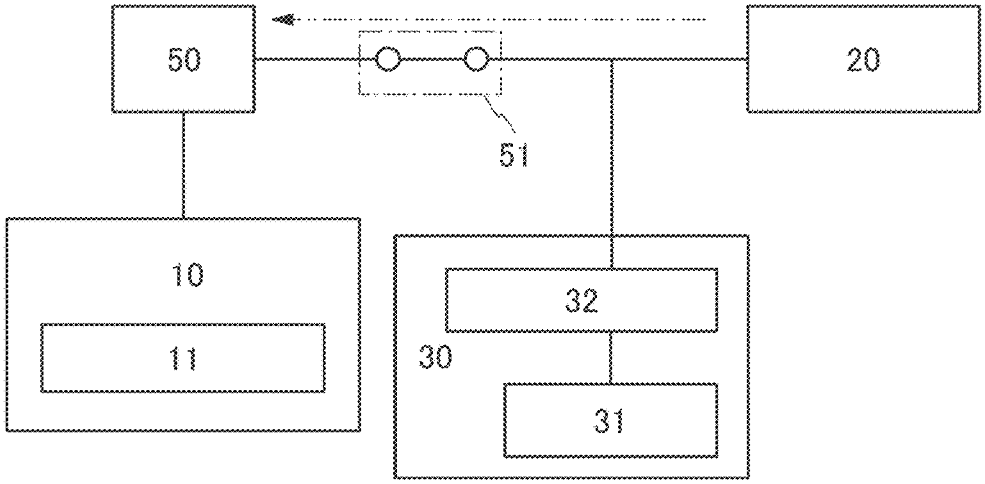

The electronic device may include a switch. In FIGS. 6C and 6D, the display panel 10, the power storage device 20, the circuit 30, a circuit 50, and a switch 51 are illustrated as a sealed object.

As illustrated in FIG. 6C, the circuit 30 can charge the power storage device 20 wirelessly when the switch 51 is off.

As illustrated in FIG. 6D, the power storage device 20 can supply power to the display panel 10 when the switch 51 is on.

Components of the electronic device of one embodiment of the present invention will be described in detail below.

<Display Panel 10>

The display panel 10 includes the light-emitting element 11. As structure examples of the display panel 10, a light-emitting device will be detailed in Embodiment 3 and an input/output device will be detailed in Embodiment 4. Note that a display element included in the display panel 10 is not limited to a light-emitting element. The display panel may include a sensing element such as a touch sensor.

In the display panel 10, an active matrix method in which an active element (a non-linear element) is included in a pixel or a passive matrix method in which an active element is not included in a pixel can be used.

The display panel 10 may be flexible. For example, when a film is used for at least one of a supporting substrate and a sealing substrate of the light-emitting element 11, the flexibility of the display panel 10 can be increased.

For example, a display that can resist 100000-time bending performed with a radius of curvature of 5 mm is preferably used. It is preferable that the electronic device can be used while the display panel is bent with a radius of curvature from 1 mm to 150 mm, preferably from 5 mm to 150 mm.

It is preferred that an element capable of emitting light at low temperatures and at high temperatures be used as the light-emitting element 11. The range of low temperatures is, for example, higher than or equal to −100° C. and lower than or equal to 0° C., preferably higher than or equal to −100° C. and lower than or equal to −25° C., more preferably higher than or equal to −100° C. and lower than or equal to −50° C. The range of high temperatures is, for example, higher than or equal to 100° C. and lower than or equal to 300° C., preferably higher than or equal to 150° C. and lower than or equal to 300° C., more preferably higher than or equal to 200° C. and lower than or equal to 300° C. Note that the light-emitting element 11 can emit light at higher than 0° C. and lower than 100° C., in addition to at low temperatures and at high temperatures. For example, the light-emitting element 11 can emit light at a room temperature (higher than or equal to 20° C. and lower than or equal to 30° C.).

As the light-emitting element 11, a self-luminous element can be used, and an element whose luminance is controlled by current or voltage is included in the category of the light-emitting element 11. For example, a light-emitting diode (LED), an organic EL element, an inorganic EL element, or the like can be used. Another display element can be used without limitation to the light-emitting element.

It is preferred that the heat resistance of the light-emitting element 11 be as high as possible. For example, in the case where an organic EL element is used as the light-emitting element 11, the glass transition temperature of each of organic compounds contained in the organic EL element is preferably higher than or equal to 100° C. and lower than or equal to 300° C., more preferably higher than or equal to 150° C. and lower than or equal to 300° C.

In the case where the antenna 31 receives power from an external antenna through the display panel 10 in one embodiment of the present invention, it is preferred that the thickness of a pair of electrodes included in the light-emitting element 11 be as small as possible. For example, the total thickness of the pair of electrodes is preferably less than or equal to 1 μm, further preferably less than or equal to 500 nm, further preferably less than or equal to 350 nm, further preferably less than or equal to 250 nm.

Power Storage Device 20

It is preferable that a power storage device capable of supplying power to the display panel 10 in a low-temperature environment and a high-temperature environment be used as the power storage device 20. The low-temperature environment is, for example, an environment at higher than or equal to −100° C. and lower than or equal to 0° C., preferably an environment at higher than or equal to −100° C. and lower than or equal to −25° C., more preferably an environment at higher than or equal to −100° C. and lower than or equal to −50° C. The high-temperature environment is, for example, an environment at higher than or equal to 100° C. and lower than or equal to 300° C., preferably an environment at higher than or equal to 150° C. and lower than or equal to 300° C., more preferably an environment at higher than or equal to 200° C. and lower than or equal to 300° C. Note that the power storage device 20 can be used in an environment at higher than 0° C. and lower than 100°

C., in addition to the low-temperature environment or the high-temperature environment. For example, the power storage device 20 can be used at a room temperature (higher than or equal to 20° C. and lower than or equal to 30° C.).

As examples of the power storage device 20, a lithium ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery can be given.

A lithium ion secondary battery which achieves a high energy density is preferable because the electronic device can be lightweight and small.

For example, a secondary battery containing a nonaqueous electrolyte can be used. The nonaqueous electrolyte contains an ionic liquid (room temperature molten salt) and an alkali metal salt. A secondary battery with high heat resistance can be obtained because the ionic liquid has non-flammability and non-volatility. For example, the ionic liquid preferably contains an imidazolium cation and an anion. The alkali metal salt is preferably a lithium salt.

A secondary battery using a gel electrolyte or an all-solid-state secondary battery using a solid electrolyte are preferable because the heat resistance and the level of safety are high.

As the power storage device 20, any of secondary batteries with a variety of shapes, such as a coin-type (single-layer flat type) secondary battery, a cylindrical secondary battery, a thin secondary battery, a square-type secondary battery, and a sealed secondary battery can be used. Furthermore, a structure in which a plurality of positive electrodes, a plurality of negative electrodes, and a plurality of separators are stacked or a structure in which a positive electrode, a negative electrode, and a separator are wound (winding structure) may be employed.

Alternatively, the electronic device of one embodiment of the present invention may include a lithium ion capacitor, a double layer capacitor, or the like, as the power storage device 20.

The power storage device 20 may be flexible. For example, when a film is used as an exterior body, the flexibility of the power storage device 20 can be increased. In a region surrounded by the exterior body, at least a positive electrode, a negative electrode, and an electrolyte (or an electrolytic solution) are provided.

In the electronic device, the light-emitting element 11 and the power storage device 20 may be provided to overlap with each other. As the area where the light-emitting element 11 and the power storage device 20 overlap with each other is larger, the power storage device 20 can be made warm in a wider area by utilizing heat of the light-emitting element 11. The reliability of the electronic device can be increased even in the case where a power storage device which operates more hardly in a low-temperature environment than in a high-temperature environment is used.

Examples of a structure of the power storage device 20 are detailed in Embodiment 2.

<Circuit 30>

The circuit 30 includes the antenna 31. The circuit 30 may include a controller 32.

The antenna 31 can receive power from an external antenna (e.g., an antenna 68 of a charger). The antenna 31 may receive power from an external antenna through the display panel 10. Alternatively, the antenna 31 may receive power from an external antenna through the power storage device 20.

The controller 32 has a function of converting power received with the antenna 31 into power to be supplied to the power storage device 20 and outputting the power to the power storage device 20. For example, the controller 32 may function as an AC-DC converter. In that case, the controller 32 converts power received with the antenna 31 into DC power and outputs the DC power to the power storage device 20.

The electronic device of one embodiment of the present invention is charged in the following manner: by an electromagnetic induction method in which the antenna 68 of a charger (primary coil) and the antenna 31 of the electronic device (secondary coil) are magnetically coupled and a voltage is generated at the secondary coil with an alternating magnetic field generated from the primary coil, power is transmitted to the secondary coil side without contact. Note that the power receiving method is not limited to an electromagnetic induction method.

The uses for the antenna of the electronic device are not limited to charging of the power storage device 20 without contact. For example, the electronic device may be provided with an antenna and a memory between which electronic data is transmitted and received. The display panel 10 may display an image, data, or the like in accordance with the received data. An antenna having a global positioning system (GPS) function with which location information or GPS time can be obtained may be provided.

It is preferable for safety that input/output terminals for charging or discharging a power storage device be not exposed on a surface of the electronic device. In the case where the input/output terminals are exposed, the input/output terminals might short-circuit by water such as rain, or the input/output terminals might be in contact with a human body and cause an electric shock. The use of the antenna 31 enables a structure in which the input/output terminals are not exposed on a surface of the electronic device because the power storage device can be charged without contact.

<Circuit 50>

The circuit 50 has a function of converting power supplied from the power storage device 20 into power which makes the light-emitting element 11 emit light. For example, the circuit 50 may have a function of converting (stepping up or stepping down) output voltage of the power storage device 20 into voltage which makes the light-emitting element 11 emit light.

The circuit 50 may have a function of generating a signal for driving the display panel 10 and outputting the signal to the display panel 10. The circuit 50 may include a signal line driver circuit or a scan line driver circuit. The display panel 10 may include a signal line driver circuit or a scan line driver circuit.

<Switch 51>

The switch 51 is electrically connected to the circuit 50. The switch 51 is also electrically connected to the power storage device 20. The switch 51 is also electrically connected to the circuit 30.

There is no particular limitation on the switch 51. For example, an electrical switch, a mechanical switch, or the like can be used. Specifically, a transistor, a diode, a magnetic switch, a mechanical switch, or the like can be used.

Figure 7A:
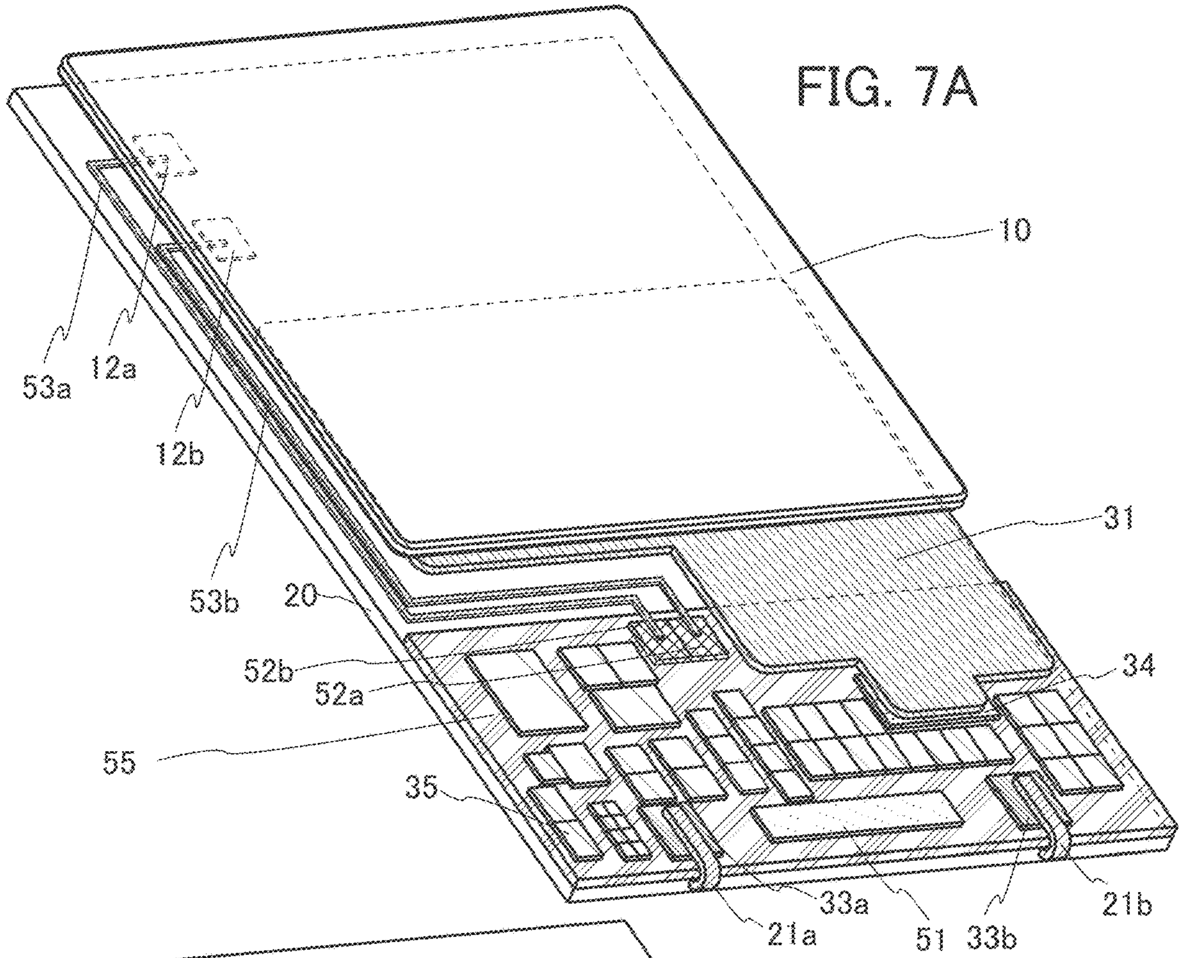
FIGS. 7A and 7B illustrate an example of components of an electronic device.
Figure 7B:
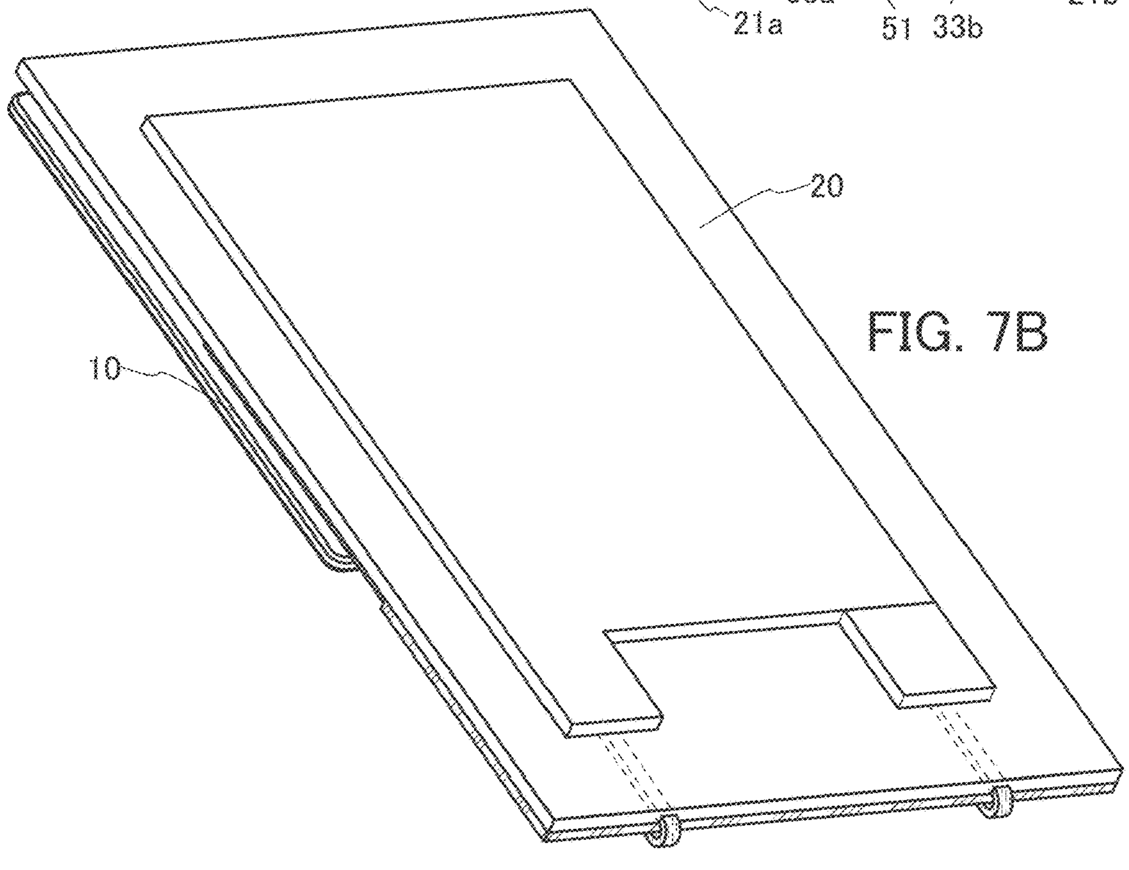

FIGS. 7A and 7B illustrate a specific example of the sealed object. FIG. 7A illustrates a front surface (display surface) of the sealed object, and FIG. 7B illustrates a rear surface of the sealed object.

FIGS. 7A and 7B illustrate an example where a laminated secondary battery is used as the power storage device 20. As illustrated in FIG. 7B, the central portion of the power storage device 20 is a portion where a plurality of electrodes are stacked and has a larger thickness than an end portion.

An electrode 21*a* is electrically connected to one of a positive electrode and a negative electrode of the power storage device 20. An electrode 21*b* is electrically connected to the other of the positive electrode and the negative electrode of the power storage device 20.

The electrodes 21*a* and 21*b* are each bent so as to sandwich the circuit board 55 and are electrically connected to terminals 33*a* and 33*b*, respectively, over the circuit board 55.

The circuit board 55 is provided with components (shown as electronic parts 35) included in the circuit 30, the circuit 50, and the like illustrated in FIG. 6C and the like. The circuit board 55 is provided with electronic parts, for example, a capacitor, a resistor, or a switching element. As the circuit board 55, a printed circuit board can be used, for example.

The circuit board 55 is provided with the switch 51. FIGS. 7A and 7B illustrate an example where a magnetic switch is used as the switch 51. By attaching or detaching the magnet, the on/off state of the switch can be switched.

The antenna 31 is electrically connected to a terminal 34 over the circuit board 55. Part of the antenna 31 is positioned between the power storage device 20 and the display panel 10. That is, in the electronic device, the antenna 31 includes a portion overlapping with the display panel 10. Furthermore, the antenna 31 includes a portion overlapping with the power storage device 20.

The antenna 31 can receive power from an external antenna through the display panel 10.

The terminal 12*a* included in the display panel 10 is electrically connected to a terminal 52*a* over the circuit board 55 through a wiring 53*a*. The terminal 12*b* included in the display panel 10 is electrically connected to a terminal 52*b* over the circuit board 55 through a wiring 53*b*.

In the electronic device of one embodiment of the present invention, the power storage device and the antenna each separately includes a portion overlapping with the display panel. Furthermore, the power storage device and the circuit partly overlap with each other. As illustrated in FIGS. 7A and 7B, part of the antenna 31 may be positioned between the display panel 10 and the power storage device 20, for example.

When at least two of components of the electronic device, e.g., the power storage device, the display panel, the circuit board, and the antenna, partly overlap with each other as described above, the size of the sealed object can be reduced, which is preferable.

For example, the power storage device 20 preferably includes a portion overlapping with at least one of the display panel 10, the circuit board 55, and the antenna 31. It is particularly preferable that the power storage device 20 include respective portions overlapping with the display panel 10, the circuit board 55, and the antenna 31 as illustrated in FIGS. 7A and 7B.

An environment where the electronic device of one embodiment of the present invention can be used is not limited to an air atmosphere. The electronic device of one embodiment of the present invention can be used in water at temperatures of higher than or equal to 0° C. and lower than or equal to 100° C., for example. The electronic device of one embodiment of the present invention can have high reliability even when used in water since the light-emitting element and the power storage device can be used in a wide temperature range and are sealed by a sealing structure, for example.

Figure 8A:
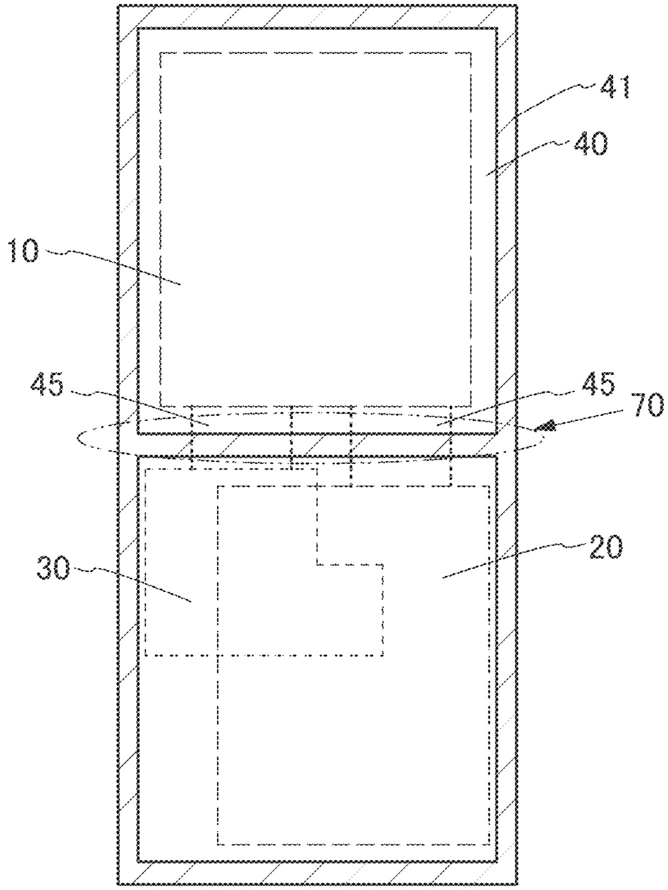
FIGS. 8A to 8C illustrate examples of components of an electronic device.
Figure 8B:
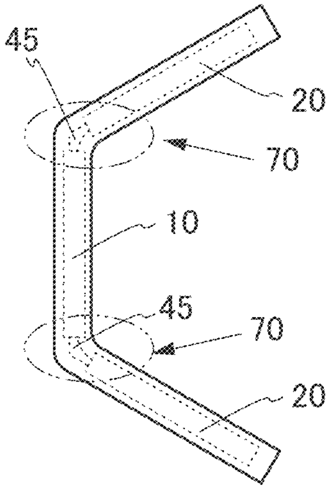

Alternatively, as illustrated in FIGS. 8A and 8B, the electronic device of one embodiment of the present invention may include a plurality of regions sealed by the sealing structure 40. As illustrated in FIGS. 8A and 8B, the sealed object may be placed in a plurality of spaces, and a wiring 45 or the like for connecting the components placed in the plurality of spaces to each other may overlap with a sealing region 41. Such a region can be referred to as a flexible region 70. As illustrated in FIG. 8B, the electronic device can be bent in the flexible regions 70. As in FIG. 8B, even if the display panel 10 is not flexible, the flexible regions 70 and a portion of the sealing structure 40 that overlaps with the power storage device 20 are bent, whereby the electronic device can be bent and put around an arm or the like. In the case where the display panel 10 is flexible, the electronic device may be changed in shape by bending the display panel 10.

In FIG. 8A, the display panel 10 is included in an upper space and the power storage device 20 and the circuit 30 are included in a lower space. The display panel 10 is electrically connected to the power storage device 20 and the circuit 30 through the wirings 45.

Figure 8C:
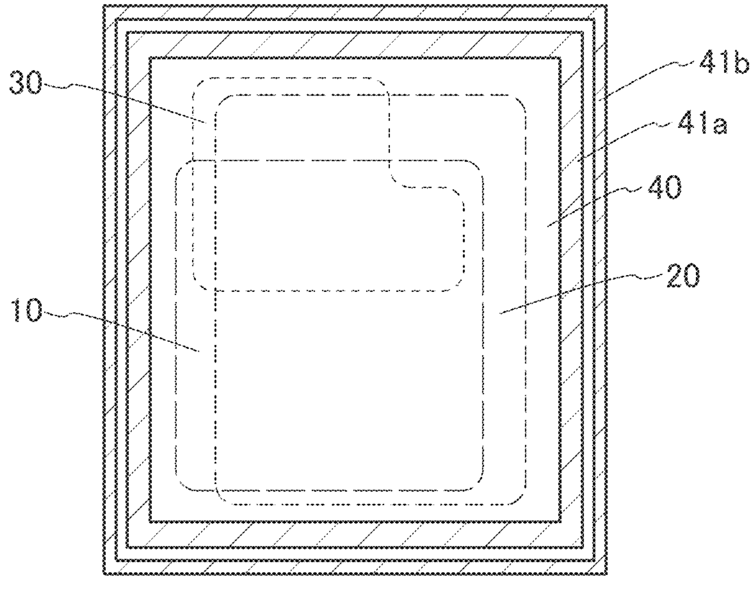

In the electronic device, the sealing region may be doubly included. As illustrated in FIG. 8C, a sealing region 41*b* surrounding a sealing region 41*a* may be provided and the display panel 10 and the like may be doubly sealed. Double or multiple sealing can increase the reliability of the electronic device.

It is preferable that an end portion of each of the display panel 10, the power storage device 20, and the circuit 30 be chamfered as illustrated in FIG. 8C. Breaking the sealing at corner portions of the display panel 10, the power storage device 20, the circuit 30, and the like can be suppressed; thus, a reduction in reliability of the electronic device can be suppressed even when a film or the like is used as the sealing structure.

Furthermore, the electronic device of one embodiment of the present invention preferably includes a photoelectric conversion element so that the power storage device can be charged using the photoelectric conversion element. It is preferred that the power storage device can be charged by photovoltaic power generation, for example. Alternatively, the electronic device of one embodiment of the present invention may have a function of generating and charging power with the movement of an arm of a user.

The electronic device of one embodiment of the present invention preferably includes at least one sensor. As the sensor, a sensor that has a function of measuring, for example, force, displacement, position, speed, acceleration, angular velocity, rotational frequency, distance, light (e.g., visible light, infrared light, and ultraviolet light), liquid, magnetism, temperature, chemical substance, sound, time, hardness, electric field, electric current, voltage, electric power, radiation, flow rate, humidity, gradient, oscillation, or odor can be used.

The electronic device of one embodiment of the present invention preferably includes a sensor that measures the user's biological information such as the heart rate, the breath rate, the pulse, the temperature, or the blood pressure.

The electronic device of one embodiment of the present invention preferably has functions of sensing biological information and positional information and transmitting the information. For example, the electronic device can sense changes in user's physical conditions and transmit the biological information and the positional information to another electronic device. Thus, when the user gets out of condition or has an accident, he or she can be saved or the like quickly.

For example, an optical sensor can be used to measure a heart rate from contraction of capillaries of an arm or the like.

Alternatively, a sensor that can sense whether the electronic device is worn on the user's arm from the electric conductivity of his/her skin may be used so that the electronic device can be automatically powered on and off.

Any of these sensors is preferably provided on the surface side of the electronic device on which it is in contact with the user's skin.

Furthermore, the electronic device may be capable of measuring data of the usage environment, and may include a UV sensor or an illuminance sensor, for example. The amount of ultraviolet light can be determined to be used by a user for measures against sunburn. Alternatively, the brightness of the display portion may be capable of being automatically adjusted according to the ambient illuminance. Any of these sensors is preferably provided on the display surface side of the electronic device, for example.

Furthermore, the electronic device of one embodiment of the present invention may be capable of receiving GPS signals.

The electronic device of one embodiment of the present invention includes a driver circuit of the display panel, a circuit for charging the power storage device wirelessly, and a protection circuit that prevents overcharge of the power storage device and may further include a circuit for controlling or driving another functional element, specifically, an integrated circuit (e.g., a CPU).

In addition, the electronic device of one embodiment of the present invention may include a variety of functional elements or components such as an image sensor, a power generation element, a speaker, and a microphone.

The electronic device of one embodiment of the present invention may include a touch panel.

In one embodiment of the present invention, a structure where a capacitive touch sensor or a pressure-sensitive touch sensor is provided to overlap with the display panel, a structure where the display panel itself has a touch sensor function (also referred to as an in-cell touch panel), or the like can be used. For the in-cell touch panel, a capacitive touch sensor, an optical touch sensor, or the like can be used.

In playing water sports, such as swimming and scuba diving, or taking a bath, it is difficult to perform touch operation or detect touch operation in some cases. Thus, the electronic device of one embodiment of the present invention preferably includes an audio input portion as an input unit. For example, the electronic device preferably includes a microphone, particularly, a bone conduction microphone. The bone conduction microphone having excellent noise resistance can detect voice with high sensitivity even in an outdoor environment with much noise or interference. In addition, the bone conduction microphone can be favorably used in water. Moreover, the microphone is not necessarily positioned close to the mouth; thus, the degree of freedom of the position where the electronic device is worn is high, and the microphone can be used in an arm-worn electronic device without any trouble. Furthermore, the electronic device may include a bone conduction speaker as an output unit. Note that the electronic device may include another microphone or speaker that can be used in water.

Alternatively, with one embodiment of the present invention, a wearable device used in daily life having high water resistance can be fabricated. For example, the electronic device of one embodiment of the present invention has water resistance to at least 2 atmospheres (bars), preferably to 5 atmospheres, further preferably to 10 atmospheres, and still further preferably to 20 atmospheres.

Alternatively, with one embodiment of the present invention, a wearable device for diving can be fabricated. For example, the electronic device of one embodiment of the present invention having water resistance to 100 m, preferably to 200 m, can be used in diving in a shallow sea by scuba diving or the like. Moreover, the electronic device of one embodiment of the present invention having water resistance to 300 m, preferably to 1000 m, can be used in diving in a deep sea as well as in a shallow sea. The electronic device of one embodiment of the present invention includes the display panel including the light-emitting element; thus, visibility of display is high even at the nighttime or in water.

In addition, the electronic device of one embodiment of the present invention preferably includes a rotary bezel, particularly, a reverse rotation preventing bezel, for measuring the diving time or the pressure reduction time.

Moreover, the electronic device of one embodiment of the present invention may have a function of measuring, recording, or displaying temperature, water temperature, the depth of water, a dive log, or the like, or a chronograph function. Alternatively, the electronic device of one embodiment of the present invention may have a function of transmitting positional information specified by GPS signals to another electronic device. Thus, the safety of marine sports or work in the sea can be improved.

Moreover, the electronic device of one embodiment of the present invention having salt water resistance can be favorably used in playing marine sports or working in the sea, which is preferable.

FIGS. 9A to 9D and FIGS. 10A to 10D show specific examples of an arm-worn electronic device of one embodiment of the present invention.

Electronic devices illustrated in FIGS. 9A to 9D and FIGS. 10A to 10D each include at least one display portion 15 and at least one sealing structure 40.

FIGS. 9A and 9B and FIGS. 10A to 10C each illustrate an example of an electronic device whose sealing structure 40 can be worn on an arm or the like directly.

The sealing structure 40 is flexible and can be bent along a shape of a portion on which the electronic device is worn. Moreover, the display portion 15 may also be flexible.

A buckle 91 is connected to the sealing structure 40.

In the sealing structure 40, a plurality of openings 93 are provided. To suppress damage to the sealing structure 40 which starts from end portions of the openings 93 or entry of impurities from end portions of the openings 93 into the sealing structure 40, sealing portions 95 are preferably provided at the end portions of the openings 93. The sealing portion 95 can reinforce the vicinity of the end portions of the openings 93 in the sealing structure 40. The material of the sealing portion 95 is not limited, and a metal, an alloy, an organic resin, or the like can be used, for example.

Figure 9A:
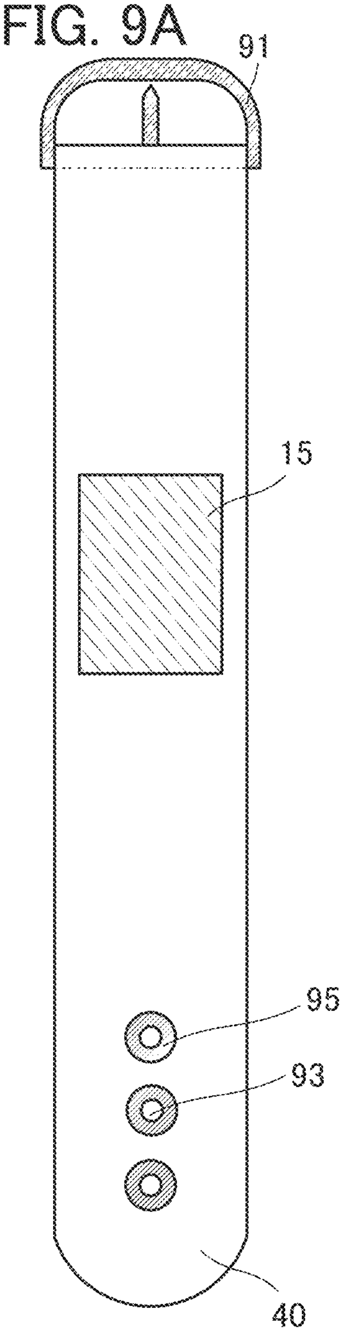
FIGS. 9A to 9D illustrate examples of an electronic device.
Figure 9B:
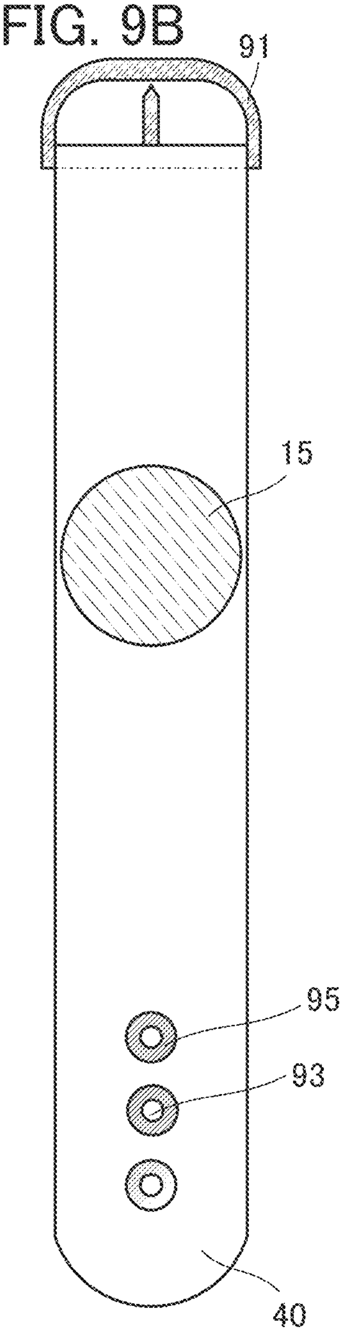
Figure 10A:
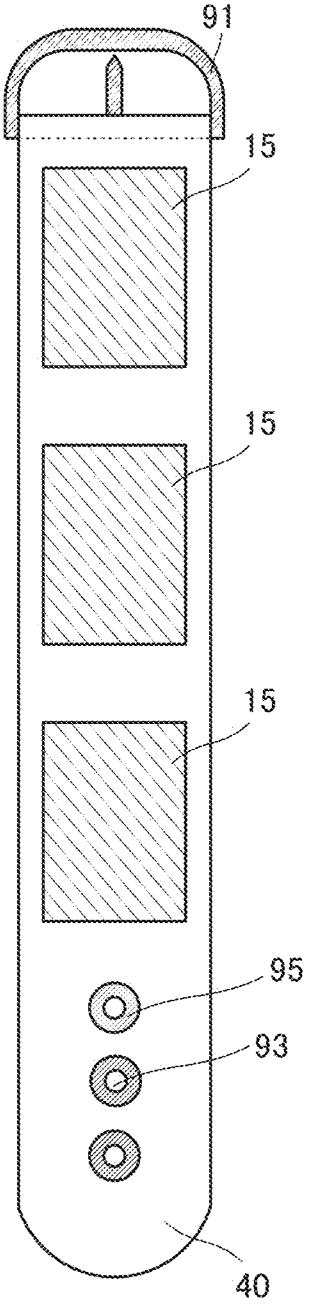
FIGS. 10A to 10D illustrate examples of an electronic device.
Figure 10B:
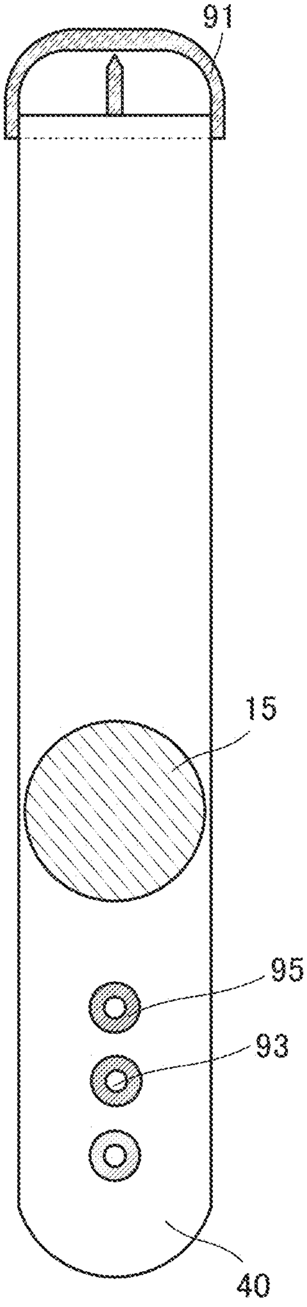
Figure 10C:
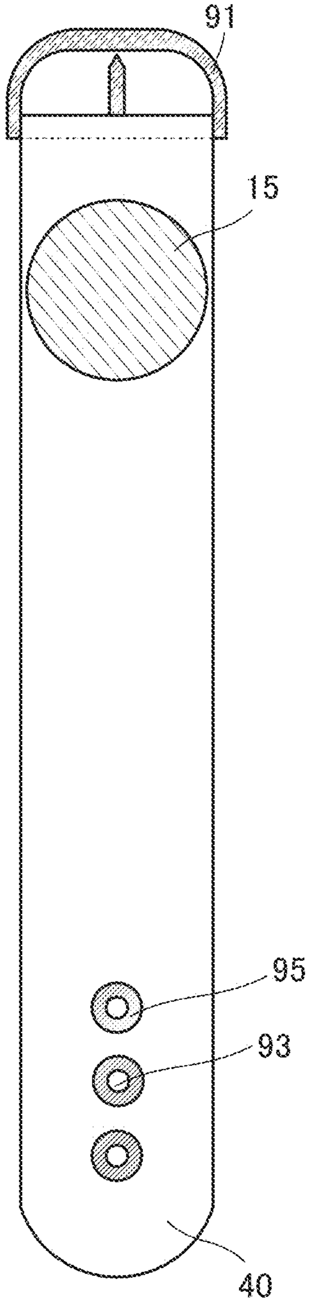

FIG. 9A and FIG. 10A each show an example where each display portion 15 is quadrangular and FIG. 9B and FIGS. 10B and 10C each show an example where the display portion 15 is circular. There is no particular limitation on a shape of the display portion 15. For example, any of display portions having various shapes such as a polygon other than a quadrangle, an ellipse, a semicircle, a star, and a heart can be used.

Although an electronic device in which one display portion is located almost in the middle of the electronic device is illustrated in FIGS. 9A and 9B, the position and the number of the display portions are not particularly limited. As illustrated in FIG. 10A, three display portions may be provided. Alternatively, as illustrated in FIGS. 10B and 10C, a display portion may be located at a position which is apart from the middle of the electronic device. Note that in the case where the electronic device includes a plurality of display portions, the shapes of the plurality of display portions may be the same or different from each other.

Figure 9C:
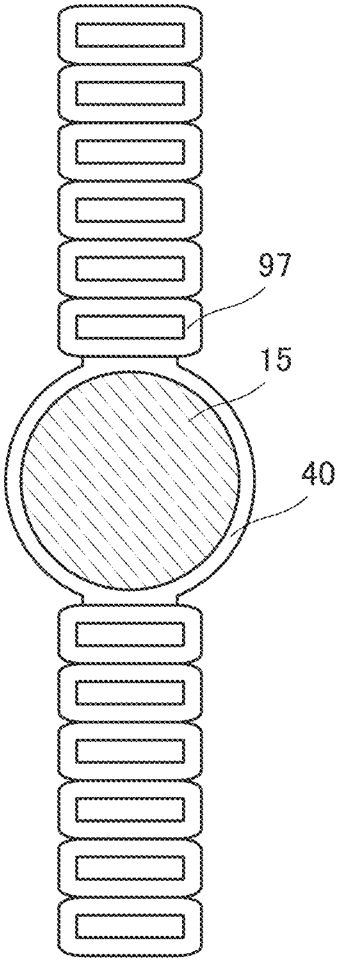
Figure 9D:
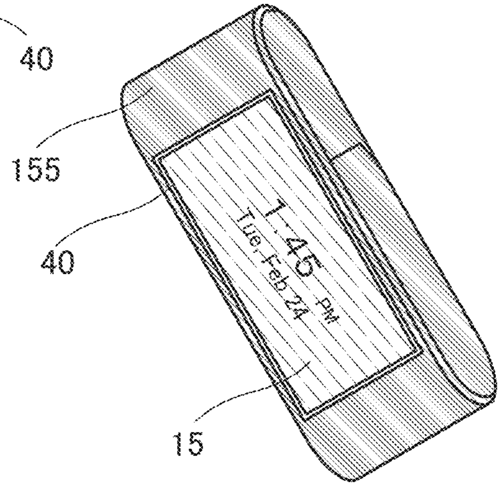
Figure 10D:
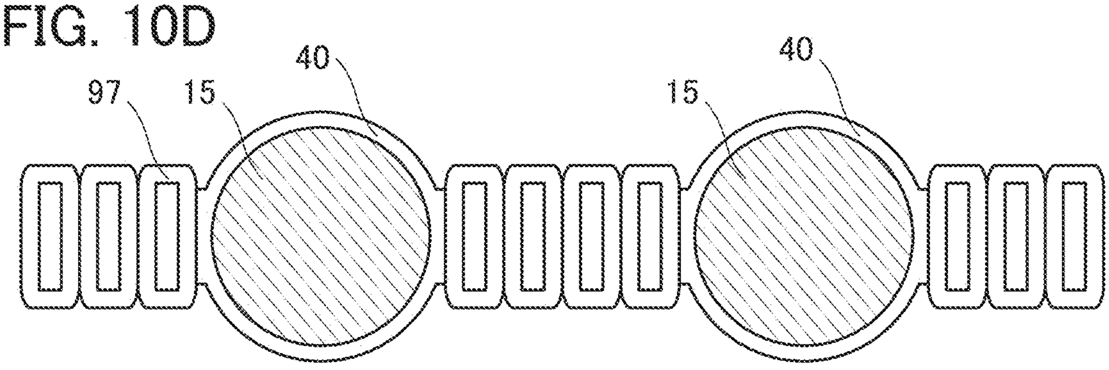

FIGS. 9C and 9D and FIG. 10D each show an example of an electronic device whose structure body connected to the sealing structure 40 can be worn on an arm or the like.

As illustrated in FIG. 9C and FIG. 10D, the electronic device may include a chain-like band 97 as the structure body, for example. Alternatively, as illustrated in FIG. 9D, the electronic device may include a belt-like band 155 as the structure body.

FIGS. 9C and 9D each show an example where one sealing structure 40 and one display portion 15 are included, and FIG. 10D shows an example where two sealing structures 40 and two display portions 15 are included.

As a material of the structure body, one or more of a metal, a resin, a natural material, and the like can be used. As the metal, stainless steel, aluminum, a titanium alloy, or the like can be used. As the resin, an acrylic resin, a polyimide resin, or the like can be used. As the natural material, processed wood, stone, bone, leather, paper, or cloth can be used, for example.

Figure 11A:
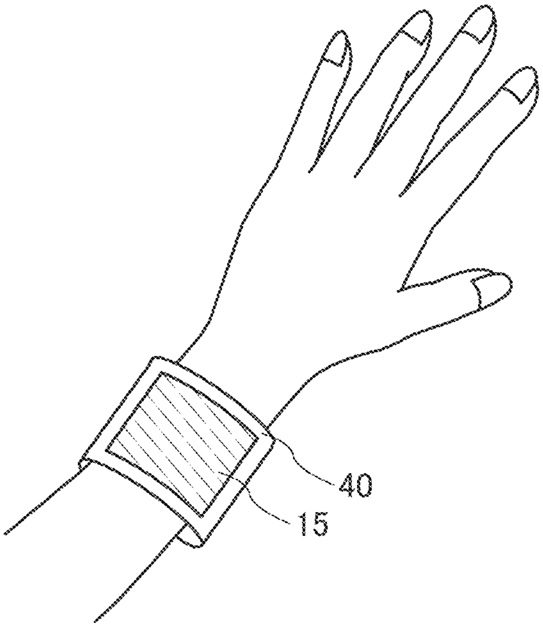
FIGS. 11A to 11C illustrate examples of how to wear an electronic device.
Figure 11B:
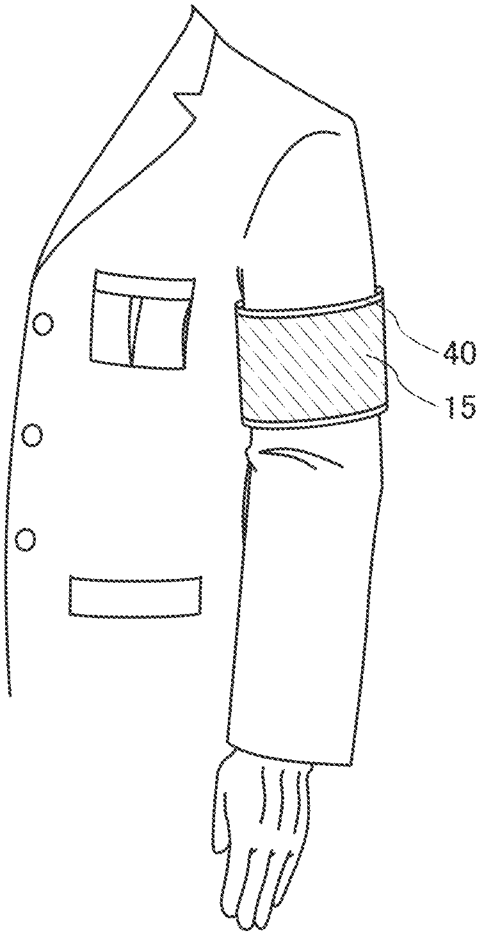
Figure 11C:
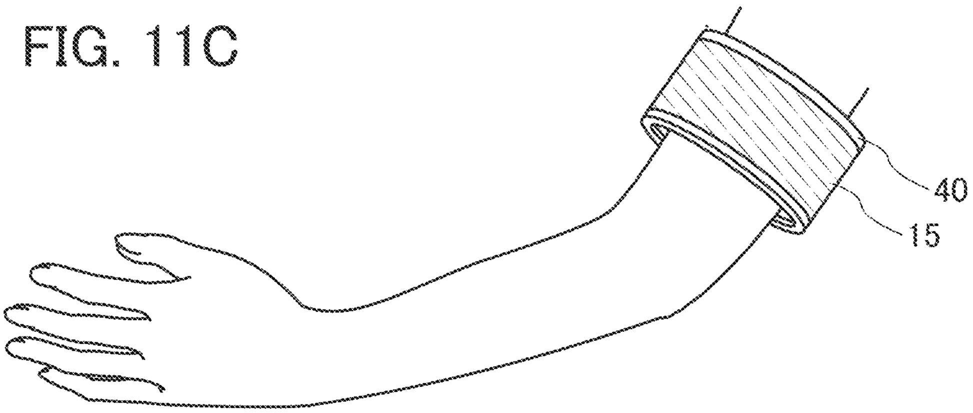

FIGS. 11A to 11C each show an example of how to wear the electronic device of one embodiment of the present invention. FIG. 11A shows an example where the electronic device of one embodiment of the present invention is worn on a wrist. FIG. 11B shows an example where the electronic device of one embodiment of the present invention is worn on clothes, which can also be called an armband electronic device. FIG. 11C shows an example where the electronic device of one embodiment of the present invention is worn on an upper arm.

The electronic device of one embodiment of the present invention is not necessarily worn on part of a human body. It can be attached to a robot (e.g., a factory robot and a humanoid robot), a columnar object (e.g., a column of a building, a utility pole, and an indicator pole), a tool, or the like.

The electronic device of one embodiment of the present invention may have a communication function and may be capable of sending and receiving e-mails by itself, for example. The electronic device is preferably capable of executing a variety of applications such as mobile phone calls, e-mailing, reading and editing texts, music reproduction, Internet communication, and a computer game.

Alternatively, the electronic device of one embodiment of the present invention may be connected wirelessly to another portable information terminal or a mobile phone such as a smartphone so as to send and receive e-mails, for example. For example, when a display portion of the electronic device of one embodiment of the present invention is used together with a display portion of a smartphone, the display portion of the electronic device of one embodiment of the present invention may be used as a subdisplay.

As described above, in one embodiment of the present invention, a display panel, a circuit, a power storage device, and the like are sealed by a sealing structure having high water resistance, whereby a wearable device which can be used in playing water sports or taking a bath can be fabricated. In addition, in one embodiment of the present invention, a sealing structure, a display panel, and a power storage device each having high heat resistance are used, whereby a wearable device which can be used in a wide temperature range can be fabricated.

This embodiment can be combined with any other embodiment as appropriate.

Embodiment 2

In this embodiment, a power storage device that can be used in the electronic device of one embodiment of the present invention will be described with reference to FIGS. 12A to 12C, FIGS. 13A and 13B, FIGS. 14A and 14B, FIG. 15, FIGS. 16A and 16B, FIGS. 17A and 17B, FIG. 18, FIGS. 19A to 19D, FIGS. 20A, 20B, 20C1, and 20C2, FIG. 21, FIGS. 22A to 22D, and FIG. 23. Note that the power storage device of one embodiment of the present invention is not limited to the structures described in this embodiment, and various shapes and modes can be used.

Although a lithium-ion secondary battery is described as an example in this embodiment, one embodiment of the present invention is not limited to this example. One embodiment of the present invention can be used for any of a battery, a primary battery, a secondary battery, a lithium air battery, a lead storage battery, a lithium-ion polymer secondary battery, a nickel-hydrogen storage battery, a nickel-cadmium storage battery, a nickel-iron storage battery, a nickel-zinc storage battery, a silver oxide-zinc storage battery, a solid-state battery, an air cell, a zinc-air battery, a capacitor, a lithium-ion capacitor, an electric double layer capacitor, an ultracapacitor, a supercapacitor, and the like.

In one embodiment of the present invention, power can be fed to the power storage device by a method for feeding power to an object (hereinafter, also referred to as a power receiving device) in a state where contact with a power supply source (hereinafter, also referred to as a power transmitting device) is not made (such a method is also referred to as contactless power feeding, wireless feeding, or the like). Examples of the contactless power feeding include a magnetic resonance method, an electromagnetic induction method, an electrostatic induction method, and the like.

Structure Example 1

Figure 12A:
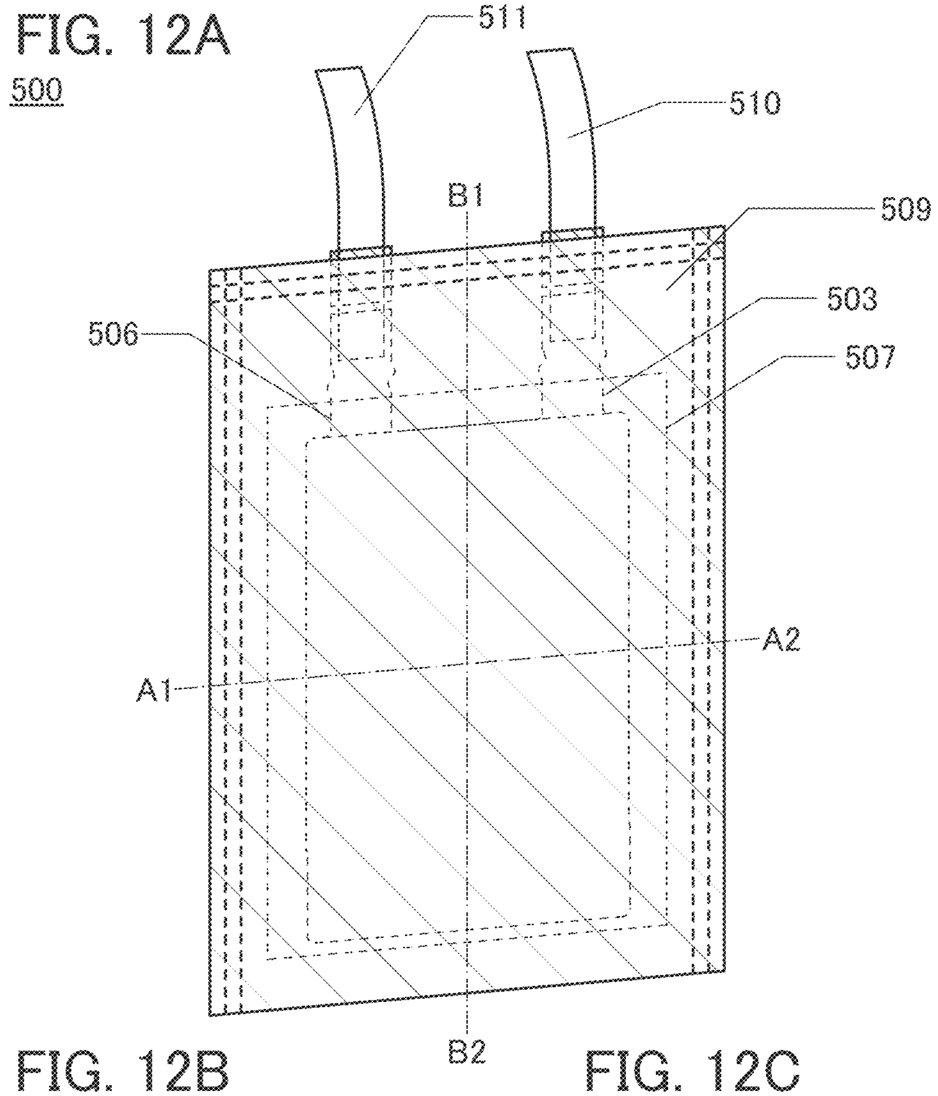
FIGS. 12A to 12C illustrate an example of a power storage device and examples of electrodes.

FIG. 12A illustrates a battery unit 500. Although FIG. 12A illustrates a mode of a thin secondary battery as an example of the battery unit 500, one embodiment of the present invention is not limited to this example. For example, a secondary battery using a wound body or a cylindrical or coin-type secondary battery can be used in the electronic device of one embodiment of the present invention.

As illustrated in FIG. 12A, the battery unit 500 includes a positive electrode 503, a negative electrode 506, a separator 507, and an exterior body 509. The battery unit 500 may include a positive electrode lead 510 and a negative electrode lead 511.

Figure 13A:
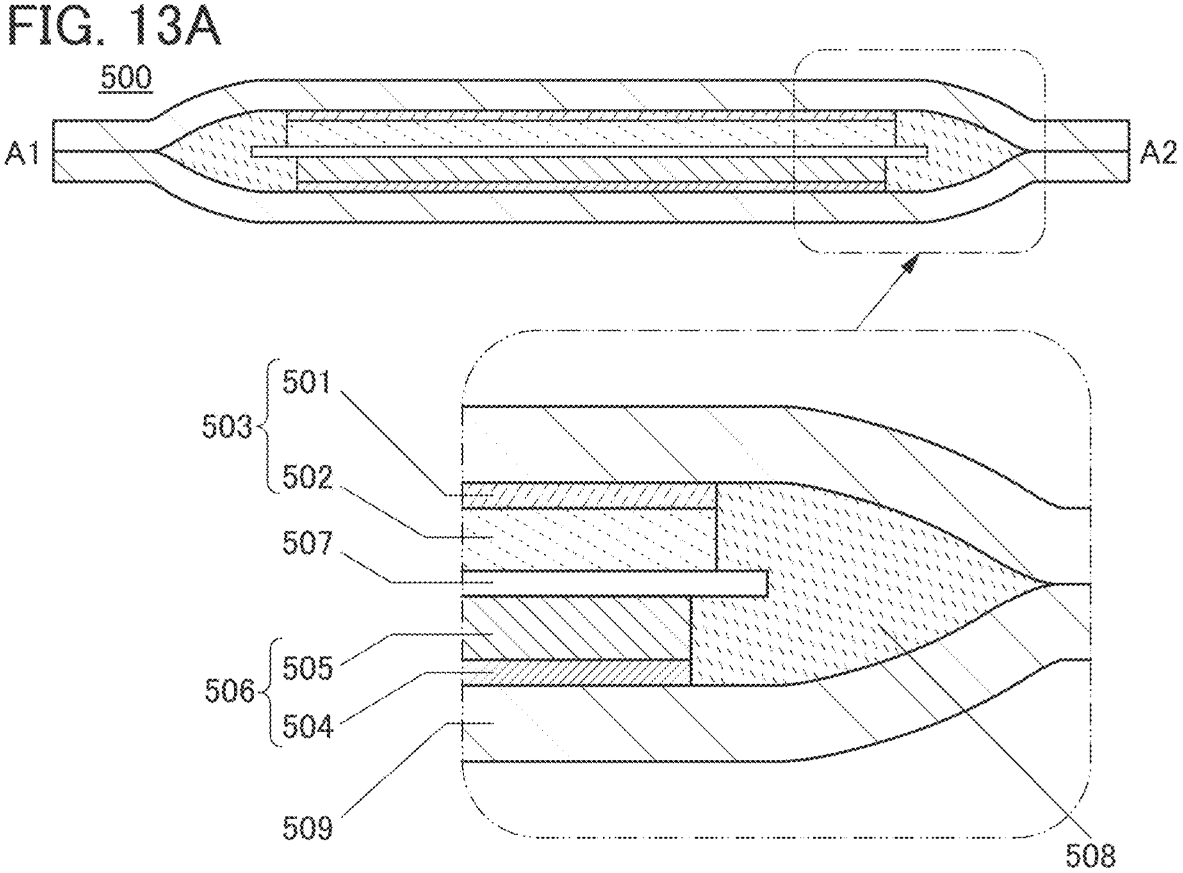
FIGS. 13A and 13B illustrate examples of a power storage device.
Figure 13B:
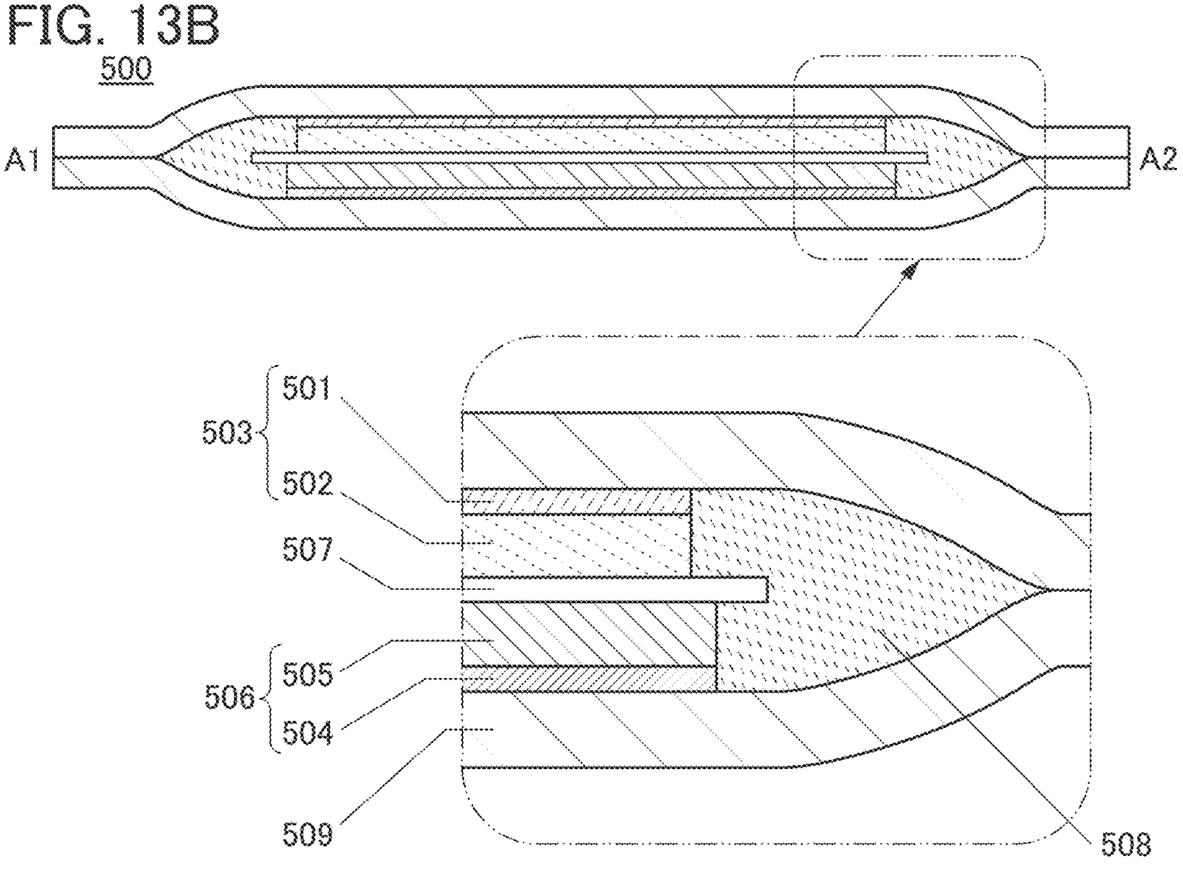

FIGS. 13A and 13B each illustrate an example of a cross-sectional view taken along dashed-dotted line A1-A2 in FIG. 12A. FIGS. 13A and 13B each illustrate a cross-sectional structure of the battery unit 500 that is formed using a pair of the positive electrode 503 and the negative electrode 506.

As illustrated in FIGS. 13A and 13B, the battery unit 500 includes the positive electrode 503, the negative electrode 506, the separator 507, an electrolytic solution 508, and the exterior bodies 509. The separator 507 is interposed between the positive electrode 503 and the negative electrode 506. A space surrounded by the exterior bodies 509 is filled with the electrolytic solution 508.

The positive electrode 503 includes a positive electrode active material layer 502 and a positive electrode current collector 501. The negative electrode 506 includes a negative electrode active material layer 505 and a negative electrode current collector 504. The active material layer can be formed on one or both surfaces of the current collector. The separator 507 is positioned between the positive electrode current collector 501 and the negative electrode current collector 504.

The battery unit includes one or more positive electrodes and one or more negative electrodes. For example, the battery unit can have a layered structure including a plurality of positive electrodes and a plurality of negative electrodes.

Figure 14A:
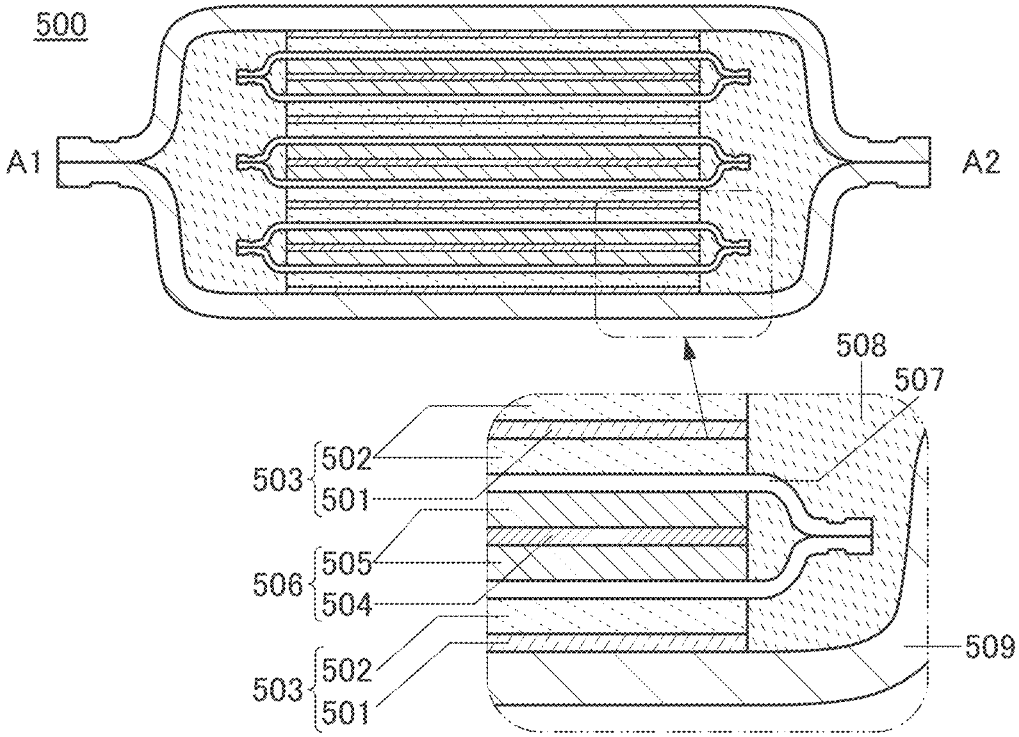
FIGS. 14A and 14B illustrate an example of a power storage device.
Figure 14B:
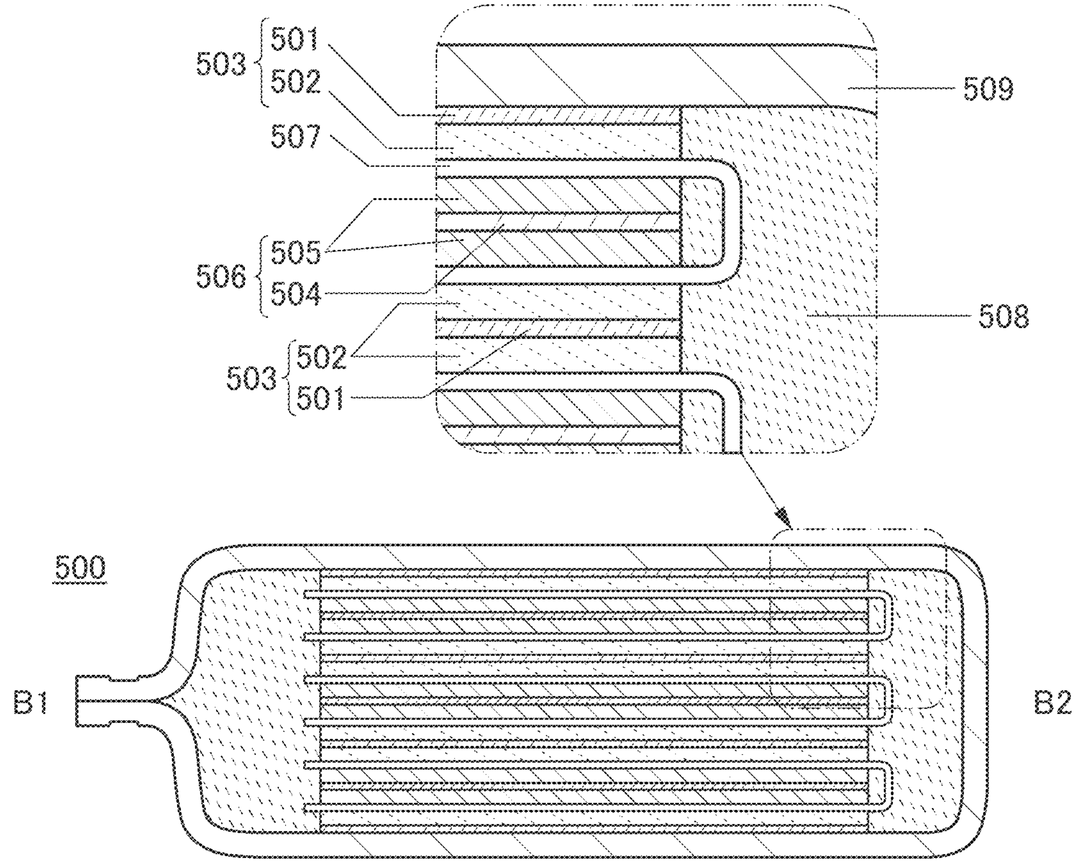

FIG. 14A illustrates another example of a cross-sectional view taken along dashed-dotted line A1-A2 in FIG. 12A. FIG. 14B is a cross-sectional view taken along dashed-dotted line B1-B2 in FIG. 12A.

FIGS. 14A and 14B each illustrate a cross-sectional structure of the battery unit 500 that is formed using a plurality of pairs of the positive and negative electrodes 503 and 506. There is no limitation on the number of electrode layers of the battery unit 500. In the case where a large number of electrode layers are used, the power storage device can have high capacity. In contrast, in the case where a small number of electrode layers are used, the power storage device can have a small thickness and high flexibility.

The examples in FIGS. 14A and 14B each include two positive electrodes 503 in each of which the positive electrode active material layer 502 is provided on one surface of the positive electrode current collector 501; two positive electrodes 503 in each of which the positive electrode active material layers 502 are provided on both surfaces of the positive electrode current collector 501; and three negative electrodes 506 in each of which the negative electrode active material layers 505 are provided on both surfaces of the negative electrode current collector 504. In other words, the battery unit 500 includes six positive electrode active material layers 502 and six negative electrode active material layers 505. Note that although the separator 507 has a bag-like shape in the examples illustrated in FIGS. 14A and 14B, the present invention is not limited to this example and the separator 507 may have a strip shape or a bellows shape.

Figure 12B:
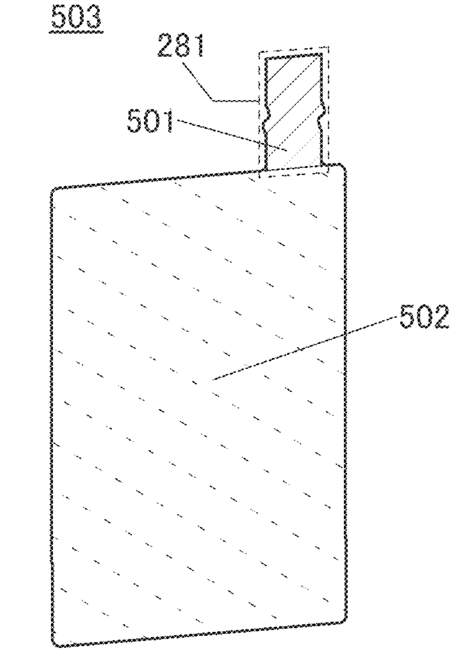

FIG. 12B illustrates the appearance of the positive electrode 503. The positive electrode 503 includes the positive electrode current collector 501 and the positive electrode active material layer 502.

Figure 12C:
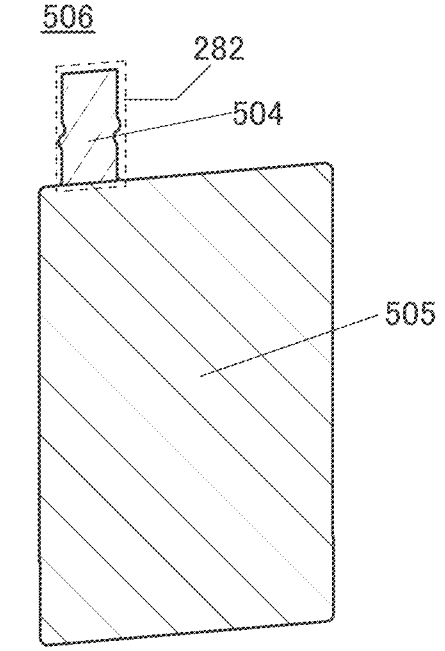

FIG. 12C illustrates the appearance of the negative electrode 506. The negative electrode 506 includes the negative electrode current collector 504 and the negative electrode active material layer 505.

The positive electrode 503 and the negative electrode 506 preferably include tab regions so that a plurality of stacked positive electrodes can be electrically connected to each other and a plurality of stacked negative electrodes can be electrically connected to each other. Furthermore, an electrode lead is preferably electrically connected to the tab region.

As illustrated in FIG. 12B, the positive electrode 503 preferably includes the tab region 281. The positive electrode lead 510 is preferably welded to part of the tab region 281. The tab region 281 preferably includes a region where the positive electrode current collector 501 is exposed. When the positive electrode lead 510 is welded to the region where the positive electrode current collector 501 is exposed, contact resistance can be further reduced. Although FIG. 12B illustrates the example where the positive electrode current collector 501 is exposed in the entire tab region 281, the tab region 281 may partly include the positive electrode active material layer 502.

As illustrated in FIG. 12C, the negative electrode 506 preferably includes the tab region 282. The negative electrode lead 511 is preferably welded to part of the tab region 282. The tab region 282 preferably includes a region where the negative electrode current collector 504 is exposed. When the negative electrode lead 511 is welded to the region where the negative electrode current collector 504 is exposed, contact resistance can be further reduced. Although FIG. 12C illustrates the example where the negative electrode current collector 504 is exposed in the entire tab region 282, the tab region 282 may partly include the negative electrode active material layer 505.

Although FIG. 12A illustrates the example where the ends of the positive electrode 503 and the negative electrode 506 are substantially aligned with each other, part of the positive electrode 503 may extend beyond the end of the negative electrode 506.

In the battery unit 500, the area of a region where the negative electrode 506 does not overlap with the positive electrode 503 is preferably as small as possible.

In the example illustrated in FIG. 13A, the end of the negative electrode 506 is located inward from the end of the positive electrode 503. With this structure, the entire negative electrode 506 can overlap with the positive electrode 503 or the area of the region where the negative electrode 506 does not overlap with the positive electrode 503 can be small.

The areas of the positive electrode 503 and the negative electrode 506 in the battery unit 500 are preferably substantially equal. For example, the areas of the positive electrode 503 and the negative electrode 506 that face each other with the separator 507 therebetween are preferably substantially equal. For example, the areas of the positive electrode active material layer 502 and the negative electrode active material layer 505 that face each other with the separator 507 therebetween are preferably substantially equal.

For example, as illustrated in FIGS. 14A and 14B, the area of the positive electrode 503 on the separator 507 side is preferably substantially equal to the area of the negative electrode 506 on the separator 507 side. When the area of a surface of the positive electrode 503 on the negative electrode 506 side is substantially equal to the area of a surface of the negative electrode 506 on the positive electrode 503 side, the region where the negative electrode 506 does not overlap with the positive electrode 503 can be small (does not exist, ideally), whereby the battery unit 500 can have reduced irreversible capacity. Alternatively, as illustrated in FIGS. 14A and 14B, the area of the surface of the positive electrode active material layer 502 on the separator 507 side is preferably substantially equal to the area of the surface of the negative electrode active material layer 505 on the separator 507 side.

As illustrated in FIGS. 14A and 14B, the end of the positive electrode 503 and the end of the negative electrode 506 are preferably substantially aligned with each other. Ends of the positive electrode active material layer 502 and the negative electrode active material layer 505 are preferably substantially aligned with each other.

In the example illustrated in FIG. 13B, the end of the positive electrode 503 is located inward from the end of the negative electrode 506. With this structure, the entire positive electrode 503 can overlap with the negative electrode 506 or the area of the region where the positive electrode 503 does not overlap with the negative electrode 506 can be small. In the case where the end of the negative electrode 506 is located inward from the end of the positive electrode 503, a current sometimes concentrates at the end portion of the negative electrode 506. For example, concentration of a current in part of the negative electrode 506 results in deposition of lithium on the negative electrode 506 in some cases. By reducing the area of the region where the positive electrode 503 does not overlap with the negative electrode 506, concentration of a current in part of the negative electrode 506 can be inhibited. As a result, for example, deposition of lithium on the negative electrode 506 can be inhibited, which is preferable.

As illustrated in FIG. 12A, the positive electrode lead 510 is preferably electrically connected to the positive electrode 503. Similarly, the negative electrode lead 511 is preferably electrically connected to the negative electrode 506. The positive electrode lead 510 and the negative electrode lead 511 are exposed to the outside of the exterior body 509 so as to serve as terminals for electrical contact with an external portion.

The positive electrode current collector 501 and the negative electrode current collector 504 can double as terminals for electrical contact with an external portion. In that case, the positive electrode current collector 501 and the negative electrode current collector 504 may be arranged such that part of the positive electrode current collector 501 and part of the negative electrode current collector 504 are exposed to the outside of the exterior body 509 without using electrode leads.

Figure 15:
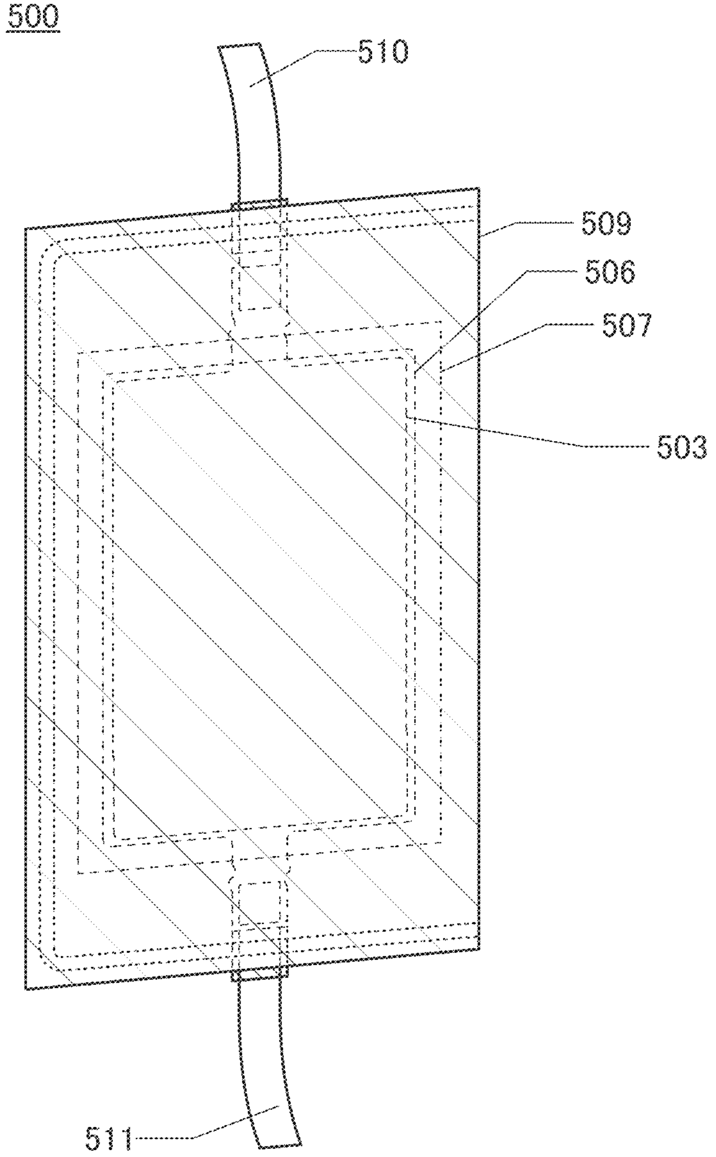
FIG. 15 illustrates an example of a power storage device.

Although the positive electrode lead 510 and the negative electrode lead 511 are provided on the same side of the battery unit 500 in FIG. 12A, the positive electrode lead 510 and the negative electrode lead 511 may be provided on different sides of the battery unit 500 as illustrated in FIG. 15. The electrode leads of the battery unit of one embodiment of the present invention can be freely positioned as described above; therefore, the degree of freedom in design is high. Accordingly, a product including the power storage device can have a high degree of freedom in design. Furthermore, a yield of products each including the power storage device can be increased.

The components of the battery unit will be described in detail below.

<<Current Collector>>

There is no particular limitation on the current collector as long as it has high conductivity without causing a significant chemical change in a power storage device. For example, the positive electrode current collector and the negative electrode current collector can each be formed using a metal such as stainless steel, gold, platinum, zinc, iron, nickel, copper, aluminum, titanium, tantalum, or manganese, an alloy thereof, sintered carbon, or the like. Alternatively, copper or stainless steel that is coated with carbon, nickel, titanium, or the like may be used. Alternatively, the current collectors can each be formed using an aluminum alloy to which an element that improves heat resistance, such as silicon, titanium, neodymium, scandium, or molybdenum, is added. Still alternatively, a metal element that forms silicide by reacting with silicon can be used to form the current collectors. Examples of the metal element that forms silicide by reacting with silicon include zirconium, titanium, hafnium, vanadium, niobium, tantalum, chromium, molybdenum, tungsten, cobalt, and nickel.

An irreversible reaction with an electrolytic solution is sometimes caused on a surface of the positive electrode current collector or a surface of the negative electrode current collector. Thus, the positive electrode current collector and the negative electrode current collector each preferably have low reactivity with an electrolytic solution. Stainless steel or the like is preferably used for the positive electrode current collector or the negative electrode current collector, in which case reactivity with an electrolytic solution can be lowered in some cases, for example.

The positive electrode current collector and the negative electrode current collector can each have any of various shapes including a foil-like shape, a plate-like shape (sheet-like shape), a net-like shape, a cylindrical shape, a coil shape, a punching-metal shape, an expanded-metal shape, a porous shape, and a shape of non-woven fabric as appropriate. The positive electrode current collector and the negative electrode current collector may each be formed to have micro irregularities on the surface thereof in order to enhance adhesion to the active material layer. The positive electrode current collector and the negative electrode current collector each preferably have a thickness of 5 μm to 30 μm inclusive.

An undercoat layer may be provided over part of a surface of the current collector. The undercoat layer is a coating layer provided to reduce contact resistance between the current collector and the active material layer or to improve adhesion between the current collector and the active material layer. Note that the undercoat layer is not necessarily formed over the entire surface of the current collector and may be partly formed to have an island-like shape. In addition, the undercoat layer may serve as an active material to have capacity. For the undercoat layer, a carbon material can be used, for example. Examples of the carbon material include carbon black such as acetylene black, a carbon nanotube, and graphite. Examples of the undercoat layer include a metal layer, a layer containing carbon and high molecular compounds, and a layer containing metal and high molecular compounds.

<<Active Material Layer>>

The active material layer includes the active material. An active material refers only to a material that is involved in insertion and extraction of ions that are carriers. In this specification and the like, a layer including the active material is referred to as an active material layer. The active material layer may include a conductive additive and a binder in addition to the active material.

The positive electrode active material layer includes one or more kinds of positive electrode active materials. The negative electrode active material layer includes one or more kinds of negative electrode active materials.

The positive electrode active material and the negative electrode active material have a central role in battery reactions of a power storage device, and receive and release carrier ions. To increase the lifetime of the power storage device, the active materials preferably have a little capacity involved in irreversible battery reactions, and have high charge and discharge efficiency.

For the positive electrode active material, a material into and from which carrier ions such as lithium ions can be inserted and extracted can be used. Examples of a positive electrode active material include materials having an olivine crystal structure, a layered rock-salt crystal structure, a spinel crystal structure, and a NASICON crystal structure.

As the positive electrode active material, a compound such as $LiFeO_2$, $LiCoO_2$, $LiNiO_2$, or $LiMn_2O_4$, $V_2O_5$, $Cr_2O_5$, or $MnO_2$ can be used.

As an example of a material having an olivine crystal structure, lithium-containing complex phosphate ($LiMPO_4$ (general formula) (M is one or more of Fe(II), Mn(II), Co(II), and Ni(II))) can be given. Typical examples of $LiMPO_4$ are compounds such as $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ ($a+b\leq 1$, $0<a<1$, and $0<b<1$), $LiFe_cNi_dCo_ePO_4$, $LiFe_cNi_dMn_ePO_4$, $LiNi_cCo_dMn_ePO_4$ ($c+d+e\leq 1$, $0<c<1$, $0<d<1$, and $0<e<1$), and $LiFe_fNi_gCo_hMn_iPO_4$ ($f+g+h+i\leq 1$, $0<f<1$, $0<g<1$, $0<h<1$, and $0<i<1$).

For example, lithium iron phosphate ($LiFePO_4$) is preferable because it properly has properties necessary for the positive electrode active material, such as safety, stability, high capacity density, high potential, and the existence of lithium ions which can be extracted in initial oxidation (charging).

The use of $LiFePO_4$ for the positive electrode active material allows fabrication of a highly safe power storage device that is stable against an external load such as overcharging. Such a power storage device is particularly suitable for, for example, a mobile device, a wearable device, and the like.

Examples of a material with a layered rock-salt crystal structure include lithium cobalt oxide ($LiCoO_2$), $LiNiO_2$, $LiMnO_2$, $Li_2MnO_3$, a NiCo-containing material (general formula: $LiNi_xCo_{1-x}O_2$ ($0<x<1$)) such as $LiNi_{0.8}Co_{0.2}O_2$, a NiMn-containing material (general formula: $LiNi_xMn_{1-x}O_2$ ($0<x<1$)) such as $LiNi_{0.5}Mn_{0.5}O_2$, a NiMnCo-containing material (also referred to as NMC) (general formula: $LiNi_xMn_yCo_{1-x-y}O_2$ ($x>0$, $y>0$, $x+y<1$)) such as $LiNi_{1/3}Mn_{1/3}Co_{1/3}O_2$. Moreover, $Li(Ni_{0.8}Co_{0.15}Al_{0.05})O_2$, $Li_2MnO_3$—$LiMO_2$ (M=Co, Ni, or Mn), and the like can be given as the examples.

In particular, $LiCoO_2$ is preferable because it has advantages such as high capacity, higher stability in the air than that of $LiNiO_2$, and higher thermal stability than that of $LiNiO_2$.

Examples of a material with a spinel crystal structure include $LiMn_2O_4$, $Li_{1+x}Mn_{2-x}O_4$ ($0<x<2$), $LiMn_{2-x}Al_xO_4$ ($0<x<2$), and $LiMn_{1.5}Ni_{0.5}O_4$.

It is preferred that a small amount of lithium nickel oxide ($LiNiO_2$ or $LiNi_{1-x}M_xO_2$ ($0<x<1$, M=Co, Al, or the like)) be added to a material with a spinel crystal structure that contains manganese, such as $LiMn_2O_4$, in which case advantages such as inhibition of the dissolution of manganese and the decomposition of an electrolytic solution can be obtained.

Alternatively, a lithium-containing complex silicate expressed by $Li_{(2-j)}MSiO_4$ (general formula) (M is one or more of Fe(II), Mn(II), Co(II), or Ni(II); $0\leq j\leq 2$) may be used as the positive electrode active material. Typical examples of the general formula $Li_{(2-j)}MSiO_4$ are compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ ($k+l\leq 1$, $0<k<1$, and $0<l<1$), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ ($m+n+q\leq 1$, $0<m<1$, $0<n<1$, and $0<q<1$), and $Li_{(2-j)}Fe_rNi_sCo_tMn_uSiO_4$ ($r+s+t+u\leq 1$, $0<r<1$, $0<s<1$, $0<t<1$, and $0<u<1$).

Still alternatively, a NASICON compound expressed by $A_xM_2(XO_4)_3$ (general formula) (A=Li, Na, or Mg, M=Fe, Mn, Ti, V, Nb, or Al, X=S, P, Mo, W, As, or Si) can be used for the positive electrode active material. Examples of the NASICON compound are $Fe_2(MnO_4)_3$, $Fe_2(SO_4)_3$, and $Li_3Fe_2(PO_4)_3$.

Further alternatively, for example, a compound expressed by $Li_2MPO_4F$, $Li_2MP_2O_7$, or $Li_5MO_4$ (general formula) (M=Fe or Mn), a perovskite fluoride such as $FeF_3$, a metal chalcogenide (a sulfide, a selenide, or a telluride) such as $TiS_2$ and $MoS_2$, a lithium-containing material with an inverse spinel structure such as $LiMVO_4$ (M=Mn, Co, or Ni), a vanadium oxide ($V_2O_5$, $V_6O_{13}$, $LiV_3O_8$, or the like), a manganese oxide, or an organic sulfur compound can be used as the positive electrode active material.

Further alternatively, any of the aforementioned materials may be combined to be used as the positive electrode active material. For example, a solid solution obtained by combining two or more of the above materials can be used as the positive electrode active material. For example, a solid solution of $LiCo_{1/3}Mn_{1/3}Ni_{1/3}O_2$ and $Li_2MnO_3$ can be used as the positive electrode active material.

In the case where carrier ions are alkali metal ions other than lithium ions, or alkaline-earth metal ions, a compound containing carriers such as an alkali metal (e.g., sodium and potassium) or an alkaline-earth metal (e.g., calcium, strontium, barium, beryllium, and magnesium) instead of lithium of the lithium compound, the lithium-containing complex phosphate, or the lithium-containing complex silicate may be used as the positive electrode active material.

The average diameter of primary particles of the positive electrode active material is preferably, for example, greater than or equal to 5 nm and less than or equal to 100 μm.

For example, lithium-containing complex phosphate having an olivine crystal structure used for the positive electrode active material has a one-dimensional lithium diffusion path, so that lithium diffusion is slow. Thus, in the case where lithium-containing complex phosphate having an olivine crystal structure is used, the average diameter of particles of the positive electrode active material is, for example, preferably greater than or equal to 5 nm and less than or equal to 1 μm so that the charge and discharge rate is increased. The specific surface area of the positive electrode active material is, for example, preferably greater than or equal to 10 $m^2/g$ and less than or equal to 50 $m^2/g$.

An active material having an olivine crystal structure is much less likely to be changed in the crystal structure by charging and discharging and has a more stable crystal structure than, for example, an active material having a layered rock-salt crystal structure. Thus, a positive electrode active material having an olivine crystal structure is stable against operation such as overcharging. The use of such a positive electrode active material allows fabrication of a highly safe power storage device.

As the negative electrode active material, for example, a carbon-based material, an alloy-based material, or the like can be used.

Examples of the carbon-based material include graphite, graphitizing carbon (soft carbon), non-graphitizing carbon (hard carbon), a carbon nanotube, graphene, carbon black, and the like. Examples of the graphite include artificial graphite such as meso-carbon microbeads (MCMB), coke-based artificial graphite, or pitch-based artificial graphite and natural graphite such as spherical natural graphite. In addition, examples of the shape of the graphite include a flaky shape and a spherical shape.

Graphite has a low potential substantially equal to that of a lithium metal (higher than or equal to 0.1 V and lower than or equal to 0.3 V vs. $Li/Li^+$) when lithium ions are intercalated into the graphite (while a lithium-graphite intercalation compound is formed). For this reason, a lithium-ion secondary battery can have a high operating voltage. In addition, graphite is preferred because of its advantages such as relatively high capacity per unit volume, small volume expansion, low cost, and safety greater than that of a lithium metal.

For example, in the case where carrier ions are lithium ions, a material including at least one of Mg, Ca, Ga, Si, Al, Ge, Sn, Pb, As, Sb, Bi, Ag, Au, Zn, Cd, Hg, In, and the like can be used as the alloy-based material. Such elements have a higher capacity than carbon. In particular, silicon has a high theoretical capacity of 4200 mAh/g, and therefore, the capacity of the power storage device can be increased. Examples of an alloy-based material (compound-based material) using such elements include $Mg_2Si$, $Mg_2Ge$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, InSb, and SbSn.

Alternatively, for the negative electrode active material, an oxide such as SiO, SnO, $SnO_2$, titanium dioxide ($TiO_2$), lithium titanium oxide ($Li_4Ti_5O_{12}$), lithium-graphite intercalation compound ($Li_xC_6$), niobium pentoxide ($Nb_2O_5$), tungsten oxide ($WO_2$), or molybdenum oxide ($MoO_2$) can be used. Here, SiO is a compound containing silicon and oxygen. When the atomic ratio of silicon to oxygen is represented by $\alpha$:$\beta$, $\alpha$ preferably has an approximate value of $\beta$. Here, when $\alpha$ has an approximate value of $\beta$, an absolute value of the difference between $\alpha$ and $\beta$ is preferably less than or equal to 20% of a value of $\beta$, more preferably less than or equal to 10% of a value of $\beta$.

Still alternatively, for the negative electrode active material, $Li_{3-x}M_xN$ (M=Co, Ni, or Cu) with a $Li_3N$ structure, which is a nitride containing lithium and a transition metal, can be used. For example, $Li_{2.6}Co_{0.4}N_3$ is preferable because of high charge and discharge capacity (900 mAh/g and 1890 mAh/cm$^3$).

When a nitride containing lithium and a transition metal is used, lithium ions are contained in the negative electrode active material and thus the negative electrode active material can be used in combination with a material for a positive electrode active material that does not contain lithium ions, such as $V_2O_5$ or $Cr_3O_8$. In the case where a material containing lithium ions is used as a positive electrode active material, the nitride containing lithium and a transition metal can be used for the negative electrode active material by extracting the lithium ions contained in the positive electrode active material in advance.

Alternatively, a material that causes a conversion reaction can be used for the negative electrode active material; for example, a transition metal oxide that does not cause an alloy reaction with lithium, such as cobalt oxide (CoO), nickel oxide (NiO), and iron oxide (FeO), may be used.

Other examples of the material which causes a conversion reaction include oxides such as $Fe_2O_3$, CuO, $Cu_2O$, $RuO_2$, and $Cr_2O_3$, sulfides such as $CoS_{0.89}$, NiS, and CuS, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$.

The average diameter of primary particles of the negative electrode active material is preferably, for example, greater than or equal to 5 nm and less than or equal to 100 μm.

The positive electrode active material layer and the negative electrode active material layer may each include a conductive additive.

Examples of the conductive additive include a carbon material, a metal material, and a conductive ceramic material. Alternatively, a fiber material may be used as the conductive additive. The content of the conductive additive in the active material layer is preferably greater than or equal to 1 wt % and less than or equal to 10 wt %, more preferably greater than or equal to 1 wt % and less than or equal to 5 wt %.

A network for electric conduction can be formed in the electrode by the conductive additive. The conductive additive also allows maintaining of a path for electric conduction between the negative electrode active material particles. The addition of the conductive additive to the active material layer increases the electric conductivity of the active material layer.

Examples of the conductive additive include natural graphite, artificial graphite such as mesocarbon microbeads, and carbon fiber. Examples of carbon fiber include mesophase pitch-based carbon fiber, isotropic pitch-based carbon fiber, carbon nanofiber, and carbon nanotube. Carbon nanotube can be formed by, for example, a vapor deposition method. Other examples of the conductive additive include carbon materials such as carbon black (e.g., acetylene black (AB)), graphite (black lead) particles, graphene, and fullerene. Alternatively, metal powder or metal fibers of copper, nickel, aluminum, silver, gold, or the like, a conductive ceramic material, or the like can be used.

Flaky graphene has an excellent electrical characteristic of high conductivity and excellent physical properties of high flexibility and high mechanical strength. Thus, the use of graphene as the conductive additive can increase electrical conductivity between the active materials or between the active material and the current collector.

Note that graphene in this specification includes single-layer graphene and multilayer graphene including two to hundred layers. Single-layer graphene refers to a one-atom-thick sheet of carbon molecules having $\pi$ bonds. Graphene oxide refers to a compound formed by oxidation of such graphene.

Graphene is capable of making low-resistance surface contact and has extremely high conductivity even with a small thickness. Therefore, even a small amount of graphene can efficiently form a conductive path in an active material layer.

In the case where an active material with a small average particle diameter (e.g., 1 μm or less) is used, the specific surface area of the active material is large and thus more conductive paths for the active material particles are needed. In such a case, it is particularly preferred that graphene with extremely high conductivity that can efficiently form a conductive path even in a small amount is used.

The positive electrode active material layer and the negative electrode active material layer may each include a binder.

In this specification, the binder has at least one of a function of binding or bonding the active materials and a function of binding or bonding the active material layer and the current collector. The binder is sometimes changed in state during fabrication of an electrode or a battery. For example, the binder can be at least one of a liquid, a solid, and a gel. The binder is sometimes changed from a monomer to a polymer during fabrication of an electrode or a battery.

As the binder, for example, a water-soluble high molecular compound can be used. As the water-soluble high molecular compound, a polysaccharide or the like can be used. As the polysaccharide, a cellulose derivative such as carboxymethyl cellulose (CMC), methyl cellulose, ethyl cellulose, hydroxypropyl cellulose, diacetyl cellulose, or regenerated cellulose, starch, or the like can be used.

As the binder, a rubber material such as styrene-butadiene rubber (SBR), styrene-isoprene-styrene rubber, acrylonitrile-butadiene rubber, butadiene rubber, fluororubber, or ethylene-propylene-diene copolymer can be used. Any of these rubber materials may be used in combination with the aforementioned water-soluble high molecular compound. Since these rubber materials have rubber elasticity and easily expand and contract, it is possible to obtain a highly reliable electrode that is resistant to stress due to expansion and contraction of an active material by charging and discharging, bending of the electrode, or the like. On the other hand, the rubber materials have a hydrophobic group and thus are unlikely to be soluble in water in some cases. In such a case, particles are dispersed in an aqueous solution without being dissolved in water, so that increasing the viscosity of a composition containing a solvent used for the formation of the active material layer (also referred to as an electrode binder composition) up to the viscosity suitable for application might be difficult. A water-soluble high molecular compound having excellent viscosity modifying properties, such as a polysaccharide, can moderately increase the viscosity of the solution and can be uniformly dispersed together with a rubber material. Thus, a favorable electrode with high uniformity (e.g., an electrode with uniform electrode thickness or electrode resistance) can be obtained.

Alternatively, as the binder, a material such as PVdF, polystyrene, poly(methyl acrylate), poly(methyl methacrylate) (polymethyl methacrylate (PMMA)), sodium polyacrylate, polyvinyl alcohol (PVA), polyethylene oxide (PEO), polypropylene oxide, polyimide, polyvinyl chloride, polytetrafluoroethylene, polyethylene, polypropylene, isobutylene, polyethylene terephthalate (PET), nylon, polyacrylonitrile (PAN), polyvinyl chloride, ethylene-propylene-diene polymer, polyvinyl acetate, or nitrocellulose can be used.

Two or more of the above materials may be used in combination for the binder.

The content of the binder in the active material layer is preferably greater than or equal to 1 wt % and less than or equal to 10 wt %, more preferably greater than or equal to 2 wt % and less than or equal to 8 wt %, and still more preferably greater than or equal to 3 wt % and less than or equal to 5 wt %.

<<Electrolytic Solution>>

As a solvent of the electrolytic solution 508, an aprotic organic solvent is preferably used. For example, one of ethylene carbonate (EC), propylene carbonate (PC), butylene carbonate, chloroethylene carbonate, vinylene carbonate (VC), γ-butyrolactone, γ-valerolactone, dimethyl carbonate (DMC), diethyl carbonate (DEC), ethyl methyl carbonate (EMC), methyl formate, methyl acetate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of these solvents can be used in an appropriate combination in an appropriate ratio.

Alternatively, the use of one or more kinds of ionic liquids (room temperature molten salts) which have features of non-flammability and non-volatility as a solvent of the electrolytic solution can prevent a power storage device from exploding or catching fire even when a power storage device internally shorts out or the internal temperature increases owing to overcharging or the like. An ionic liquid contains a cation and an anion. The ionic liquid of one embodiment of the present invention contains an organic cation and an anion. Examples of the organic cation used for the electrolytic solution include aliphatic onium cations such as a quaternary ammonium cation, a tertiary sulfonium cation, and a quaternary phosphonium cation, and aromatic cations such as an imidazolium cation and a pyridinium cation. Examples of the anion used for the electrolytic solution include a monovalent amide-based anion, a monovalent methide-based anion, a fluorosulfonate anion, a perfluoroalkylsulfonate anion, a tetrafluoroborate anion, a perfluoroalkylborate anion, a hexafluorophosphate anion, and a perfluoroalkylphosphate anion.

In the case where lithium ions are used as carriers, as an electrolyte dissolved in the above-described solvent, one of lithium salts such as $LiPF_6$, $LiClO_4$, $LiAsF_6$, $LiBF_4$, $LiAlCl_4$, LiSCN, LiBr, LiI, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(FSO_2)_2$, $LiN(CF_3SO_2)_2$, $LiN(C_4F_9SO_2)(CF_3SO_2)$, and $LiN(C_2F_5SO_2)_2$ can be used, or two or more of these lithium salts can be used in an appropriate combination in an appropriate ratio.

The electrolytic solution used for a power storage device is preferably highly purified and contains a small amount of dust particles and elements other than the constituent elements of the electrolytic solution (hereinafter, also simply referred to as impurities). Specifically, the weight ratio of impurities to the electrolytic solution is less than or equal to 1%, preferably less than or equal to 0.1%, and more preferably less than or equal to 0.01%.

Furthermore, an additive agent such as vinylene carbonate (VC), propane sultone (PS), tert-butylbenzene (TBB), fluoroethylene carbonate (FEC), or LiBOB may be added to the electrolytic solution. The concentration of such an additive agent in the whole solvent can be, for example, higher than or equal to 0.1 wt % and lower than or equal to 5 wt %.

Alternatively, a polymer gelled electrolyte obtained in such a manner that a polymer is swelled with an electrolytic solution may be used.

Examples of a host polymer include a polymer having a polyalkylene oxide structure, such as polyethylene oxide (PEO); PVdF; polyacrylonitrile; and a copolymer containing any of them. For example, PVdF-HFP, which is a copolymer of PVdF and hexafluoropropylene (HFP) can be used. The polymer may be porous.

An electrolytic solution may be gelated by adding a polymerization initiator and a cross-linking agent to the electrolytic solution. For example, the ionic liquid itself may be polymerized in such a manner that a polymerizable functional group is introduced into a cation or an anion of the ionic liquid and polymerization thereof is caused with the polymerization initiator. Then, the polymerized ionic liquid may be gelated with a cross-linking agent.

In combination with the electrolytic solution, a solid electrolyte including an inorganic material such as a sulfide-based inorganic material and an oxide-based inorganic material, or a solid electrolyte including a macromolecular material such as a polyethylene oxide (PEO)-based macromolecular material may alternatively be used. For example, the solid electrolyte may be formed over a surface of the active material layer. In the case where the solid electrolyte and the electrolytic solution are used in combination, a separator or a spacer does not need to be provided in some cases.

When a macromolecular material that undergoes gelation is used as the solvent for the electrolytic solution, safety against liquid leakage and the like is improved. Furthermore, the power storage device can be thinner and more lightweight. For example, a polyethylene oxide-based polymer, a polyacrylonitrile-based polymer, a polyvinylidene fluoride-based polymer, a polyacrylate based polymer, and a polymethacrylate-based polymer can be used. A polymer which can gelate the electrolytic solution at normal temperature (e.g., 25° C.) is preferably used. Alternatively, a silicone gel may be used. In this specification and the like, the term polyvinylidene fluoride-based polymer, for example, refers to a polymer including polyvinylidene fluoride (PVdF), and includes a poly(vinylidene fluoride-hexafluoropropylene) copolymer and the like.

The above polymer can be qualitatively analyzed using a Fourier transform infrared (FT-IR) spectrometer or the like. For example, the polyvinylidene fluoride-based polymer has an absorption peak showing a C—F bond in a spectrum obtained with the FT-IR spectrometer. Furthermore, the polyacrylonitrile-based polymer has an absorption peak showing a C≡N bond in a spectrum obtained with the FT-IR spectrometer.

<<Separator>>

As the separator 507, paper, nonwoven fabric, a glass fiber, ceramics, a synthetic fiber such as nylon (polyamide), vinylon (a polyvinyl alcohol based fiber), polyester, acrylic, polyolefin, or polyurethane, or the like can be used. The separator 507 may have a single-layer structure or a stacked-layer structure.

More specifically, as a material for the separator 507, any of a fluorine-based polymer, polyethers such as polyethylene oxide and polypropylene oxide, polyolefin such as polyethylene and polypropylene, polyacrylonitrile, polyvinylidene chloride, polymethyl methacrylate, polymethylacrylate, polyvinyl alcohol, polymethacrylonitrile, polyvinyl acetate, polyvinylpyrrolidone, polyethyleneimine, polybutadiene, polystyrene, polyisoprene, a polyurethane-based polymer, and polyphenylene sulfide, derivatives thereof, cellulose, paper, nonwoven fabric, and fiberglass can be used either alone or in combination.

<<Exterior Body>>

It is preferred that the surface of the exterior body 509 that is in contact with the electrolytic solution 508, i.e., the inner surface of the exterior body 509, does not react with the electrolytic solution 508 significantly. When moisture enters the battery unit 500 from the outside, a reaction between a component of the electrolytic solution 508 or the like and water might occur. Thus, the exterior body 509 preferably has low moisture permeability.

As the exterior body 509, a film having a three-layer structure can be used, for example. In the three-layer structure, a highly flexible metal thin film of aluminum, stainless steel, copper, nickel, or the like is provided over a film formed using polyethylene, polypropylene, polycarbonate, ionomer, polyamide, or the like, and an insulating synthetic resin film of a polyamide-based resin, a polyester-based resin, or the like is provided as the outer surface of the exterior body over the metal thin film can be used. With such a three-layer structure, the passage of an electrolytic solution or a gas can be blocked and an insulating property and resistance to the electrolytic solution can be provided. The exterior body is folded inside in two, or two exterior bodies are stacked with the inner surfaces facing each other, in which case application of heat melts the materials on the overlapping inner surfaces to cause fusion bonding between the two exterior bodies. In this manner, a sealing structure can be formed.

The battery unit 500 can be flexible by using the exterior body 509 with flexibility. When the battery unit has flexibility, it can be used in a power storage device or an electronic device at least part of which is flexible, and the battery unit 500 can be bent as the power storage device or electronic device is bent.

Structure Example 2

Figure 16A:
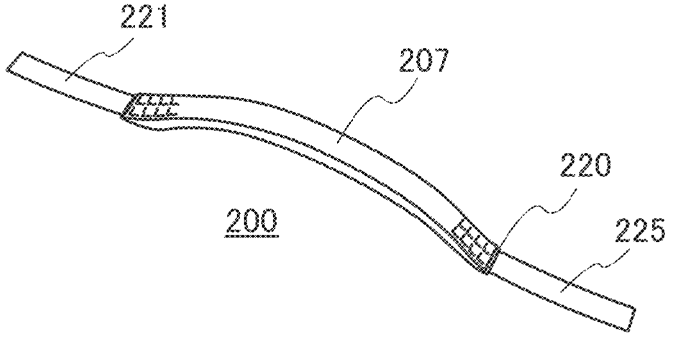
FIGS. 16A and 16B illustrate an example of a power storage device.
Figure 16B:
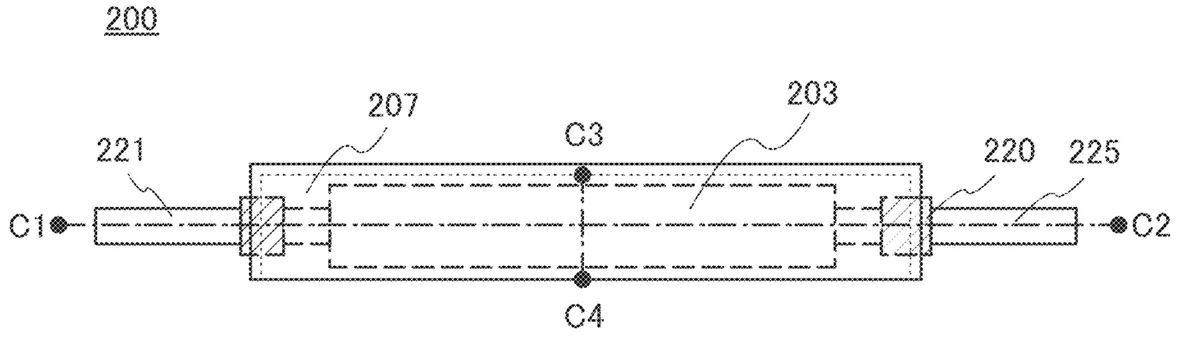

FIG. 16A is a perspective view of a secondary battery 200 and FIG. 16B is a top view of the secondary battery 200.

Figure 17A:
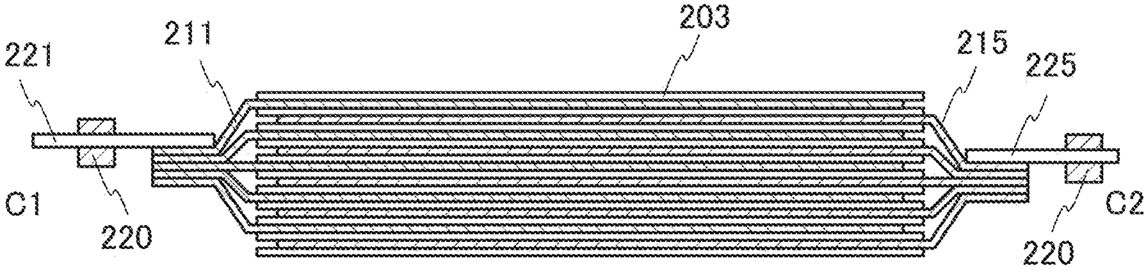
FIGS. 17A and 17B illustrate an example of a power storage device.
Figure 17B:
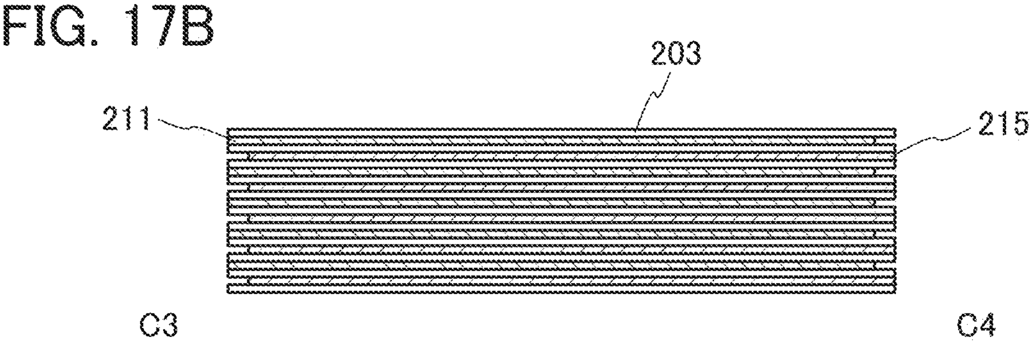

FIG. 17A is a cross-sectional view taken along dashed-dotted line C1-C2 in FIG. 16B, and FIG. 17B is a cross-sectional view taken along dashed-dotted line C3-C4 in FIG. 16B. Note that FIGS. 17A and 17B do not illustrate all components for clarity of the drawings.

The secondary battery 200 includes a positive electrode 211, a negative electrode 215, and a separator 203. The secondary battery 200 further includes a positive electrode lead 221, a negative electrode lead 225, and an exterior body 207.

The positive electrode 211 and the negative electrode 215 each include a current collector and an active material layer. The positive electrode 211 and the negative electrode 215 are provided such that the active material layers face each other with the separator 203 provided therebetween.

One of the electrodes (the positive electrode 211 and the negative electrode 215) of the secondary battery 200 that is positioned on the outer diameter side of a curved portion is preferably longer than the other electrode that is positioned on the inner diameter side of the curved portion, in the direction in which the electrode is curved. With such a structure, ends of the positive electrode 211 and those of the negative electrode 215 are aligned when the secondary battery 200 is curved with a certain curvature. That is, the entire region of the positive electrode active material layer included in the positive electrode 211 can face the negative electrode active material layer included in the negative electrode 215. Thus, positive electrode active materials included in the positive electrode 211 can efficiently contribute to a battery reaction. Therefore, the capacity of the secondary battery 200 per volume can be increased. Such a structure is particularly effective in a case where the curvature of the secondary battery 200 is fixed in using the secondary battery 200.

The positive electrode lead 221 is electrically connected to a plurality of positive electrodes 211. The negative electrode lead 225 is electrically connected to a plurality of negative electrodes 215. The positive electrode lead 221 and the negative electrode lead 225 each include a sealing layer 220.

The exterior body 207 covers a plurality of positive electrodes 211, a plurality of negative electrodes 215, and a plurality of separators 203. The secondary battery 200 includes an electrolytic solution (not shown) in a region covered with the exterior body 207. Three sides of the exterior body 207 are bonded, whereby the secondary battery 200 is sealed.

In FIGS. 17A and 17B, the separators 203 each having a strip-like shape are used and each pair of the positive electrode 211 and the negative electrode 215 sandwich the separator 203; however, one embodiment of the present invention is not limited to this structure. One separator sheet may be folded in zigzag (or into a bellows shape) or wound so that the separator is positioned between the positive electrode and the negative electrode.

Figure 18:
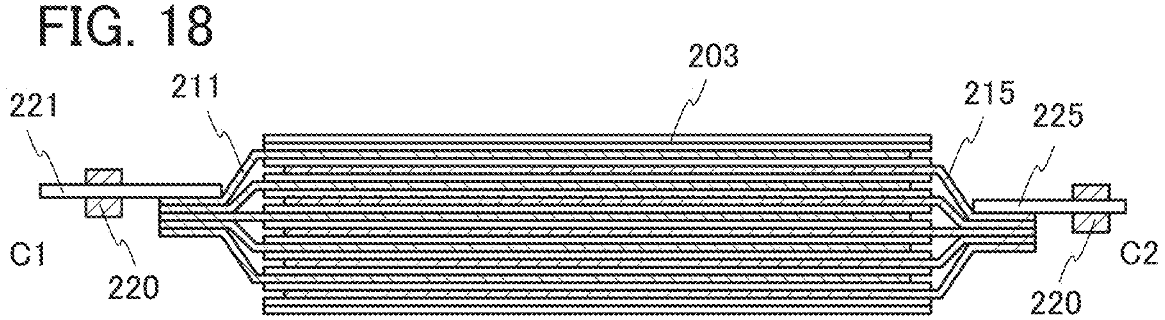
FIG. 18 illustrates an example of a power storage device.

An example of a method for fabricating the secondary battery 200 is illustrated in FIGS. 19A to 19D. FIG. 18 is a cross-sectional view taken along dashed-dotted line C1-C2 in FIG. 16B of the case where this manufacturing method is employed.

First, the negative electrode 215 is positioned over the separator 203 (FIG. 19A) such that the negative electrode active material layer of the negative electrode 215 overlaps with the separator 203.

Then, the separator 203 is folded to overlap with the negative electrode 215. Next, the positive electrode 211 overlaps with the separator 203 (FIG. 19B) such that the positive electrode active material layer of the positive electrode 211 overlaps with the separator 203 and the negative electrode active material layer. Note that in the case where an electrode in which one surface of a current collector is provided with an active material layer is used, the positive electrode active material layer of the positive electrode 211 and the negative electrode active material layer of the negative electrode 215 are positioned to face each other with the separator 203 provided therebetween.

Figure 19A:
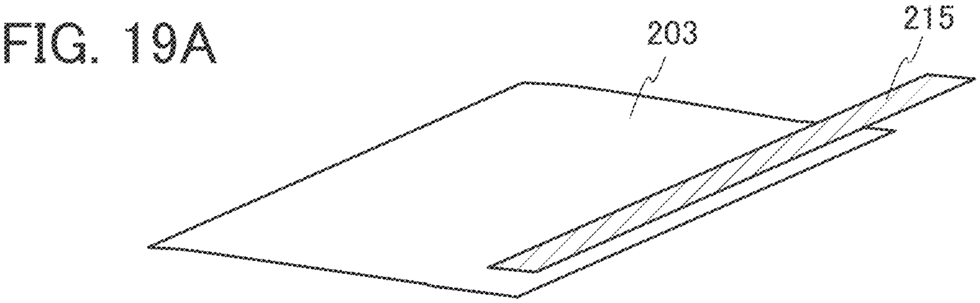
FIGS. 19A to 19D illustrate an example of a method for fabricating a power storage device.
Figure 19B:
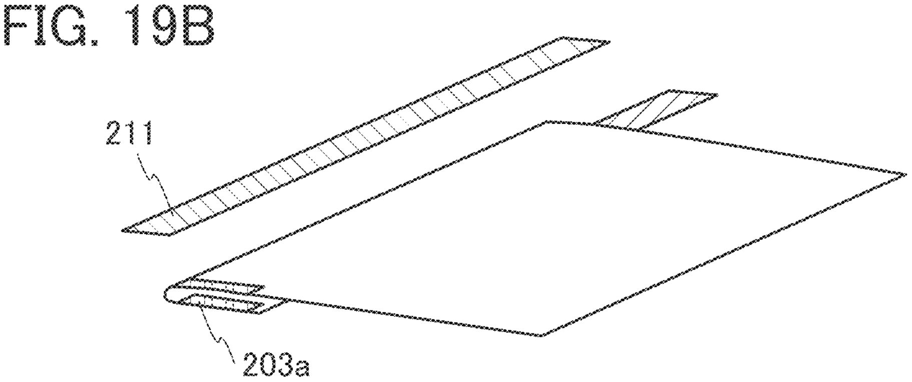

In the case where the separator 203 is formed using a material that can be thermally welded, such as polypropylene, a region where the separator 203 overlaps with itself is thermally welded and then another electrode overlaps with the separator 203, whereby the slippage of the electrode in the fabrication process can be suppressed. Specifically, a region which does not overlap with the negative electrode 215 or the positive electrode 211 and in which the separator 203 overlaps with itself, e.g., a region denoted as 203*a* in FIG. 19B, is preferably thermally welded.

Figure 19C:
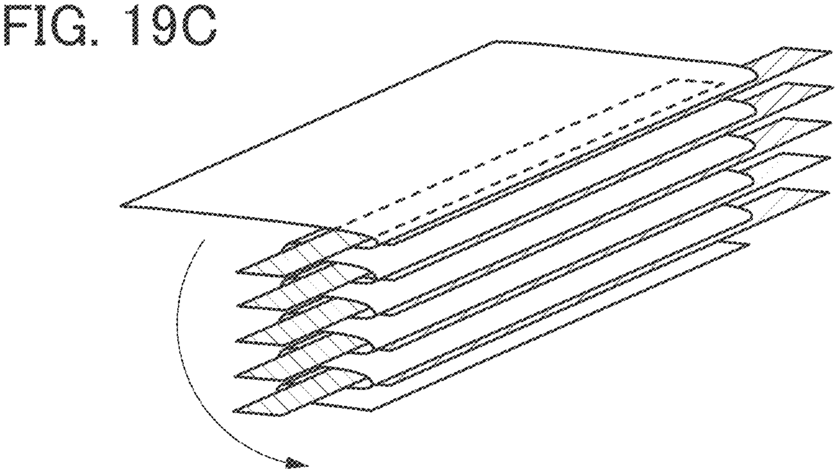

By repeating the above steps, the positive electrode 211 and the negative electrode 215 can overlap with each other with the separator 203 provided therebetween as illustrated in FIG. 19C.

Note that a plurality of positive electrodes 211 and a plurality of negative electrodes 215 may be placed to be alternately sandwiched by the separator 203 that is repeatedly folded in advance.

Then, as illustrated in FIG. 19C, a plurality of positive electrodes 211 and a plurality of negative electrodes 215 are covered with the separator 203.

Figure 19D:
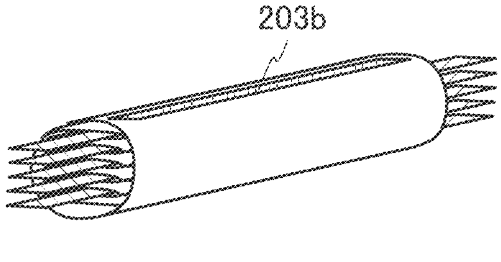

Furthermore, the region where the separator 203 overlaps with itself, e.g., a region 203*b* in FIG. 19D, is thermally welded as illustrated in FIG. 19D, whereby a plurality of positive electrodes 211 and a plurality of negative electrodes 215 are covered with and tied with the separator 203.

Note that a plurality of positive electrodes 211, a plurality of negative electrodes 215, and the separator 203 may be tied with a binding material.

Since the positive electrodes 211 and the negative electrodes 215 are stacked in the above process, one separator 203 has a region sandwiched between the positive electrode 211 and the negative electrode 215 and a region covering a plurality of positive electrodes 211 and a plurality of negative electrodes 215.

In other words, the separator 203 included in the secondary battery 200 in FIG. 18 and FIG. 19D is a single separator which is partly folded. In the folded regions of the separator 203, a plurality of positive electrodes 211 and a plurality of negative electrodes 215 are provided.

Structure Example 3

Figure 20A:
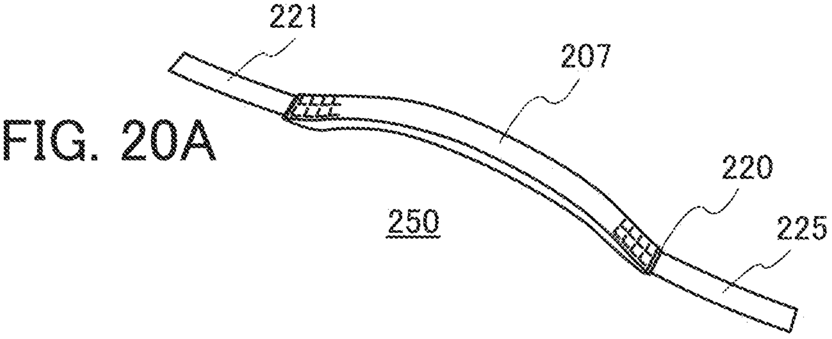
Figure 20B:
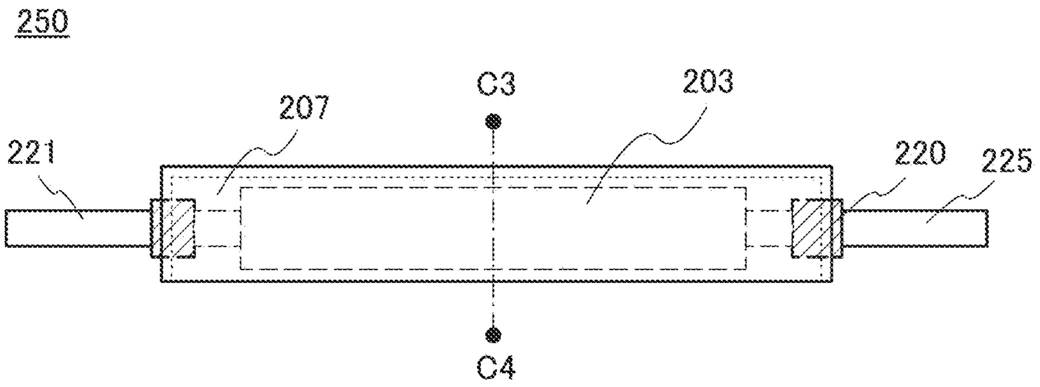
Figure 20B:
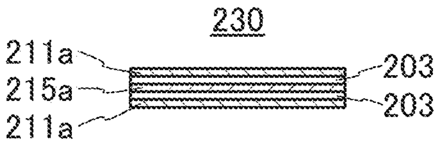
Figure 20B:
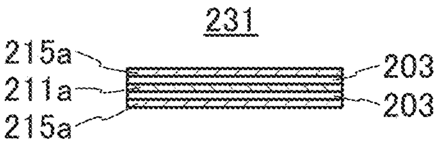

FIG. 20A is a perspective view of a secondary battery 250 and FIG. 20B is a top view of the secondary battery 250. Furthermore, FIG. 20C1 is a cross-sectional view of a first electrode assembly 230 and FIG. 20C2 is a cross-sectional view of a second electrode assembly 231.

The secondary battery 250 includes the first electrode assembly 230, the second electrode assembly 231, and the separator 203. The secondary battery 250 further includes the positive electrode lead 221, the negative electrode lead 225, and the exterior body 207.

As illustrated in FIG. 20C1, in the first electrode assembly 230, a positive electrode 211*a*, the separator 203, a negative electrode 215*a*, the separator 203, and the positive electrode 211*a* are stacked in this order. The positive electrode 211*a* and the negative electrode 215*a* each include active material layers on both surfaces of a current collector.

As illustrated in FIG. 20C2, in the second electrode assembly 231, a negative electrode 215*a*, the separator 203, the positive electrode 211*a*, the separator 203, and the negative electrode 215*a* are stacked in this order. The positive electrode 211*a* and the negative electrode 215*a* each include active material layers on both surfaces of a current collector.

In other words, in each of the first electrode assembly 230 and the second electrode assembly 231, the positive electrode and the negative electrode are provided such that the active material layers face each other with the separator 203 provided therebetween.

The positive electrode lead 221 is electrically connected to a plurality of positive electrodes 211. The negative electrode lead 225 is electrically connected to a plurality of negative electrodes 215. The positive electrode lead 221 and the negative electrode lead 225 each include the sealing layer 220.

Figure 21:
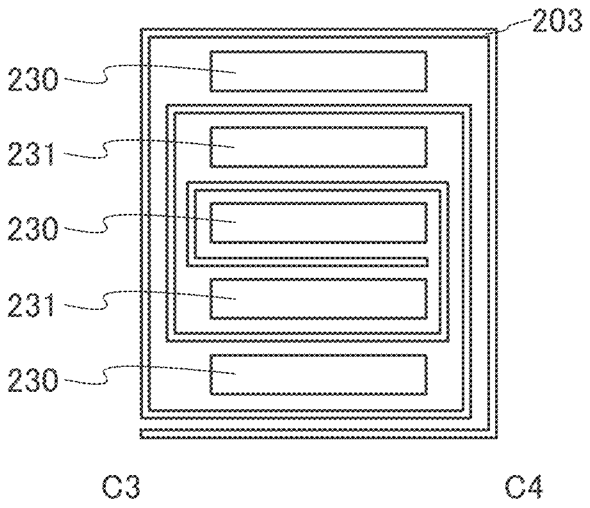
FIG. 21 illustrates an example of a power storage device.

FIG. 21 is an example of a cross-sectional view taken along dashed-dotted line C3-C4 in FIG. 20B. Note that FIG. 21 does not illustrate all components for clarity of the drawings.

As illustrated in FIG. 21, the secondary battery 250 has a structure in which a plurality of first electrode assemblies 230 and a plurality of second electrode assemblies 231 are covered with the wound separator 203.

The exterior body 207 covers a plurality of first electrode assemblies 230, a plurality of second electrode assemblies 231, and the separator 203. The secondary battery 200 includes an electrolytic solution (not shown) in a region covered with the exterior body 207. Three sides of the exterior body 207 are bonded, whereby the secondary battery 200 is sealed.

An example of a method for fabricating the secondary battery 250 is illustrated in FIGS. 22A to 22D.

Figure 22A:
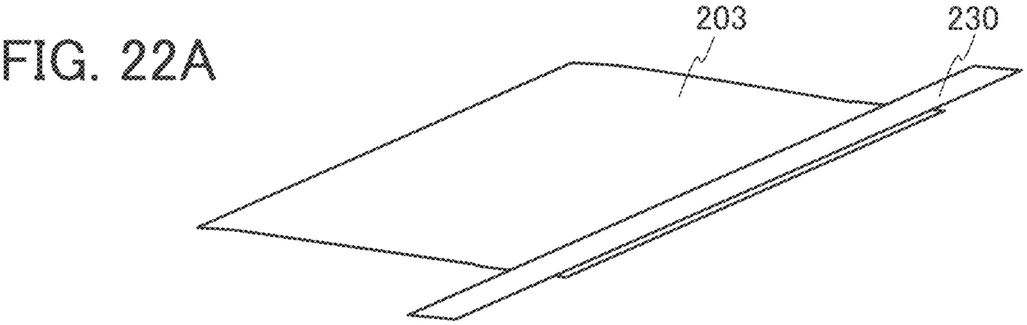
FIGS. 22A to 22D illustrate an example of a method for fabricating a power storage device.

First, the first electrode assembly 230 is positioned over the separator 203 (FIG. 22A).

Figure 22B:
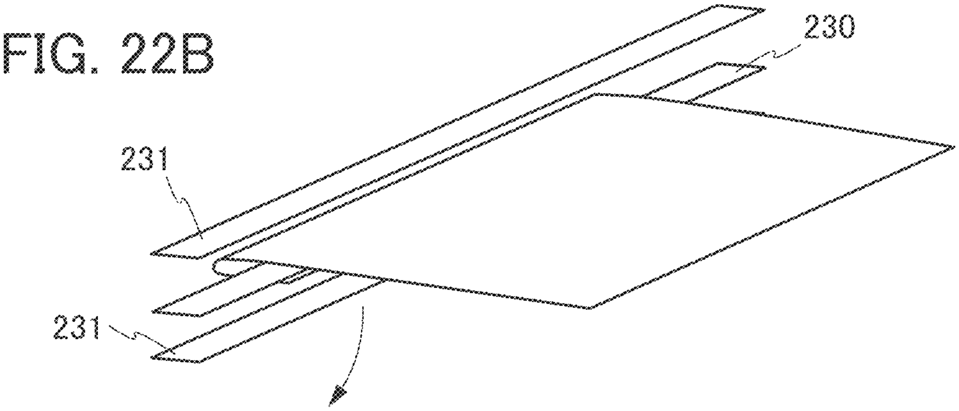

Then, the separator 203 is folded to overlap with the first electrode assembly 230. After that, two second electrode assemblies 231 are positioned over and under the first electrode assembly 230 with the separator 203 positioned between each of the second electrode assemblies 231 and the first electrode assembly 230 (FIG. 22B).

Figure 22C:
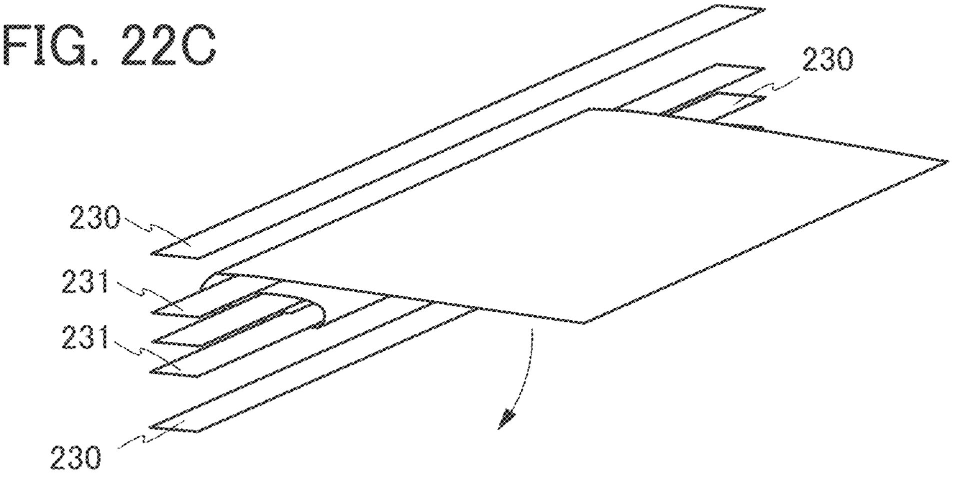

Then, the separator 203 is wound to cover the two second electrode assemblies 231. Moreover, two first electrode assemblies 230 are positioned over and under the two second electrode assemblies 231 with the separator 203 positioned between each of the first electrode assemblies 230 and each of the second electrode assemblies 231 (FIG. 22C).

Figure 22D:
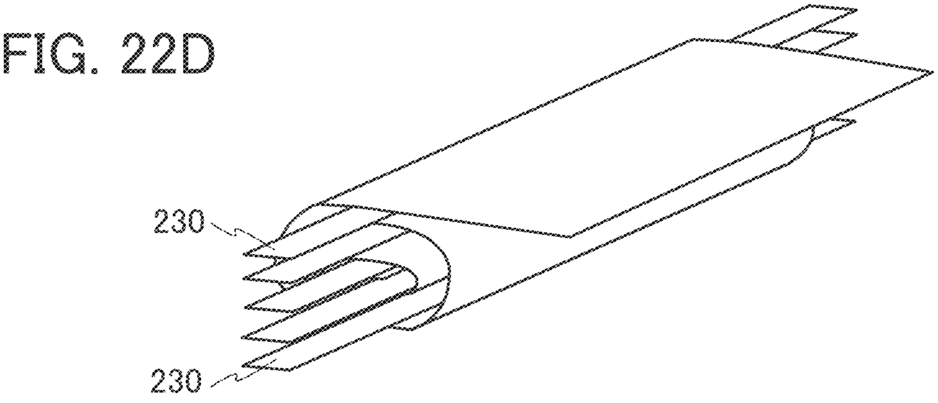

Then, the separator 203 is wound to cover the two first electrode assemblies 230 (FIG. 22D).

Since a plurality of first electrode assemblies 230 and a plurality of second electrode assemblies 231 are stacked in the above process, these electrode assemblies are each positioned surrounded with the spirally wound separator 203.

Note that the outermost electrode preferably does not include an active material layer on the outer side.

Although FIGS. 20C1 and 20C2 each illustrate a structure in which the electrode assembly includes three electrodes and two separators, one embodiment of the present invention is not limited to this structure. The electrode assembly may include four or more electrodes and three or more separators. A larger number of electrodes lead to higher capacity of the secondary battery 250. Alternatively, the electrode assembly may include two electrodes and one separator. A smaller number of electrodes enable higher resistance of the secondary battery against bending. Although FIG. 21 illustrates the structure in which the secondary battery 250 includes three first electrode assemblies 230 and two second electrode assemblies 231, one embodiment of the present invention is not limited to this structure. The number of the electrode assemblies may be increased. A larger number of electrode assemblies lead to higher capacity of the secondary battery 250. The number of the electrode assemblies may be decreased. A smaller number of electrode assemblies enable higher resistance of the secondary battery against bending.

Figure 23:
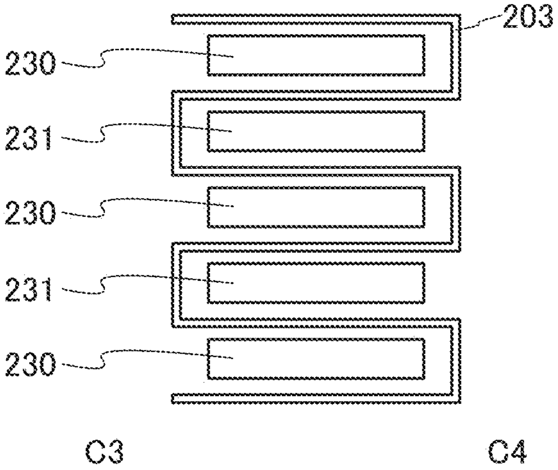
FIG. 23 illustrates an example of a power storage device.

FIG. 23 illustrates another example of a cross-sectional view taken along dashed-dotted line C3-C4 in FIG. 20B. As illustrated in FIG. 23, the separator 203 may be folded into a bellows shape so that the separator 203 is positioned between the first electrode assembly 230 and the second electrode assembly 231.

This embodiment can be combined with any other embodiment as appropriate.

Embodiment 3

In this embodiment, a light-emitting device that can be used for the electronic device of one embodiment of the present invention is described with reference to drawings. Although a light-emitting device mainly including an organic EL element is described in this embodiment as an example, one embodiment of the present invention is not limited to this example.

Structure Example 1

Figure 24A:
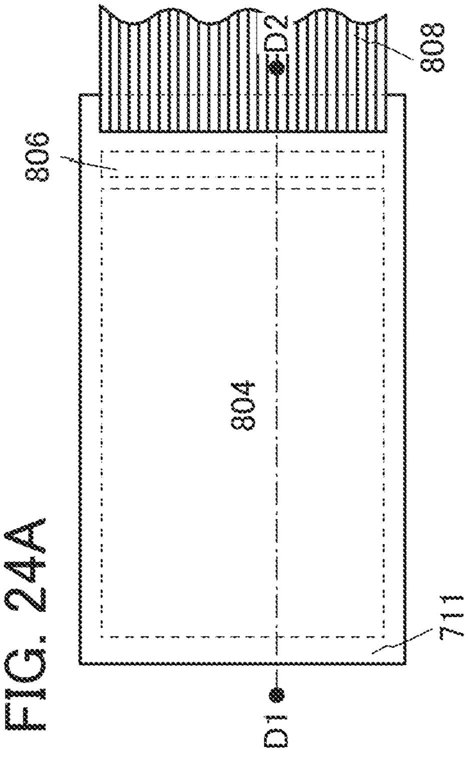
FIGS. 24A and 24B illustrate an example of a light-emitting device.
Figure 24B:
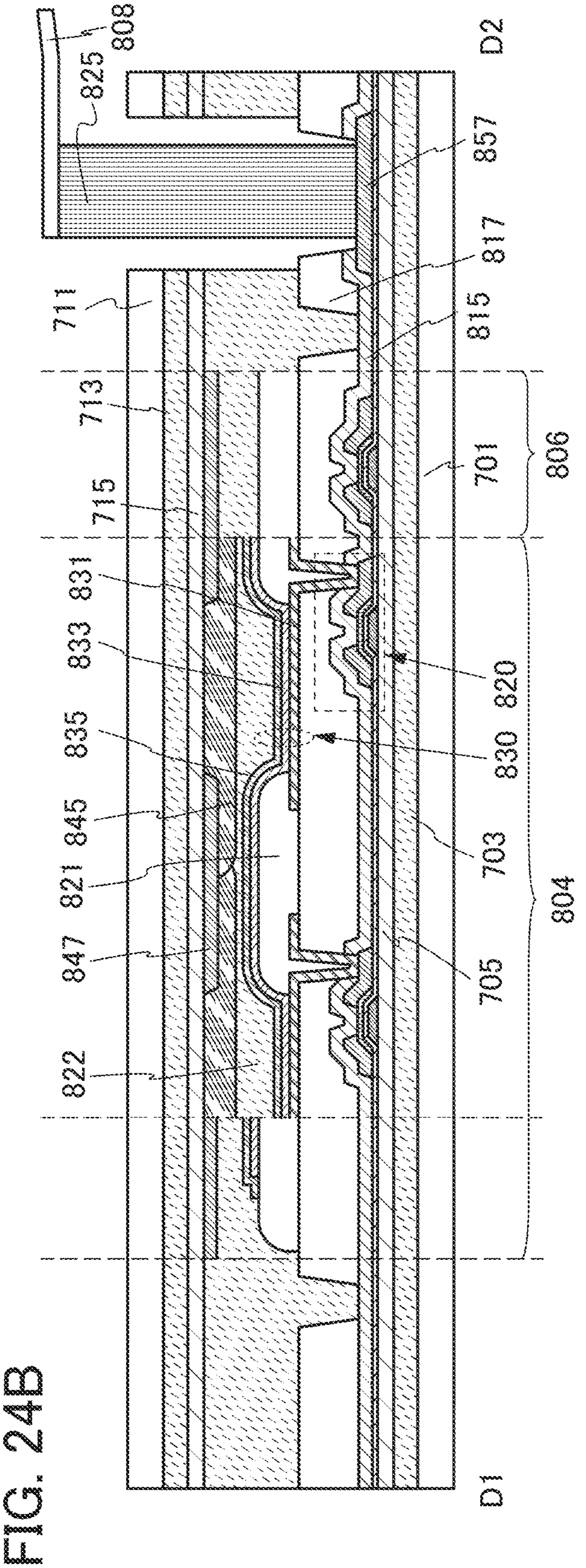

FIG. 24A is a plan view of a light-emitting device, and FIG. 24B is an example of a cross-sectional view taken along dashed-dotted line D1-D2 in FIG. 24A. The light-emitting device in Structure example 1 is a top-emission light-emitting device using a color filter method. In this embodiment, the light-emitting device can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan or magenta may be used.

The light-emitting device illustrated in FIG. 24A includes a light-emitting portion 804, a driver circuit portion 806, and an FPC 808.

The light-emitting device illustrated in FIG. 24B includes a flexible substrate 701, a bonding layer 703, an insulating layer 705, a plurality of transistors, a conductive layer 857, an insulating layer 815, an insulating layer 817, a plurality of light-emitting elements, an insulating layer 821, a bonding layer 822, a coloring layer 845, a light-blocking layer 847, an insulating layer 715, a bonding layer 713, and a flexible substrate 711. The bonding layer 822, the insulating layer 715, the bonding layer 713, and the flexible substrate 711 transmit visible light. Light-emitting elements and transistors in the light-emitting portion 804 and the driver circuit portion 806 are sealed with the flexible substrate 701, the flexible substrate 711, and the bonding layer 822.

In the light-emitting portion 804, a transistor 820 and a light-emitting element 830 are provided over the flexible substrate 701 with the bonding layer 703 and the insulating layer 705 placed therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

In the light-emitting portion 804, the coloring layer 845 overlapping with the light-emitting element 830 and the light-blocking layer 847 overlapping with the insulating layer 821 are provided. The space between the light-emitting element 830 and the coloring layer 845 is filled with the bonding layer 822.

The insulating layer 815 has an effect of suppressing diffusion of impurities into a semiconductor included in the transistor. As the insulating layer 817, an insulating layer having a planarization function is preferably selected in order to reduce surface unevenness due to the transistor. In the case where an organic material is used for the insulating layer 817, an impurity such as moisture might enter from the outside of the light-emitting device to the transistor, the light-emitting element 830, or the like through the insulating layer 817 which is exposed at an end portion of the light-emitting device. The deterioration of the transistor or the light-emitting element 830 due to the entry of an impurity leads to the deterioration of the light-emitting device. Thus, as illustrated in FIG. 24B and the like, it is preferable that an opening which reaches an inorganic film (here, the insulating layer 815) be formed in the insulating layer 817 so that an impurity such as moisture entering from the outside of the light-emitting device does not easily reach the transistor or the light-emitting element 830. Note that the insulating layer 817 is not necessarily formed at the end portion of the light-emitting device.

In the driver circuit portion 806, a plurality of transistors are provided over the flexible substrate 701 with the bonding layer 703 and the insulating layer 705 positioned therebetween. FIG. 24B illustrates one of the transistors included in the driver circuit portion 806.

The insulating layer 705 and the flexible substrate 701 are attached to each other with the bonding layer 703. The insulating layer 715 and the flexible substrate 711 are attached to each other with the bonding layer 713. At least one of the insulating layer 705 and the insulating layer 715 is preferably highly resistant to moisture, in which case impurities such as water can be prevented from entering the light-emitting element 830 or the transistor 820, leading to higher reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described. To prevent an increase in the number of fabrication steps, the conductive layer 857 is preferably formed using the same material and the same step as the electrode or the wiring in the light-emitting portion or the driver circuit portion. Here, an example is described in which the conductive layer 857 is formed using the same material and the same step as the electrodes of the transistor 820.

In the light-emitting device in FIG. 24B, the FPC 808 is positioned over the flexible substrate 711. A connector 825 is connected to the conductive layer 857 through an opening provided in the flexible substrate 711, the bonding layer 713, the insulating layer 715, the bonding layer 822, the insulating layer 817, and the insulating layer 815. Furthermore, the connector 825 is connected to the FPC 808. That is, the FPC 808 and the conductive layer 857 are electrically connected to each other through the connector 825. When the conductive layer 857 and the flexible substrate 711 overlap with each other, an opening formed in the flexible substrate 711 (or the use of a substrate with an opening) allows the conductive layer 857, the connector 825, and the FPC 808 to be electrically connected to each other.

Figure 25A:
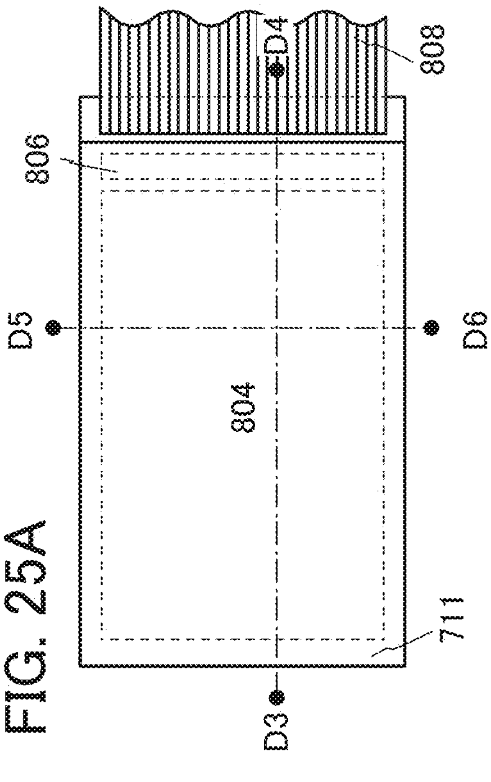
FIGS. 25A and 25B illustrate an example of a light-emitting device.
Figure 25B:
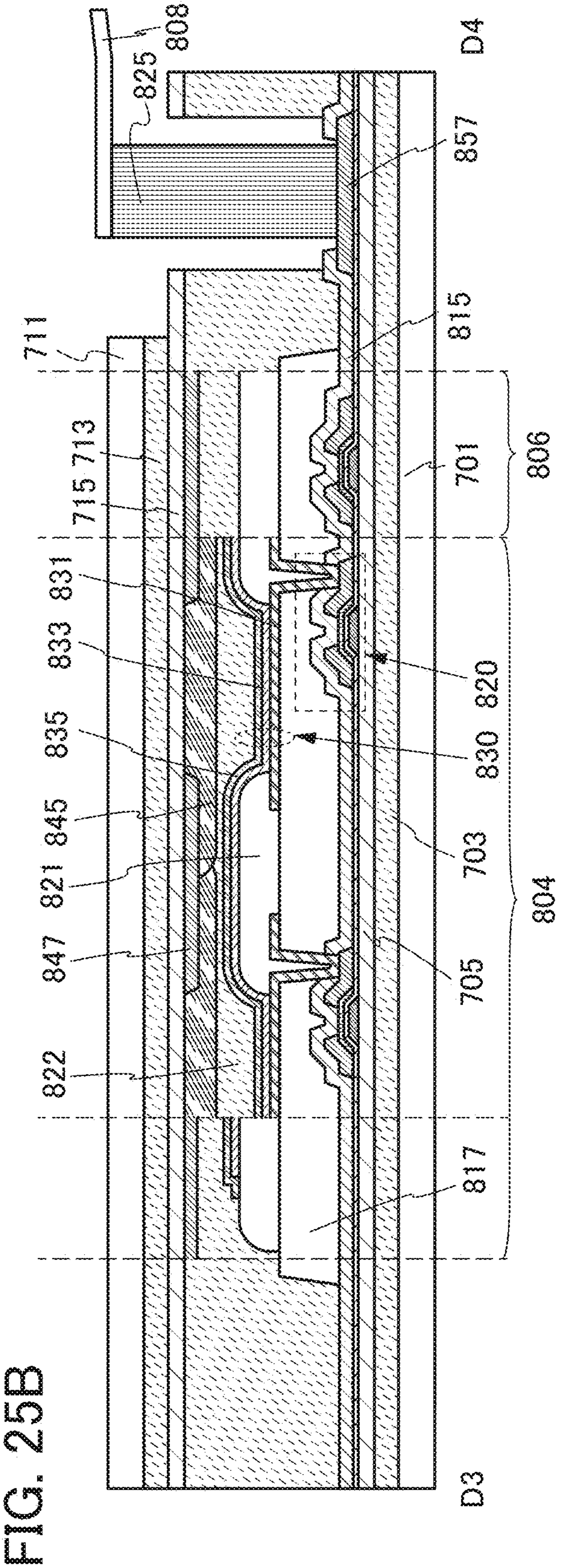
Figure 26A:
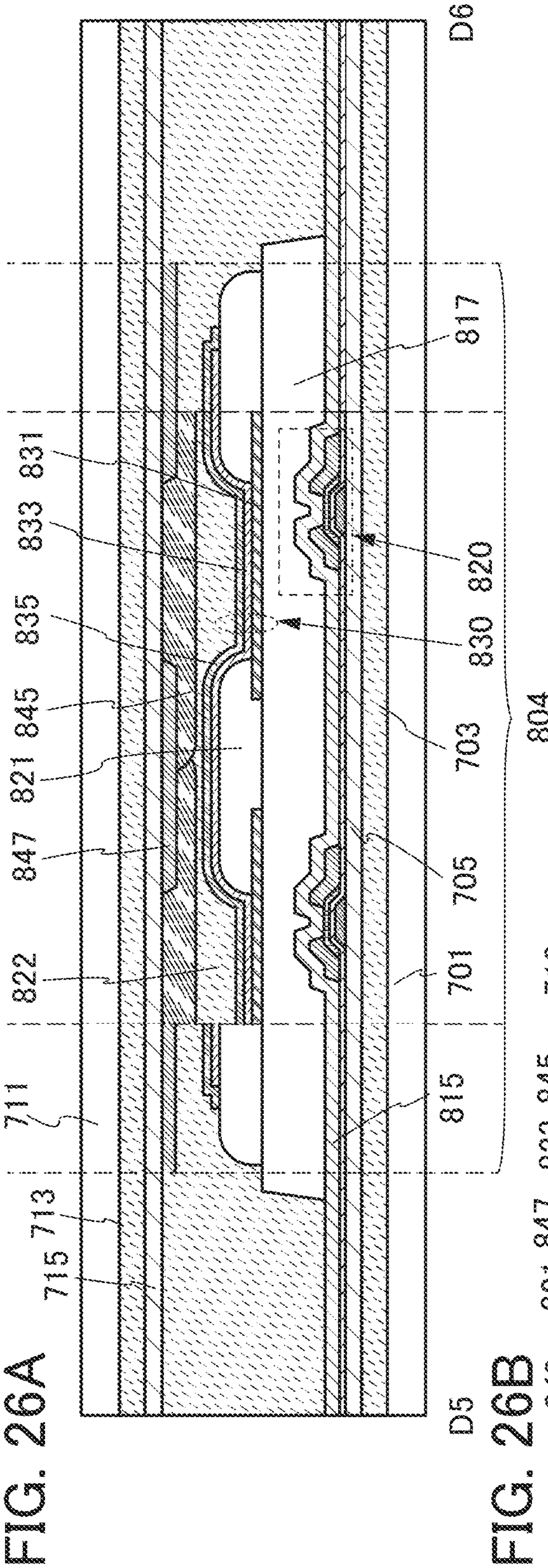
FIGS. 26A to 26D illustrate examples of a light-emitting device.

A modification example of the light-emitting device illustrated in FIGS. 24A and 24B will be described. FIG. 25A is a plan view of a light-emitting device, and FIG. 25B is an example of a cross-sectional view taken along dashed-dotted line D3-D4 in FIG. 25A. FIG. 26A is an example of a cross-sectional view taken along dashed-dotted line D5-D6 in FIG. 25A.

The light-emitting device illustrated in FIGS. 25A and 25B shows an example in which the flexible substrate 701 and the flexible substrate 711 have different sizes. The FPC 808 is positioned over the insulating layer 715 and does not overlap with the flexible substrate 711. The connector 825 is connected to the conductive layer 857 through an opening provided in the insulating layer 715, the bonding layer 822, the insulating layer 817, and the insulating layer 815. There is no limitation on the material for the flexible substrate 711 because an opening does not need to be provided in the flexible substrate 711.

It is preferred that the insulating layer formed using an organic resin having a poor gas barrier property or a poor moisture-resistant property not be exposed in an end portion of the light-emitting device. With such a structure, entry of impurities from the side surface of the light-emitting device can be prevented. For example, as illustrated in FIG. 25B and FIG. 26A, the structure in which the insulating layer 817 is not provided in the end portion of the light-emitting device may be employed.

Figure 26B:
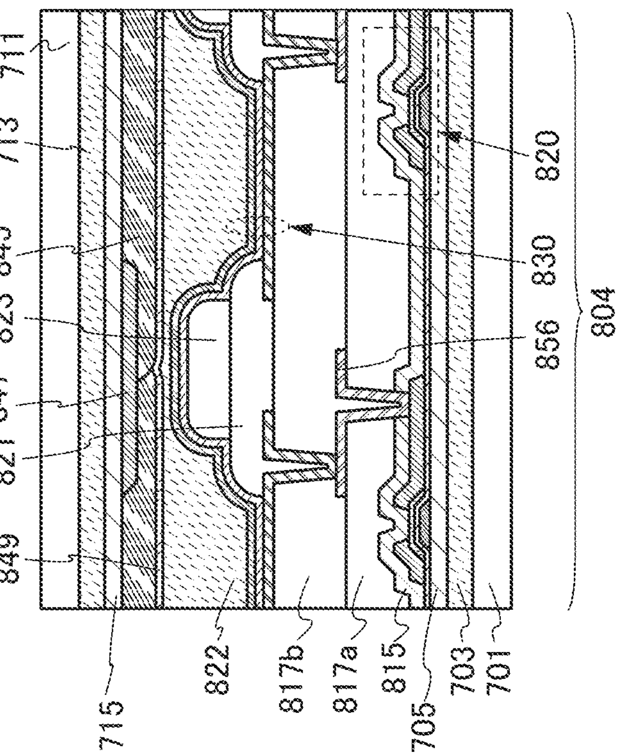

FIG. 26B shows a modification example of the light-emitting portion 804.

The light-emitting device illustrated in FIG. 26B includes insulating layers 817*a* and 817*b* and a conductive layer 856 over the insulating layer 817*a*. The source electrode or the drain electrode of the transistor 820 and the lower electrode of the light-emitting element 830 are electrically connected to each other through the conductive layer 856.

The light-emitting device illustrated in FIG. 26B includes a spacer 823 over the insulating layer 821. The spacer 823 can adjust the distance between the flexible substrate 701 and the flexible substrate 711.

The light-emitting device in FIG. 26B includes an overcoat 849 covering the coloring layer 845 and the light-blocking layer 847. The space between the light-emitting element 830 and the overcoat 849 is filled with the bonding layer 822.

Figure 26C:
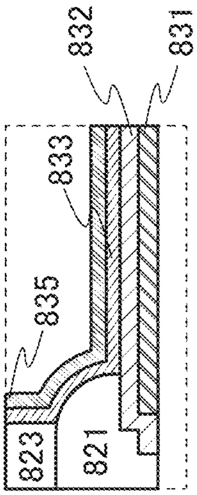

FIG. 26C shows a modification example of the light-emitting element 830.

Note that as illustrated in FIG. 26C, the light-emitting element 830 may include an optical adjustment layer 832 between the lower electrode 831 and the EL layer 833. A light-transmitting conductive material is preferably used for the optical adjustment layer 832. Owing to the combination of a color filter (the coloring layer) and a microcavity structure (the optical adjustment layer), light with high color purity can be extracted from the light-emitting device of one embodiment of the present invention. The thickness of the optical adjustment layer is varied depending on the emission color of the subpixel.

Structure Example 2

Figure 26D:
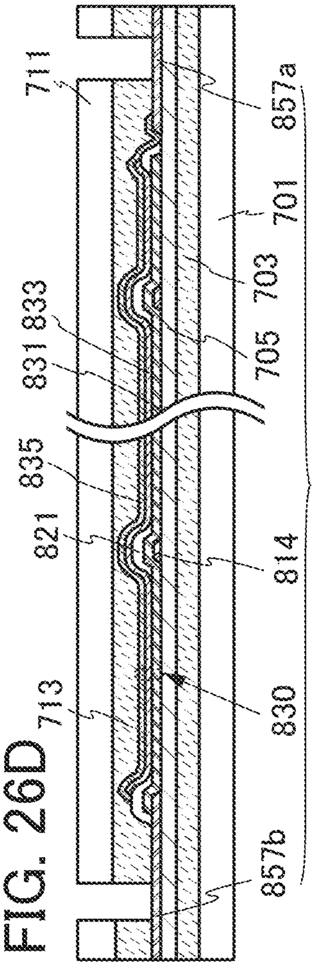

A light-emitting device illustrated in FIG. 26D includes the flexible substrate 701, the bonding layer 703, the insulating layer 705, a conductive layer 814, a conductive layer 857*a*, a conductive layer 857*b*, the light-emitting element 830, the insulating layer 821, the bonding layer 713, and the flexible substrate 711.

The conductive layer 857*a* and the conductive layer 857*b* serve as external connection electrodes of the light-emitting device and can each be electrically connected to an FPC or the like.

The light-emitting element 830 includes the lower electrode 831, the EL layer 833, and the upper electrode 835. An end portion of the lower electrode 831 is covered with the insulating layer 821. The light-emitting element 830 has a bottom-emission structure, a top-emission structure, or a dual-emission structure. The electrode, substrate, insulating layer, and the like through which light is extracted transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, the substrate with the light extraction structure can be formed by bonding the above lens or film to a resin substrate with an adhesive or the like having substantially the same refractive index as the substrate, the lens, or the film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be a single layer or a stacked layer formed using a material selected from copper, titanium, tantalum, tungsten, molybdenum, chromium, neodymium, scandium, nickel, and aluminum, an alloy material containing any of these materials as its main component, and the like. The thickness of the conductive layer 814 can be, for example, greater than or equal to 0.1 μm and less than or equal to 3 μm, preferably greater than or equal to 0.1 μm and less than or equal to 0.5 μm.

Structure Example 3

Figure 27A:
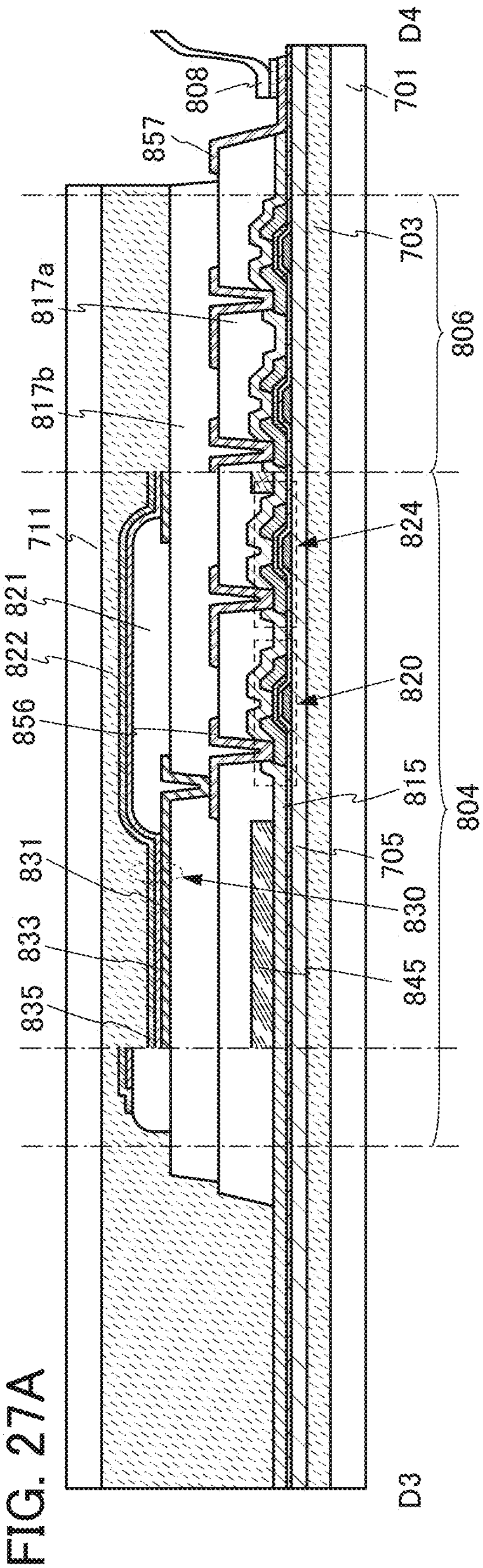
FIGS. 27A and 27B illustrate an example of a light-emitting device.

FIG. 25A is a plan view of a light-emitting device. FIG. 27A is an example of a cross-sectional view taken along dashed-dotted line D3-D4 in FIG. 25A. The light-emitting device in Structure example 3 is a bottom-emission light-emitting device using a color filter method.

The light-emitting device illustrated in FIG. 27A includes the flexible substrate 701, the bonding layer 703, the insulating layer 705, a plurality of transistors, the conductive layer 857, the insulating layer 815, the coloring layer 845, the insulating layer 817*a*, the insulating layer 817*b*, the conductive layer 856, a plurality of light-emitting elements, the insulating layer 821, the bonding layer 713, and the flexible substrate 711. The flexible substrate 701, the bonding layer 703, the insulating layer 705, the insulating layer 815, the insulating layer 817*a*, and the insulating layer 817*b* transmit visible light.

In the light-emitting portion 804, the transistor 820, a transistor 824, and the light-emitting element 830 are provided over the flexible substrate 701 with the bonding layer 703 and the insulating layer 705 positioned therebetween. The light-emitting element 830 includes the lower electrode 831 over the insulating layer 817*b*, the EL layer 833 over the lower electrode 831, and the upper electrode 835 over the EL layer 833. The lower electrode 831 is electrically connected to the source electrode or the drain electrode of the transistor 820. An end portion of the lower electrode 831 is covered with the insulating layer 821. The upper electrode 835 preferably reflects visible light. The lower electrode 831 transmits visible light. There is no particular limitation on the position of the coloring layer 845 overlapping with the light-emitting element 830; for example, the coloring layer 845 can be provided between the insulating layer 817*a* and the insulating layer 817*b* or between the insulating layer 815 and the insulating layer 817*a*.

In the driver circuit portion 806, a plurality of transistors are provided over the flexible substrate 701 with the bonding layer 703 and the insulating layer 705 positioned therebetween. FIG. 27A illustrates two of the transistors in the driver circuit portion 806.

The insulating layer 705 and the flexible substrate 701 are attached to each other with the bonding layer 703. The insulating layer 705 is preferably highly resistant to moisture, in which case impurities such as water can be prevented from entering the light-emitting element 830, the transistor 820, or the transistor 824, leading to higher reliability of the light-emitting device.

The conductive layer 857 is electrically connected to an external input terminal through which a signal or a potential from the outside is transmitted to the driver circuit portion 806. In this example, the FPC 808 is provided as the external input terminal, and the conductive layer 857 is formed using the same material and the same step as the conductive layer 856.

Structure Example 4

Figure 27B:
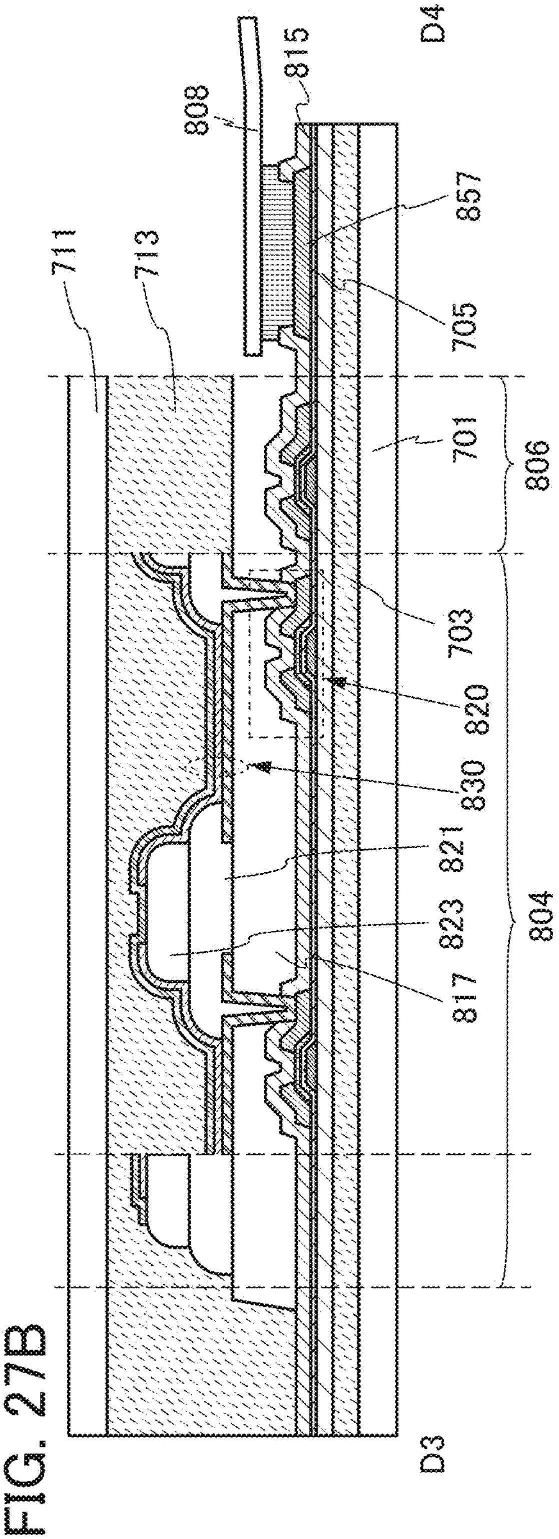

FIG. 25A is a plan view of a light-emitting device. FIG. 27B is an example of a cross-sectional view taken along dashed-dotted line D3-D4 in FIG. 25A. The light-emitting device in Structure example 4 is a top-emission light-emitting device using a separate coloring method.

The light-emitting device in FIG. 27B includes the flexible substrate 701, the bonding layer 703, the insulating layer 705, a plurality of transistors, the conductive layer 857, the insulating layer 815, the insulating layer 817, a plurality of light-emitting elements, the insulating layer 821, the spacer 823, the bonding layer 713, and the flexible substrate 711. The bonding layer 713 and the flexible substrate 711 transmit visible light.

In the light-emitting device illustrated in FIG. 27B, the connector 825 is positioned over the insulating layer 815. The connector 825 is connected to the conductive layer 857 through an opening provided in the insulating layer 815. The connector 825 is also connected to the FPC 808. That is, the FPC 808 and the conductive layer 857 are electrically connected to each other through the connector 825.

<Examples of Materials>

Next, materials that can be used for the light-emitting device will be described. Note that description of the components already described in this specification is omitted in some cases.

For the substrates, glass, quartz, an organic resin, a metal, an alloy, a semiconductor, or the like can be used. The substrate through which light from the light-emitting element is extracted is formed using a material that transmits the light.

It is particularly preferable to use a flexible substrate. For example, it is possible to use glass, a metal, or an alloy that is thin enough to have flexibility, or an organic resin. For example, the thickness of the flexible substrate is preferably greater than or equal to 1 μm and less than or equal to 200 μm, further preferably greater than or equal to 1 μm and less than or equal to 100 μm, still further preferably greater than or equal to 10 μm and less than or equal to 50 μm, and particularly preferably greater than or equal to 10 μm and less than or equal to 25 μm.

An organic resin, which has a smaller specific gravity than glass, is preferably used for the flexible substrate, in which case the light-emitting device can be lighter in weight than that using glass.

A material with high toughness is preferably used for the substrates. In that case, a light-emitting device with high impact resistance that is less likely to be broken can be provided. For example, when an organic resin substrate or a metal or alloy substrate with a small thickness is used, the light-emitting device can be lightweight and less likely to be broken as compared with the case where a glass substrate is used.

A metal material and an alloy material, which have high thermal conductivity, are preferred because they can easily conduct heat to the whole substrate and accordingly can prevent a local temperature rise in the light-emitting device. The thickness of a substrate using a metal material or an alloy material is preferably greater than or equal to 10 μm and less than or equal to 200 μm, further preferably greater than or equal to 20 μm and less than or equal to 50 μm.

Although there is no particular limitation on a material for the metal substrate or the alloy substrate, it is preferable to use, for example, aluminum, copper, nickel, or a metal alloy such as an aluminum alloy or stainless steel. Examples of a material for a semiconductor substrate include silicon and the like.

Furthermore, when a material with high thermal emissivity is used for the substrate, the surface temperature of the light-emitting device can be prevented from rising, leading to prevention of breakage or a decrease in reliability of the light-emitting device. For example, the substrate may have a stacked-layer structure of a metal substrate and a layer with high thermal emissivity (e.g., a layer formed using a metal oxide or a ceramic material).

Examples of a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon or aramid), a cycloolefin resin, a polystyrene resin, a polyamide imide resin, a polyvinyl chloride resin, and a polytetrafluoroethylene (PTFE) resin. In particular, a material with a low coefficient of linear expansion is preferred, and for example, a polyamide imide resin, a polyimide resin, a polyamide resin, or PET can be suitably used. It is also possible to use a substrate in which a fibrous body is impregnated with a resin (also referred to as prepreg) or a substrate whose coefficient of linear expansion is reduced by mixing an organic resin with an inorganic filler.

The flexible substrate may have a stacked-layer structure of a layer of any of the above-mentioned materials and a hard coat layer by which a surface of the device is protected from damage (e.g., a silicon nitride layer), a layer that can disperse pressure (e.g., an aramid resin layer), or the like.

The flexible substrate may be formed by stacking a plurality of layers. When a glass layer is used, a barrier property against water or oxygen can be improved and thus a reliable light-emitting device can be provided.

For example, it is possible to use a flexible substrate in which a glass layer, a bonding layer, and an organic resin layer are stacked from the side closer to a light-emitting element. The thickness of the glass layer is greater than or equal to 20 μm and less than or equal to 200 μm, preferably greater than or equal to 25 μm and less than or equal to 100 μm. With such a thickness, the glass layer can have both high flexibility and a high barrier property against water or oxygen. The thickness of the organic resin layer is greater than or equal to 10 μm and less than or equal to 200 μm, preferably greater than or equal to 20 μm and less than or equal to 50 μm. Providing such an organic resin layer, occurrence of a crack or a break in the glass layer can be suppressed and mechanical strength can be improved. With the substrate using such a composite material of a glass material and an organic resin, a flexible light-emitting device with high reliability can be provided.

For the bonding layer, various curable adhesives such as a photo curable adhesive (e.g., an ultraviolet curable adhesive), a reactive curable adhesive, a thermosetting adhesive, and an anaerobic adhesive can be used. Alternatively, an adhesive sheet or the like may be used.

Further, the bonding layer may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because it can prevent impurities such as moisture from entering the functional element, thereby improving the reliability of the light-emitting device.

When a filler with a high refractive index or a light scattering member is contained in the bonding layer, the efficiency of light extraction from the light-emitting element can be improved. For example, titanium oxide, barium oxide, zeolite, or zirconium can be used.

Insulating films highly resistant to moisture are preferably used as the insulating layer 705 and the insulating layer 715. Alternatively, the insulating layer 705 and the insulating layer 715 each preferably have a function of preventing diffusion of impurities to the light-emitting element.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the light-emitting device, it is necessary that at least one of the insulating layer 705 and the insulating layer 715 transmit light emitted from the light-emitting element. One of the insulating layer 705 and the insulating layer 715, which transmits light emitted from the light-emitting element, preferably has higher average transmittance of light having a wavelength greater than or equal to 400 nm and less than or equal to 800 nm than the other.

There is no particular limitation on the structure of the transistors in the light-emitting device. For example, a forward staggered transistor or an inverted staggered transistor may be used. A top-gate transistor or a bottom-gate transistor may be used. There is no particular limitation on a semiconductor material used for the transistors, and silicon, germanium, or an organic semiconductor can be used, for example. Alternatively, an oxide semiconductor containing at least one of indium, gallium, and zinc (e.g., In—Ga—Zn-based metal oxide) may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

In one embodiment of the present invention, a c-axis aligned crystalline oxide semiconductor (CAAC-OS) is preferably used as a semiconductor material for the transistors. Unlike amorphous semiconductor, the CAAC-OS has few defect states, so that the reliability of the transistor can be improved. Moreover, since the CAAC-OS does not have a grain boundary, a stable and uniform film can be formed over a large area, and stress that is caused by bending a flexible light-emitting device does not easily make a crack in a CAAC-OS film.

A CAAC-OS is a crystalline oxide semiconductor having c-axis alignment of crystals in a direction substantially perpendicular to the film surface. It has been found that oxide semiconductors have a variety of crystal structures other than a single crystal structure. An example of such structures is a nano-crystal (nc) structure, which is an aggregate of nanoscale microcrystals. The crystallinity of a CAAC-OS structure is lower than that of a single crystal structure and higher than that of an nc structure.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In each of the above structure examples, the insulating layer 705 can serve as a base film of the transistor.

As the light-emitting element, a self-luminous element can be used, and an element whose luminance is controlled by current or voltage is included in the category of the light-emitting element. For example, a light-emitting diode (LED), an organic EL element, or an inorganic EL element can be used.

The light-emitting element can have any of a top-emission structure, a bottom-emission structure, and a dual-emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide (ZnO), or zinc oxide to which gallium is added. It is also possible to use a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) when the film is thin enough to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material or the alloy. Moreover, the conductive film can be formed using an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium. An alloy of silver and copper is preferable because of its high heat resistance. When a metal film or a metal oxide film is stacked on an aluminum alloy film, oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, it is possible to use a stacked film of silver and ITO or a stacked film of an alloy of silver and magnesium and ITO.

Each of the electrodes can be formed by an evaporation method or a sputtering method. Alternatively, a discharging method such as an ink-jet method, a printing method such as a screen printing method, or a plating method can be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

For the EL layer 833, either a low molecular compound or a high molecular compound can be used, and an inorganic compound may be used. Each of the layers included in the EL layer 833 can be formed by any of the following methods: an evaporation method (including a vacuum evaporation method), a transfer method, a printing method, an ink-jet method, a coating method, and the like.

The light-emitting element 830 may contain two or more kinds of light-emitting substances. Thus, for example, a light-emitting element that emits white light can be achieved. For example, light-emitting substances are selected so that two or more kinds of light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material in an excited state which is generated in the phosphorescent layer to a fluorescent material in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in the light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region not containing the phosphorescent material and the phosphorescent layer includes a region containing the phosphorescent material in the above structure. Thus, the separation layer and the phosphorescent layer can be separately deposited depending on the presence of the phosphorescent material. With such a structure, the separation layer and the phosphorescent layer can be formed in the same chamber. Thus, the manufacturing cost can be reduced.

Moreover, the light-emitting element 830 may be a single element including one EL layer or a tandem element in which EL layers are stacked with a charge generation layer provided therebetween.

The light-emitting element is preferably provided between a pair of insulating films that are highly resistant to moisture, in which case impurities such as water can be prevented from entering the light-emitting element, thereby preventing a decrease in the reliability of the light-emitting device. Specifically, the use of an insulating film highly resistant to moisture for the insulating layer 705 and the insulating layer 715 allows the light-emitting element to be located between a pair of insulating films highly resistant to moisture, by which a decrease in the reliability of the light-emitting device can be prevented.

As the insulating layer 815, an inorganic insulating film such as a silicon oxide film, a silicon oxynitride film, or an aluminum oxide film can be used, for example. For the insulating layers 817, 817*a*, and 817*b*, an organic material such as polyimide, acrylic, polyamide, polyimide amide, or a benzocyclobutene-based resin can be used, for example. Alternatively, a low dielectric constant material (low-k material) or the like can be used. Furthermore, each of the insulating layers may be formed by stacking a plurality of insulating films.

The insulating layer 821 is formed using an organic insulating material or an inorganic insulating material. As a resin, a polyimide resin, a polyamide resin, an acrylic resin, a siloxane resin, an epoxy resin, or a phenol resin can be used, for example. It is particularly preferable that the insulating layer 821 be formed using a photosensitive resin material to have an opening portion over the lower electrode 831 so that a sidewall of the opening portion is formed as an inclined surface with curvature.

There is no particular limitation on the method for forming the insulating layer 821. For example, a photolithography method, a sputtering method, an evaporation method, a droplet discharging method (e.g., an ink-jet method), or a printing method (e.g., screen printing or off-set printing) may be used.

The spacer 823 can be formed using an inorganic insulating material, an organic insulating material, a metal material, or the like. As the inorganic insulating material and the organic insulating material, a variety of materials that can be used for the aforementioned insulating layers can be used, for example. As the metal material, titanium, aluminum, or the like can be used. When the spacer 823 containing a conductive material and the upper electrode 835 are electrically connected to each other, a potential drop due to the resistance of the upper electrode 835 can be suppressed. The spacer 823 may have a tapered shape or an inverse tapered shape.

A conductive layer functioning as an electrode of the transistor, a wiring, an auxiliary wiring of the light-emitting element, or the like in the light-emitting device can be formed with a single-layer structure or a stacked-layer structure using any of metal materials such as molybdenum, titanium, chromium, tantalum, tungsten, aluminum, copper, neodymium, and scandium and an alloy material containing any of these elements, for example. The conductive layer may be formed using a conductive metal oxide such as indium oxide (e.g., $In_2O_3$), tin oxide (e.g., $SnO_2$), ZnO, ITO, indium zinc oxide (e.g., $In_2O_3$—ZnO), or any of these metal oxide materials containing silicon oxide.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an ink-jet method, an etching method using a photolithography method, or the like. In a white subpixel, a resin such as a transparent resin or a white resin may be provided so as to overlap with the light-emitting element.

The light-blocking layer is provided between adjacent coloring layers. The light-blocking layer blocks light emitted from an adjacent light-emitting element to prevent color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using a metal material or a resin material containing pigment or dye. Note that it is preferable to provide the light-blocking layer in a region other than the light-emitting portion, such as a driver circuit portion, in which case undesired leakage of guided light or the like can be suppressed.

An overcoat covering the coloring layer and the light-blocking layer may be provided. The overcoat can prevent impurities and the like contained in the coloring layer from being diffused into the light-emitting element. The overcoat is formed with a material that transmits light emitted from the light-emitting element; for example, it is possible to use an inorganic insulating film such as a silicon nitride film or a silicon oxide film, an organic insulating film such as an acrylic film or a polyimide film, or a stacked layer of an organic insulating film and an inorganic insulating film.

In the case where upper surfaces of the coloring layer and the light-blocking layer are coated with a material of the bonding layer, a material that has high wettability with respect to the material of the bonding layer is preferably used as the material of the overcoat. For example, the overcoat is preferably an oxide conductive film such as an ITO film or a metal film such as an Ag film that is thin enough to transmit light.

When the overcoat is formed using a material that has high wettability with respect to the material for the bonding layer, the material for the bonding layer can be uniformly applied. Thus, entry of bubbles in the step of attaching the pair of substrates to each other can be prevented, and thus a display defect can be prevented.

For the connector, any of a variety of anisotropic conductive films (ACF), anisotropic conductive pastes (ACP), and the like can be used.

As described above, one embodiment of the present invention can be used in a light-emitting device, a display device, an input/output device, or the like. Examples of the display element include an EL element (an EL element containing organic and inorganic materials, an organic EL element, or an inorganic EL element), an LED (a white LED, a red LED, a green LED, a blue LED, or the like), a liquid crystal element, an electrophoretic element, and a display element using a micro electro mechanical systems (MEMS).

Note that the light-emitting device of one embodiment of the present invention may be used as a display device or as a lighting device. For example, it may be used as a light source such as a backlight or a front light, that is, a lighting device for a display device.

This embodiment can be combined with any other embodiment as appropriate.

Embodiment 4

In this embodiment, an input/output device that can be used in the electronic device of one embodiment of the present invention is described with reference to drawings. Note that the above description can be referred to for the components of an input/output device which are similar to those of the light-emitting device described in Embodiment 3. Although a touch panel including a light-emitting element is described in this embodiment as an example, one embodiment of the present invention is not limited to this example.

Structure Example 1

Figure 28A:
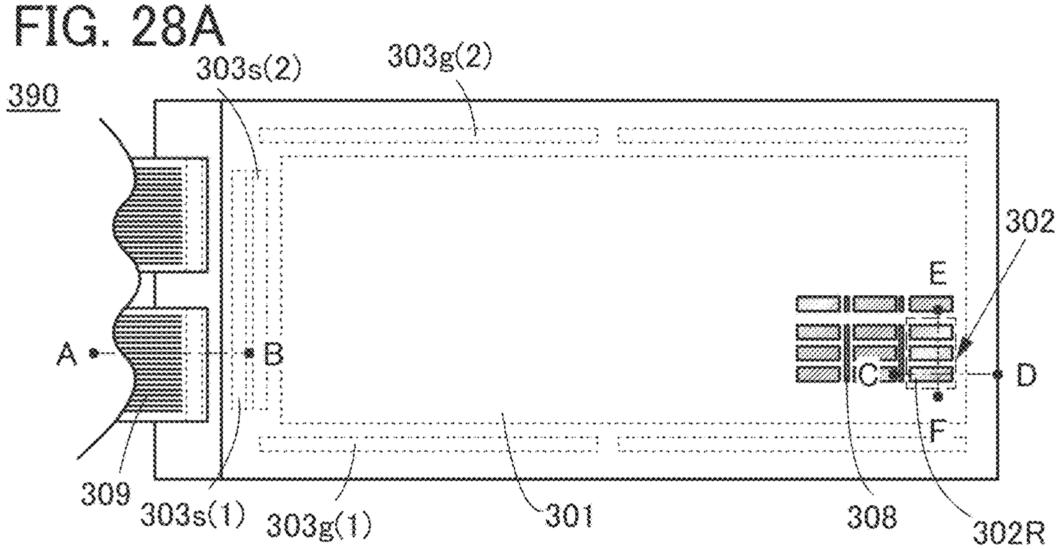
FIGS. 28A to 28C illustrate an example of an input/output device.
Figure 28B:
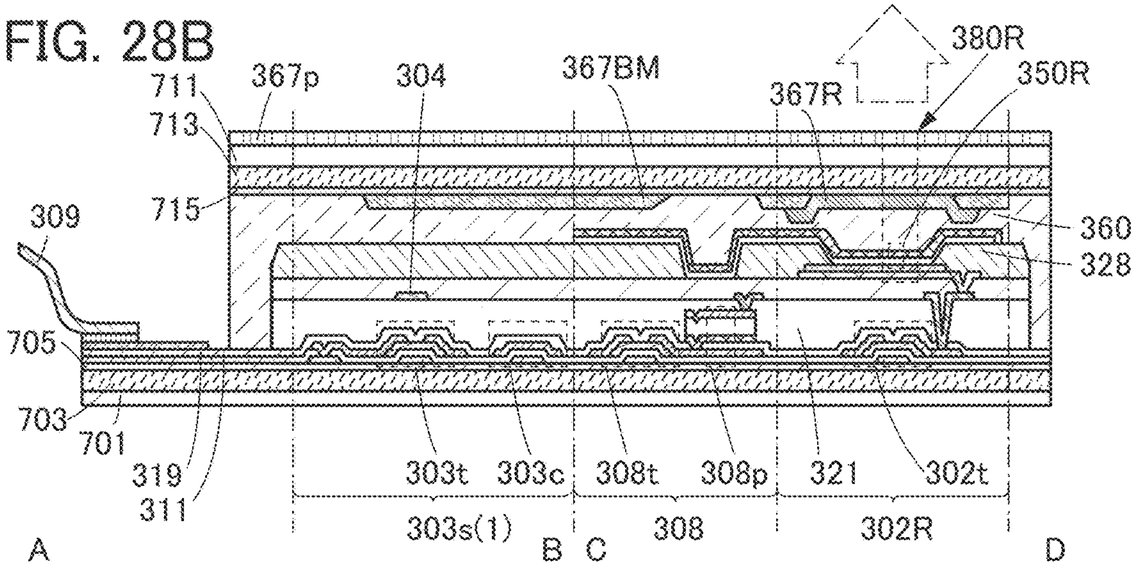
Figure 28C:
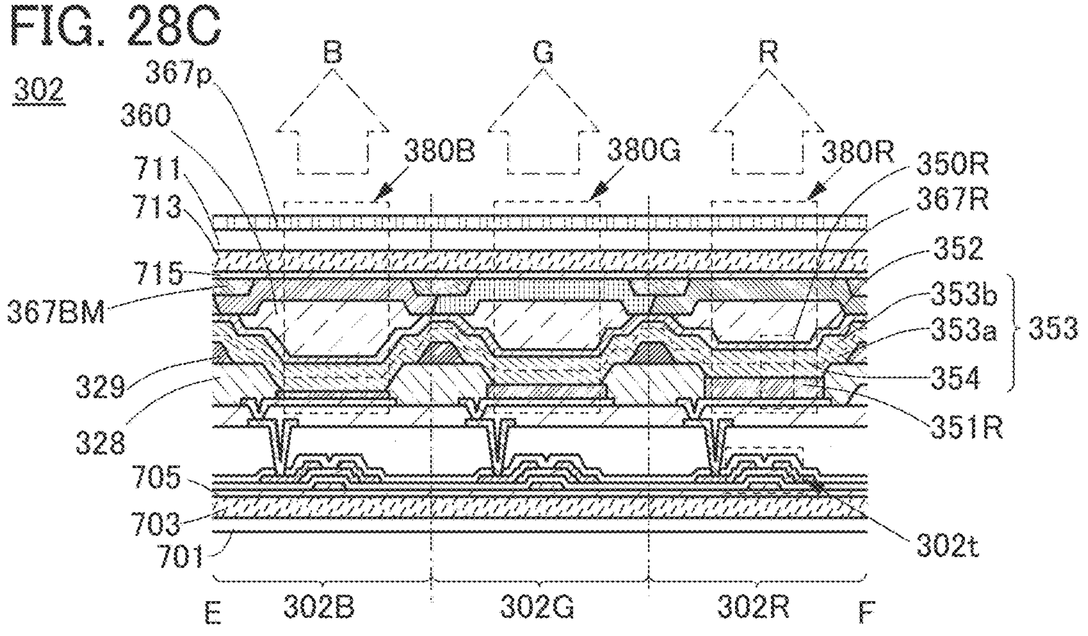

FIG. 28A is a top view of the input/output device. FIG. 28B is a cross-sectional view taken along dashed-dotted line A-B and dashed-dotted line C-D in FIG. 28A. FIG. 28C is a cross-sectional view taken along dashed-dotted line E-F in FIG. 28A.

A touch panel 390 illustrated in FIG. 28A includes a display portion 301 (serving also as an input portion), a scan line driver circuit 303*g*(1), an imaging pixel driver circuit 303*g*(2), an image signal line driver circuit 303*s*(1), and an imaging signal line driver circuit 303*s*(2).

The display portion 301 includes a plurality of pixels 302 and a plurality of imaging pixels 308.

The pixel 302 includes a plurality of subpixels. Each subpixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303*g*(1) can supply selection signals to the pixels 302.

The image signal line driver circuit 303*s*(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303*g*(2) can supply control signals to the imaging pixels 308.

The imaging signal line driver circuit 303*s*(2) can read out imaging signals.

As illustrated in FIGS. 28B and 28C, the touch panel 390 includes the flexible substrate 701, the bonding layer 703, the insulating layer 705, the flexible substrate 711, the bonding layer 713, and the insulating layer 715. The flexible substrate 701 and the flexible substrate 711 are bonded to each other with a bonding layer 360.

The flexible substrate 701 and the insulating layer 705 are attached to each other with the bonding layer 703. The flexible substrate 711 and the insulating layer 715 are attached to each other with the bonding layer 713. Embodiment 3 can be referred to for materials used for the substrates, the bonding layers, and the insulating layers.

Each of the pixels 302 includes a subpixel 302R, a subpixel 302G, and a subpixel 302B (see FIG. 28C). The sub-pixel 302R includes a light-emitting module 380R, the sub-pixel 302G includes a light-emitting module 380G, and the sub-pixel 302B includes a light-emitting module 380B.

For example, the subpixel 302R includes a light-emitting element 350R and the pixel circuit. The pixel circuit includes a transistor 302*t* that can supply electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 28C).

The EL layer 353 includes a first EL layer 353*a*, an intermediate layer 354, and a second EL layer 353*b*, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

For example, the light-emitting module 380R includes the bonding layer 360 that is in contact with the light-emitting element 350R and the coloring layer 367R. The coloring layer 367R is positioned in a region overlapping with the light-emitting element 350R. Accordingly, part of light emitted from the light-emitting element 350R passes through the bonding layer 360 and through the coloring layer 367R and is emitted to the outside of the light-emitting module 380R as denoted by arrows in FIGS. 28B and 28C.

The touch panel 390 includes a light-blocking layer 367BM. The light-blocking layer 367BM is provided so as to surround the coloring layer (e.g., the coloring layer 367R).

The touch panel 390 includes an anti-reflective layer 367*p* positioned in a region overlapping with the display portion 301. As the anti-reflective layer 367*p*, a circular polarizing plate can be used, for example.

The touch panel 390 includes an insulating layer 321. The insulating layer 321 covers the transistor 302*t* and the like. Note that the insulating layer 321 can be used as a layer for planarizing unevenness caused by the pixel circuits and the imaging pixel circuits. The transistor 302*t* is preferably covered with an insulating layer that can inhibit diffusion of impurities to the transistor 302*t* and the like.

The touch panel 390 includes a partition 328 that overlaps with an end portion of the lower electrode 351R. A spacer 329 that controls the distance between the flexible substrate 701 and the flexible substrate 711 is provided on the partition 328.

The image signal line driver circuit 303*s*(1) includes a transistor 303*t* and a capacitor 303*c*. Note that the driver circuit can be formed in the same process and over the same substrate as the pixel circuits. As illustrated in FIG. 28B, the transistor 303*t* may include a second gate 304 over the insulating layer 321. The second gate 304 may be electrically connected to a gate of the transistor 303*t*, or different potentials may be supplied to these gates. Alternatively, if necessary, the second gate 304 may be provided for the transistor 308*t*, the transistor 302*t*, or the like.

The imaging pixels 308 each include a photoelectric conversion element 308*p* and an imaging pixel circuit. The imaging pixel circuit can sense light received by the photoelectric conversion element 308*p*. The imaging pixel circuit includes the transistor 308*t*. For example, a PIN photodiode can be used as the photoelectric conversion element 308*p*.

The touch panel 390 includes a wiring 311 through which a signal is supplied. The wiring 311 is provided with a terminal 319. Note that an FPC 309 through which a signal such as an image signal or a synchronization signal is supplied is electrically connected to the terminal 319. Note that a printed wiring board (PWB) may be attached to the FPC 309.

Note that transistors such as the transistors 302*t*, 303*t*, and 308*t* can be formed in the same process. Alternatively, the transistors may be formed in different processes.

Structure Example 2

Figure 29A:
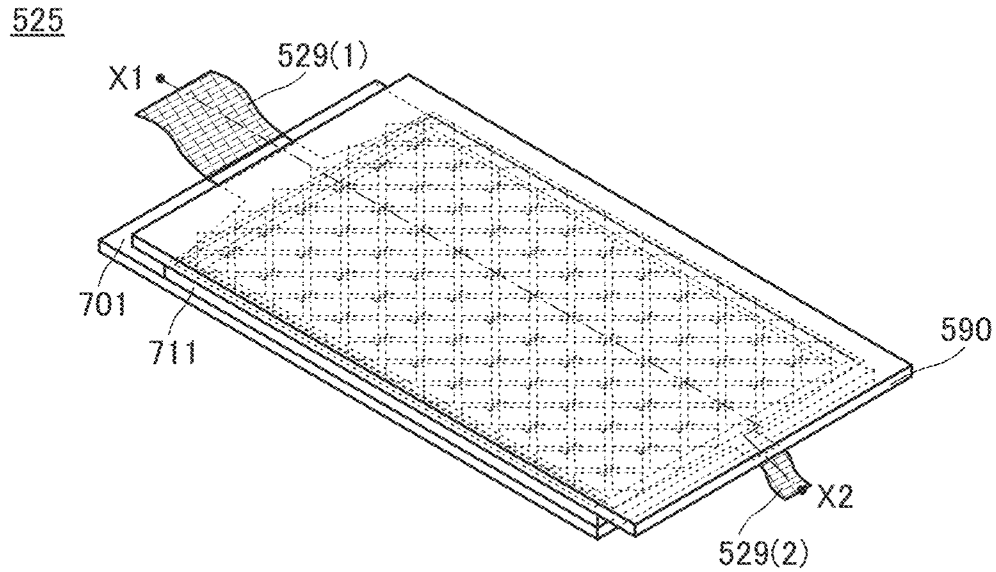
FIGS. 29A and 29B illustrate an example of an input/output device.
Figure 29B:
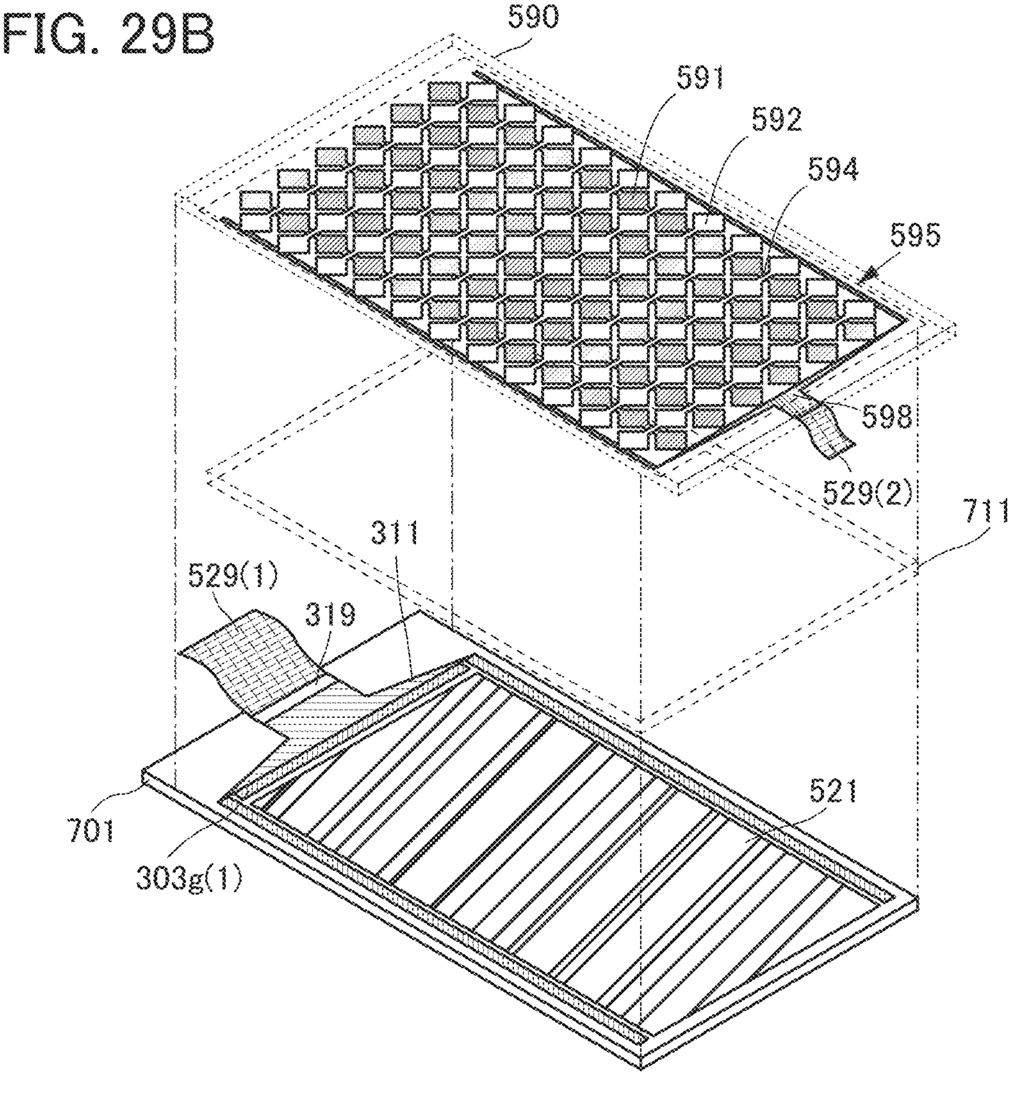
Figure 30A:
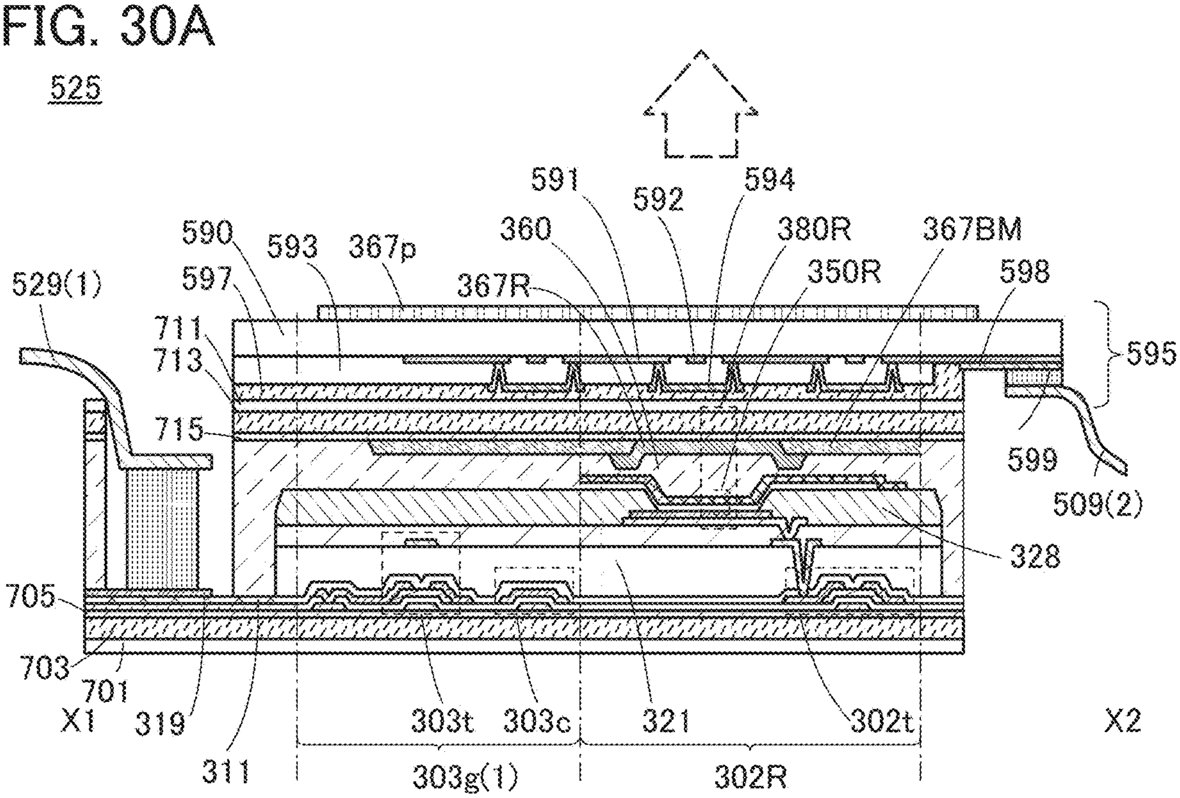
FIGS. 30A and 30B illustrate examples of an input/output device.
Figure 30B:
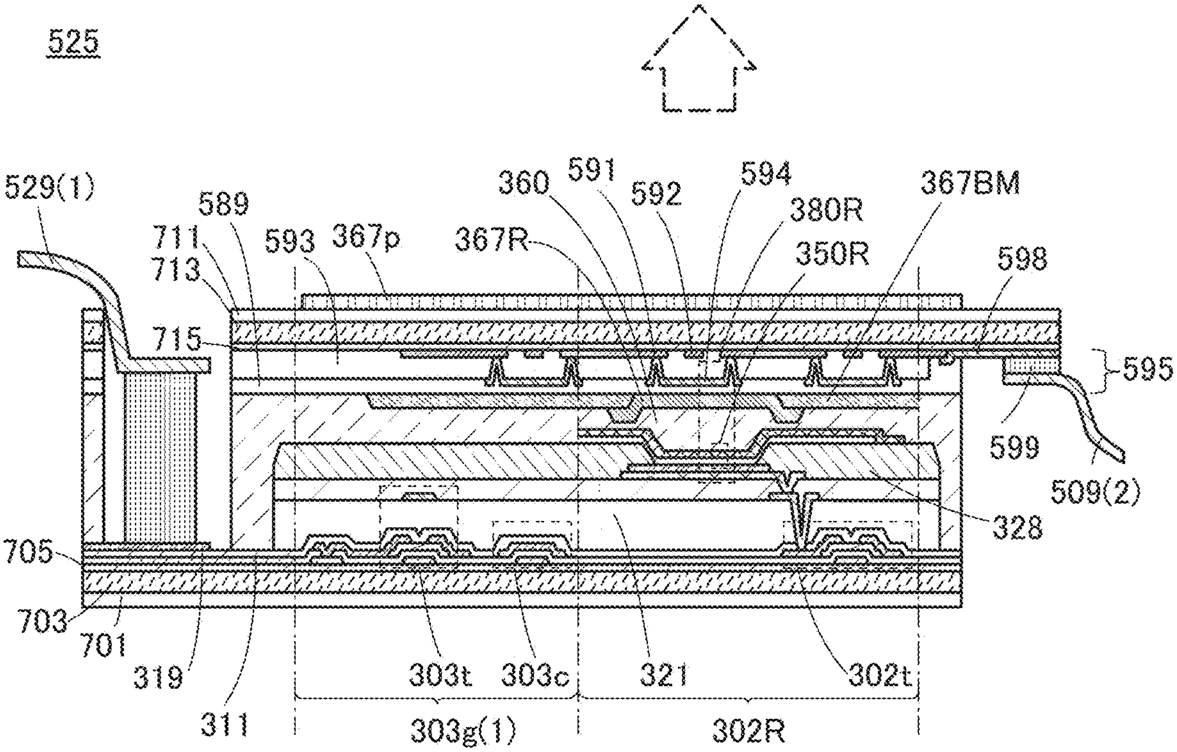

FIGS. 29A and 29B are perspective views of a touch panel 525. Note that FIGS. 29A and 29B illustrate only main components for simplicity. FIGS. 30A and 30B are each a cross-sectional view taken along dashed-dotted line X1-X2 in FIG. 29A.

As illustrated in FIGS. 29A and 29B, the touch panel 525 includes a display portion 521, the scan line driver circuit 303*g*(1), a touch sensor 595, and the like. Furthermore, the touch panel 525 includes the flexible substrate 701, the flexible substrate 711, and a flexible substrate 590.

The touch panel 525 includes a plurality of pixels and a plurality of wirings 311. The plurality of wirings 311 can supply signals to the pixels. The plurality of wirings 311 are arranged to a peripheral portion of the flexible substrate 701, and part of the plurality of wirings 311 form the terminal 319. The terminal 319 is electrically connected to an FPC 529(1).

The touch panel 525 includes the touch sensor 595 and a plurality of wirings 598. The plurality of wirings 598 are electrically connected to the touch sensor 595. The plurality of wirings 598 are arranged to a peripheral portion of the flexible substrate 590, and part of the plurality of wirings 598 form a terminal. The terminal is electrically connected to an FPC 529(2). Note that in FIG. 29B, electrodes, wirings, and the like of the touch sensor 595 provided on the back side of the flexible substrate 590 (the side facing the flexible substrate 701) are denoted by solid lines for clarity.

As the touch sensor 595, for example, a capacitive touch sensor can be used. Examples of the capacitive touch sensor are a surface capacitive touch sensor and a projected capacitive touch sensor. An example of using a projected capacitive touch sensor is described here.

Examples of a projected capacitive touch sensor are a self-capacitive touch sensor and a mutual capacitive touch sensor. The use of a mutual capacitive type is preferable because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 29A and 29B.

The electrodes 591 each have a quadrangular shape and are arranged in a direction intersecting with the direction in which the electrodes 592 extend. Note that the plurality of electrodes 591 are not necessarily arranged in the direction orthogonal to one electrode 592 and may be arranged to intersect with one electrode 592 at an angle of less than 90 degrees.

The wiring 594 intersects with the electrode 592. The wiring 594 electrically connects two electrodes 591 between which one of the electrodes 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes.

As illustrated in FIG. 30A, the touch panel 525 includes the flexible substrate 701, the bonding layer 703, the insulating layer 705, the flexible substrate 711, the bonding layer 713, and the insulating layer 715. The flexible substrate 701 and the flexible substrate 711 are attached to each other with the bonding layer 360.

A bonding layer 597 attaches the flexible substrate 590 to the flexible substrate 711 so that the touch sensor 595 overlaps with the display portion 521. The bonding layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

Note that as a material of the conductive films such as the electrodes 591, the electrodes 592, and the wiring 594, that is, wirings and electrodes forming the touch panel, a transparent conductive film including indium oxide, tin oxide, zinc oxide, or the like (e.g., ITO) can be given. A low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a number of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance value of 40 ohm/square or more and 100 ohm/square or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

The electrodes 591 and the electrodes 592 may be formed by depositing a light-transmitting conductive material on the flexible substrate 590 by a sputtering method and then removing an unnecessary portion by any of various patterning techniques such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used for the wiring 594 because the aperture ratio of the touch panel can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 529(2).

The display portion 521 includes a plurality of pixels arranged in a matrix. Each pixel has the same structure as Structure Example 1; thus, description is omitted.

As illustrated in FIG. 30B, the touch panel may include two substrates of the flexible substrate 701 and the flexible substrate 711 without including the flexible substrate 590. The flexible substrate 711 and the insulating layer 715 are attached to each other with the bonding layer 713, and the touch sensor 595 is provided in contact with the insulating layer 715. The coloring layer 367R and the light-blocking layer 367BM are provided in contact with the insulating layer 589 that covers the touch sensor 595. The insulating layer 589 is not necessarily provided, in which case the coloring layer 367R or the light-blocking layer 367BM is provided in contact with the wiring 594.

Structure Example 3

Figure 31A:
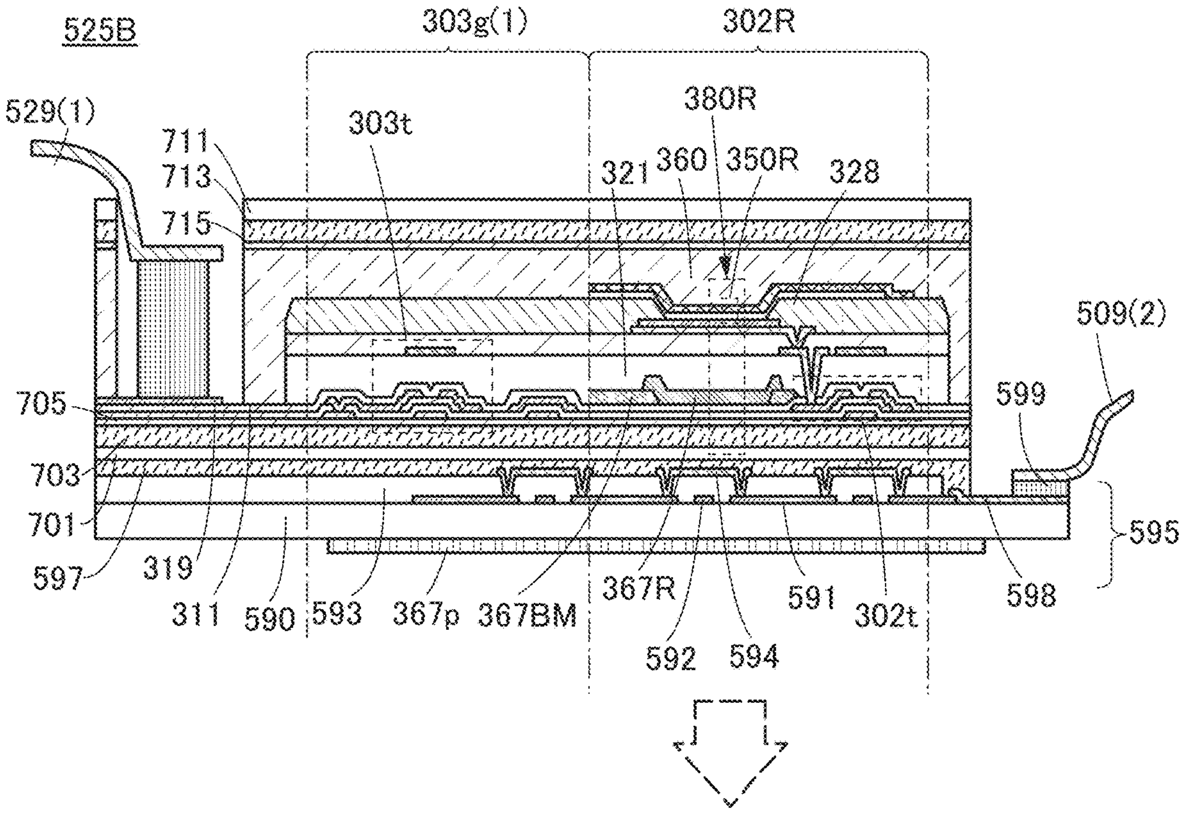
FIGS. 31A to 31C illustrate examples of an input/output device.
Figure 31B:
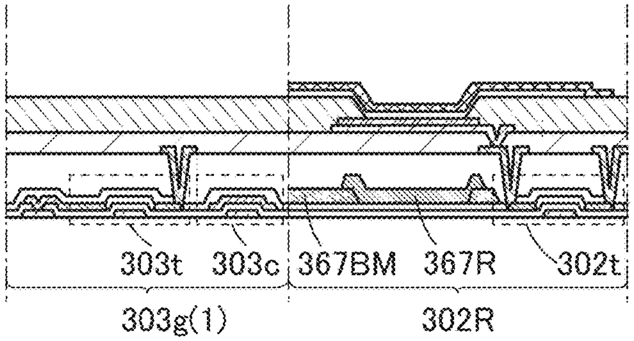
Figure 31C:
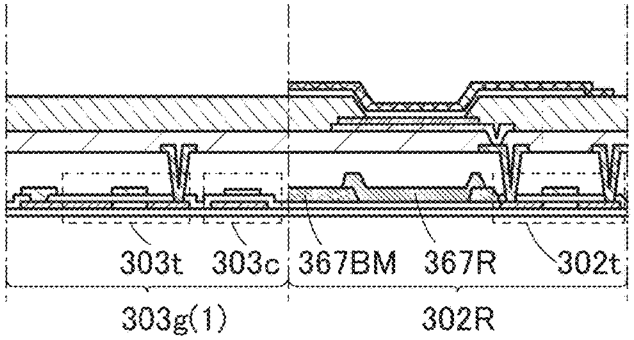

FIGS. 31A to 31C are cross-sectional views of a touch panel 525B. The touch panel 525B described in this embodiment is different from the touch panel 525 in Structure example 2 in that received image data is displayed on the side where the transistors are provided and that the touch sensor is provided on the flexible substrate 701 side of the display portion. Different structures will be described in detail below, and the above description is referred to for the other similar structures.

The coloring layer 367R is positioned in a region overlapping with the light-emitting element 350R. The light-emitting element 350R illustrated in FIG. 31A emits light to the side where the transistor 302*t* is provided. Accordingly, part of light emitted from the light-emitting element 350R passes through the coloring layer 367R and is emitted to the outside of the light-emitting module 380R as denoted by an arrow in FIG. 31A.

The touch panel 525B includes the light-blocking layer 367BM on the light extraction side. The light-blocking layer 367BM is provided so as to surround the coloring layer (e.g., the coloring layer 367R).

The touch sensor 595 is provided not on the flexible substrate 711 side but on the flexible substrate 701 side (see FIG. 31A).

The bonding layer 597 attaches the flexible substrate 590 to the flexible substrate 701 so that the touch sensor 595 overlaps with the display portion. The bonding layer 597 has a light-transmitting property.

Note that a structure in the case of using bottom-gate transistors in the display portion 521 is illustrated in FIGS. 31A and 31B.

For example, a semiconductor layer containing an oxide semiconductor, amorphous silicon, or the like can be used in the transistor 302*t* and the transistor 303*t* illustrated in FIG. 31A.

For example, a semiconductor layer containing polycrystalline silicon or the like can be used in the transistor 302*t* and the transistor 303*t* illustrated in FIG. 31B.

A structure in the case of using top-gate transistors is illustrated in FIG. 31C.

For example, a semiconductor layer containing polycrystalline silicon, a single crystal silicon film that is transferred from a single crystal silicon substrate, or the like can be used in the transistor 302*t* and the transistor 303*t* illustrated in FIG. 31C.

Figure 32A:
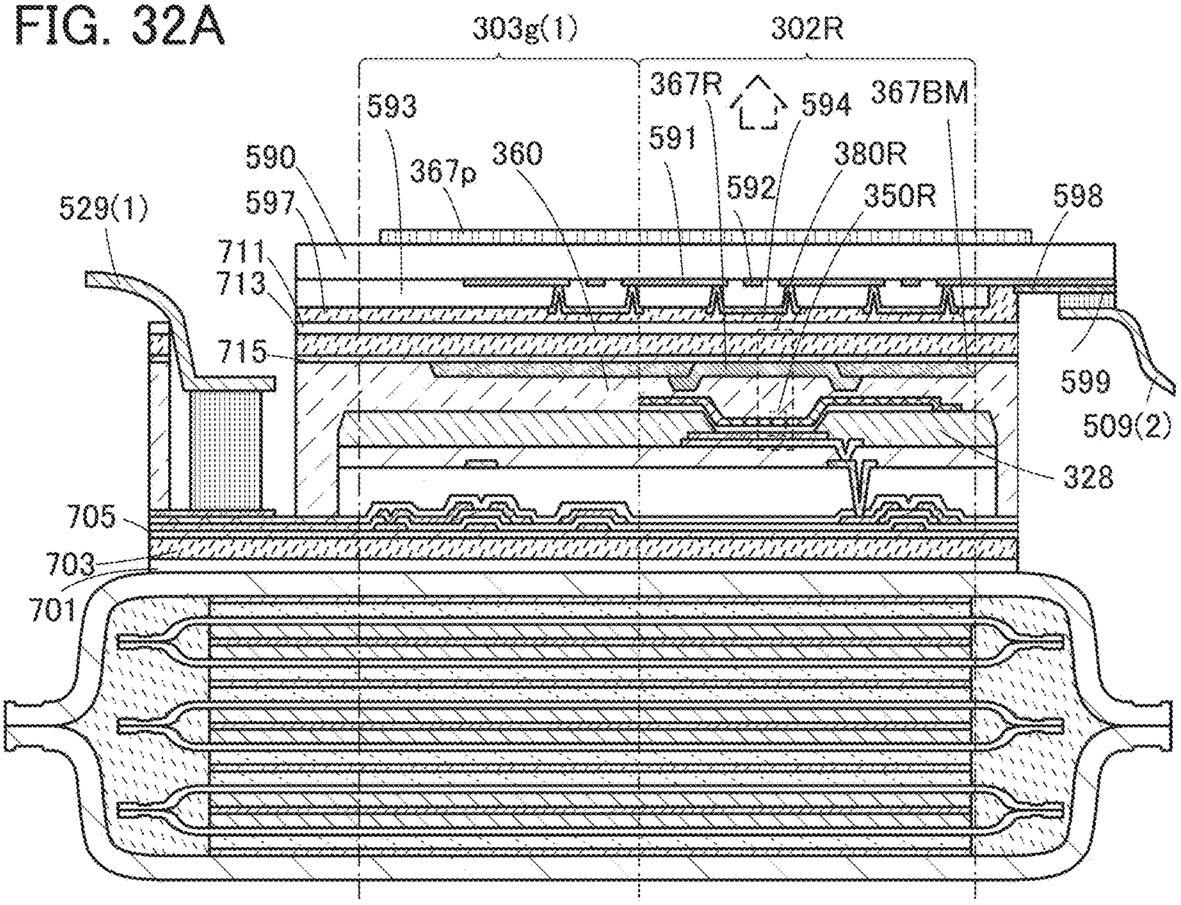
FIGS. 32A and 32B illustrate examples of components of an electronic device.
Figure 32B:
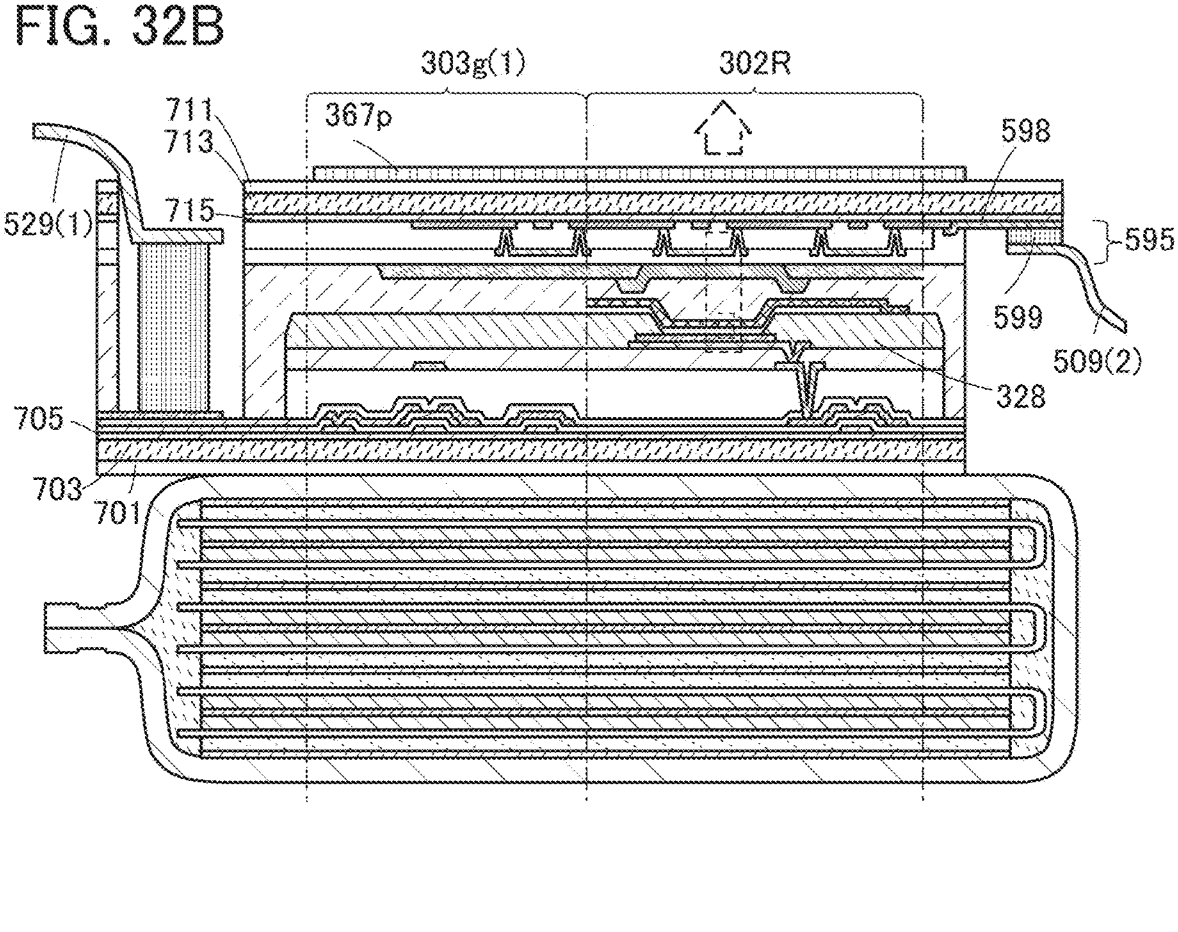

As described in Embodiment 1 and the like, in the electronic device of one embodiment of the present invention, the display panel and the power storage device overlap with each other. FIGS. 32A and 32B each illustrate an example of a cross-sectional view in the case where a touch panel and a thin secondary battery overlap with each other. The touch panel in FIG. 32A has a structure similar to that of the touch panel 525 in FIG. 30A and the thin secondary battery in FIG. 32A has a structure similar to that of the battery unit 500 in FIG. 14A. The touch panel in FIG. 32B has a structure similar to that of the touch panel 525 in FIG. 30B and the thin secondary battery in FIG. 32B has a structure similar to that of the battery unit 500 in FIG. 14B.

In FIGS. 32A and 32B, the flexible substrate 701 included in the touch panel and the exterior body 509 included in the battery unit are in contact with each other; however, one embodiment of the present invention is not limited thereto. The touch panel and the battery unit may be fixed to each other with an adhesive or the like. Alternatively, a circuit board or the like may be provided between the touch panel and the battery unit.

Figure 33A:
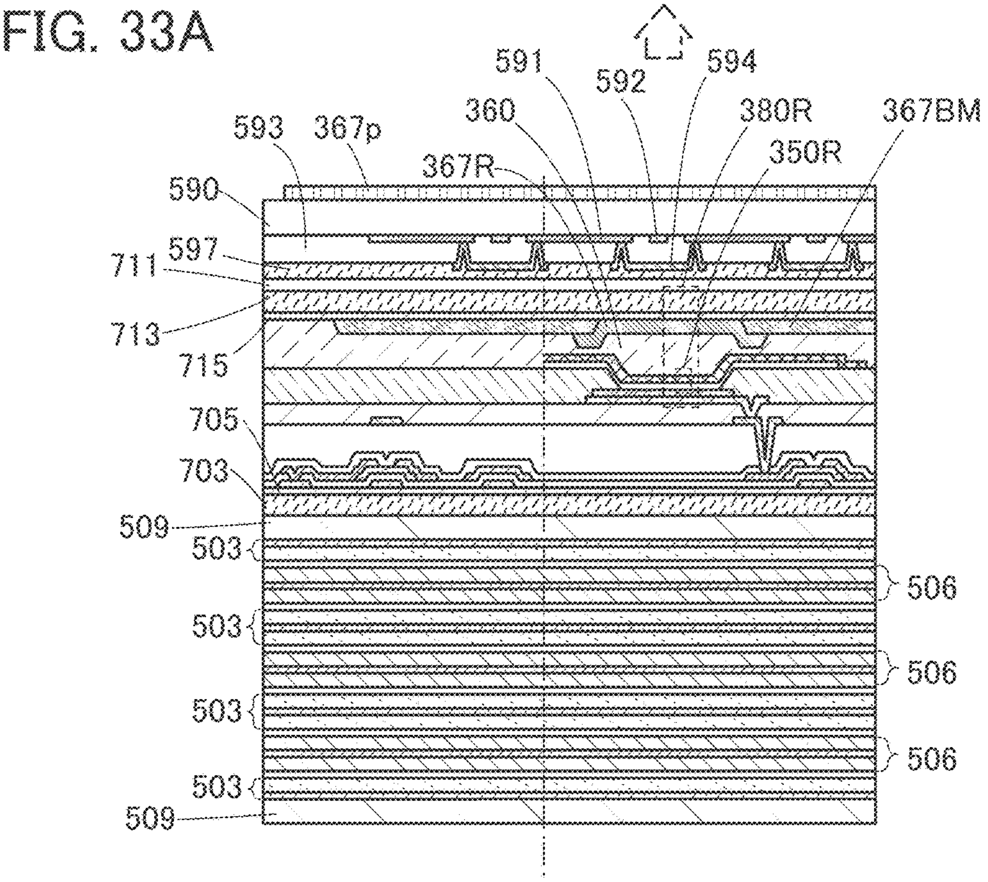
FIGS. 33A and 33B illustrate examples of components of an electronic device.
Figure 33B:
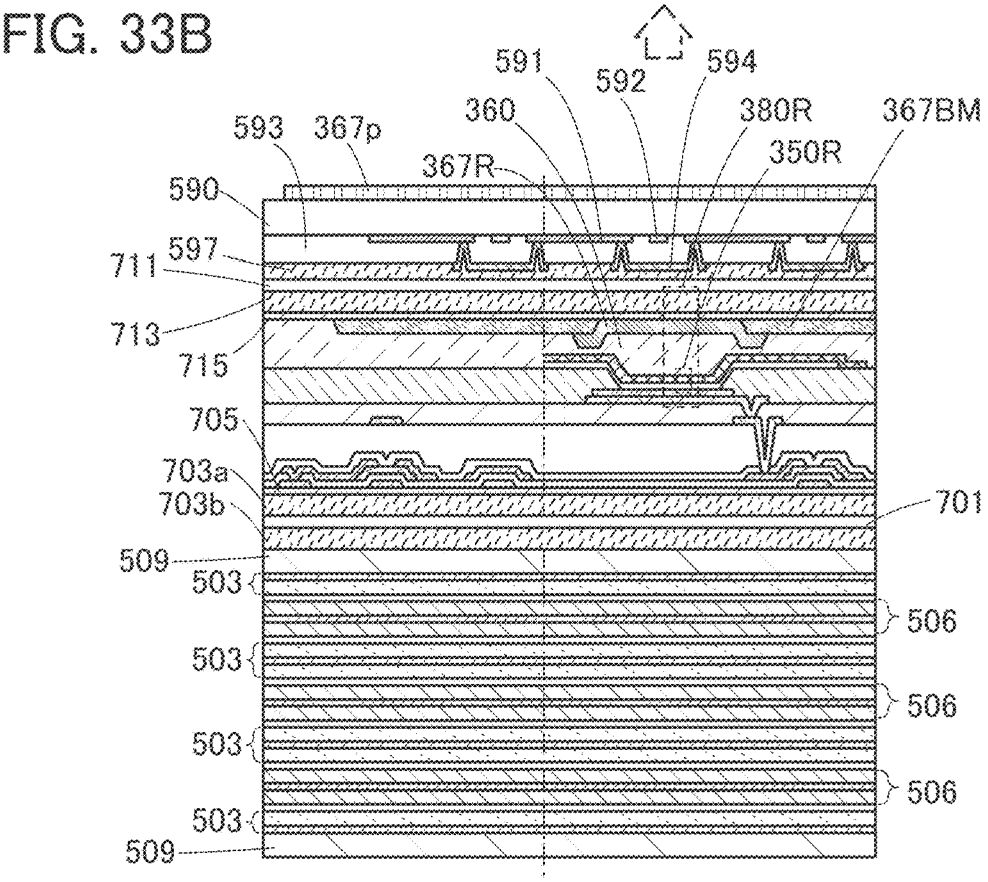

FIGS. 33A and 33B each illustrate a modification example of a stacked-layer structure of the touch panel including the subpixel 302R and the scan line driver circuit 303*g*(1) and the thin secondary battery in FIG. 32A.

FIG. 33A illustrates an example where the insulating layer 705 and the exterior body 509 are bonded to each other with the bonding layer 703. In this manner, in one embodiment of the present invention, the transistor, the light-emitting element, and the like formed over a formation substrate may be transferred onto the secondary battery.

FIG. 33B illustrates an example where the flexible substrate 701 and the insulating layer 705 are bonded to each other with the bonding layer 703*a*, and the flexible substrate 701 and the exterior body 509 are bonded to each other with the bonding layer 703*b*.

Figure 34C:
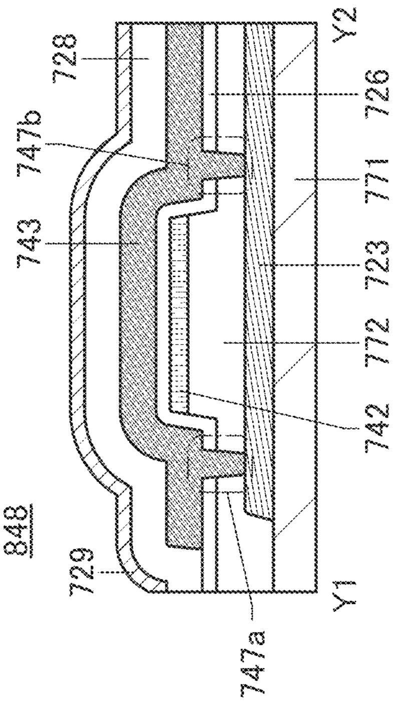
FIGS. 34A to 34C illustrate an example of a transistor.
Figure 34A:
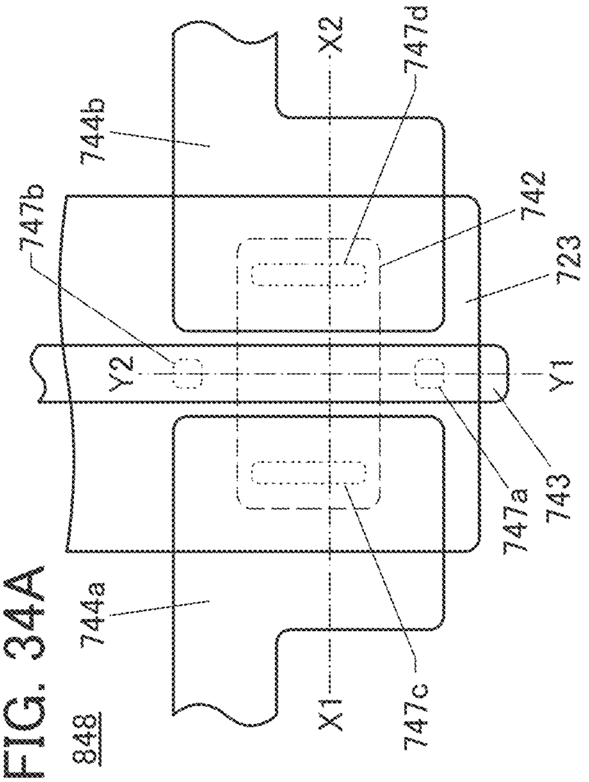
Figure 34B:
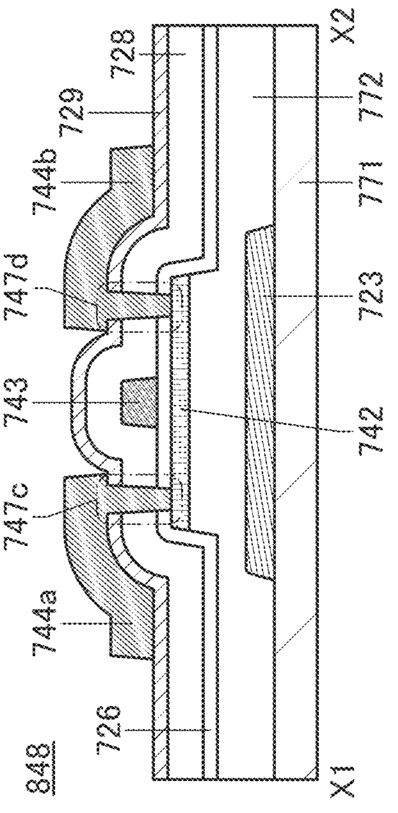

A transistor 848 illustrated in FIGS. 34A to 34C is a type of top-gate transistor including a back gate electrode. FIG. 34A is a top view of the transistor 848. FIG. 34B is a cross-sectional view taken along dashed-dotted line X1-X2 in FIG. 34A. FIG. 34C is a cross-sectional view taken along dashed-dotted line Y1-Y2 in FIG. 34A.

In the transistor 848, a semiconductor layer 742 is formed over a projection of an insulating layer 772. When the semiconductor layer 742 is provided over the projection of the insulating layer 772, the side surface of the semiconductor layer 742 can also be covered with an electrode 743. Thus, the transistor 848 has a structure in which the semiconductor layer 742 can be electrically surrounded by an electric field of the electrode 743. Such a structure of a transistor in which a semiconductor layer in which a channel is formed is electrically surrounded by an electric field of a conductive film is called a surrounded channel (s-channel) structure. A transistor with an s-channel structure is referred to as an s-channel transistor.

In an s-channel structure, a channel can be formed in the whole (bulk) of the semiconductor layer 742. In an s-channel structure, the drain current of the transistor can be increased, so that a larger amount of on-state current can be obtained. Furthermore, the entire channel formation region of the semiconductor layer 742 can be depleted by an electric field of the electrode 743. Accordingly, the off-state current of the transistor with an s-channel structure can further be reduced.

An electrode 723 is provided over a substrate 771 having an insulating surface. The electrode 723 can function as a back gate electrode.

An electrode 744*a* provided over an insulating layer 729 is electrically connected to the semiconductor layer 742 through an opening 747*c* formed in insulating layers 726, 728, and 729. An electrode 744*b* provided over the insulating layer 729 is electrically connected to the semiconductor layer 742 through an opening 747*d* formed in the insulating layers 726, 728, and 729.

The electrode 743 provided over the insulating layer 726 is electrically connected to the electrode 723 through an opening 747*a* and an opening 747*b* formed in the insulating layers 726 and 772. Accordingly, the same potential is supplied to an electrode 746 and the electrode 723. Furthermore, either or both of the openings 747*a* and 747*b* may be omitted. In the case where both the openings 747*a* and 747*b* are omitted, different potentials can be supplied to the electrodes 723 and 746.

As a semiconductor in a transistor having an s-channel structure, an oxide semiconductor, silicon such as polycrystalline silicon or single crystal silicon that is transferred from a single crystal silicon substrate, or the like is used.

This embodiment can be combined with any other embodiment as appropriate.

Embodiment 5

In this embodiment, electronic devices of embodiments of the present invention will be described with reference to FIGS. 35A to 35G, FIGS. 36A and 36B, FIGS. 37A to 37F, FIGS. 38A to 38C, FIGS. 39A to 39D, and FIGS. 40A to 40D.

One embodiment of the present invention is an electronic device including a display panel, a power storage device, a circuit, and a sealing structure. The display panel has a function of displaying an image with power supplied from the power storage device. The circuit includes an antenna and has a function of charging the power storage device wirelessly. Inside the sealing structure, the display panel, the power storage device, and the circuit are provided. At least part of the sealing structure has a function of transmitting visible light. As for the electronic device of one embodiment of the present invention, the sealing structure may be worn on an arm or a structure body connected to the sealing structure may be worn on an arm.

With the use of the sealing structure, the display panel, the power storage device, the circuit, and the like, which are sealed objects, can be protected, so that a sturdy electronic device can be fabricated. Moreover, with the use of a sealing structure having high water resistance, an electronic device which has high water resistance and can be used in water can be fabricated.

In the fabrication of the electronic device of one embodiment of the present invention, the display panel and the power storage device can be collectively covered with and sealed by the sealing structure. Thus, a highly reliable electronic device can be simply fabricated. In addition, the sealing structure has a shape which can be worn on a human body snugly, such as a belt shape, whereby the sealing structure itself can be worn on a human body and the electronic device can be used as a wearable device.

In the electronic device of one embodiment of the present invention, the power storage device can be charged by contactless power transmission. Therefore, the power storage device does not need to be taken out from the sealing structure in charging. Accordingly, the whole of the sealed object can be completely sealed by the sealing structure, so that water resistance of the electronic device can be further improved.

Note that in one embodiment of the present invention, one or more components of the sealed object may be flexible. For example, the display panel or the power storage device may be flexible or both the display panel and the power storage device may be flexible.

In the case where at least one of the display panel and the power storage device is flexible, the sealing structure, which is flexible, can protect the display panel and/or the power storage device without reducing the flexibility. Using one embodiment of the present invention in such a manner enables fabrication of a flexible electronic device that is highly reliable and highly safe. The flexible electronic device is preferable because effects of putting on and taking off the electronic device easily, wearing comfortably, and the like can be obtained.

In the electronic device in this embodiment, the whole of the sealed object is covered with the flexible sealing structure. When the sealed object is covered with the flexible sealing structure, an electronic device that is not easily broken even after being repeatedly bent and stretched can be fabricated.

In addition, with a sealing structure having high heat resistance, the display panel can be driven even at high temperatures. Furthermore, the electronic device can be reversibly bent even at high temperatures. In that case, the display panel and the power storage device preferably have high heat resistance.

In this embodiment, an example where a display device detailed in Embodiment 6 is used in a display panel is described. Note that, for the electronic device in this embodiment, the structure described in Embodiment 1 can be used as appropriate.

A user can view display of the display device of one embodiment of the present invention well irrespective of surrounding brightness, by switching elements used for display (selecting which display element to use for displaying) in accordance with the surrounding brightness or the amount of external light entering the display device. For example, in a bright place, external light and a reflective liquid crystal element are preferably utilized to perform display. In a dim place, a light-emitting element such as an organic EL element is preferably utilized to perform display. The display device may perform display by utilizing plural kinds of display elements at a time.

The electronic device of one embodiment of the present invention preferably includes a sensor that senses the brightness of an environment in which the electronic device is used. For example, a photodiode or an image sensor is preferably included. In the electronic device, the elements to be used for display are preferably switched automatically in accordance with the brightness sensed by the sensor. When the display state of the display device can be changed automatically in accordance with the brightness of a usage environment, convenience of the electronic device for the user can be improved.

Alternatively, in the electronic device of one embodiment of the present invention, it is preferable that the user of the electronic device manually switch the elements to be used for display.

Next, the electronic device of this embodiment is specifically described.

Figure 35A:
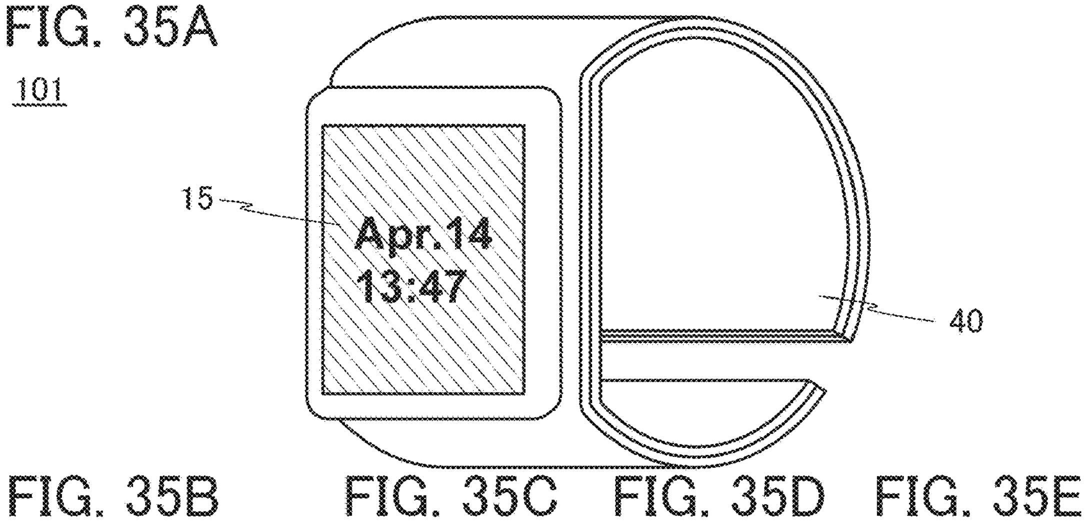
FIGS. 35A to 35G illustrate examples of an electronic device.
Figures 35B, 35C, 35D, 35E:
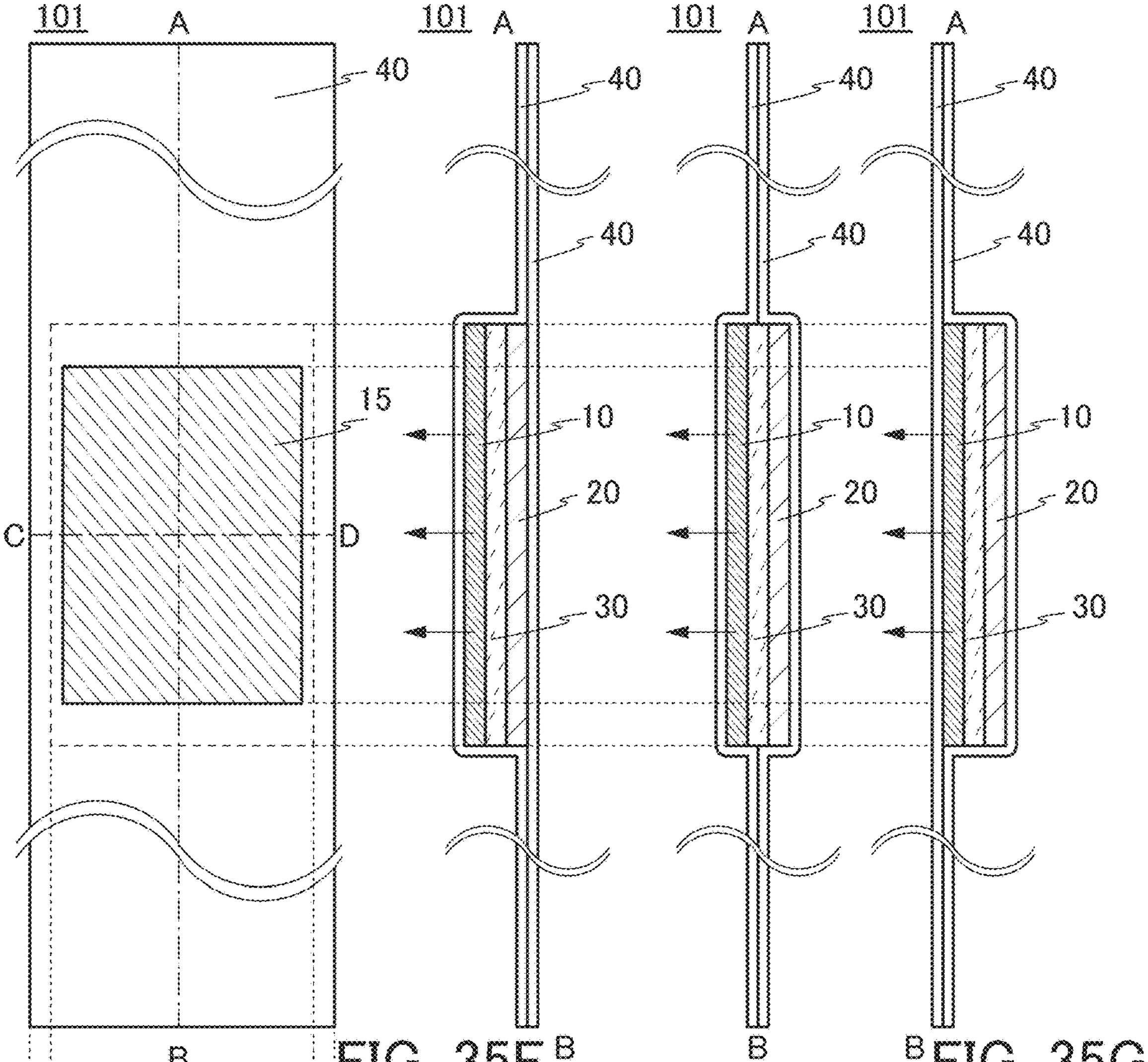
Figure 35F:
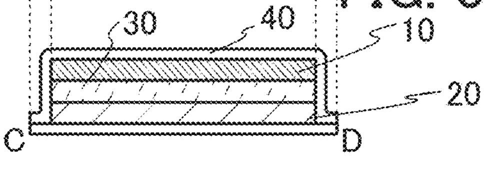

FIG. 35A is a perspective view of an electronic device 101. FIG. 35B is a top view of the electronic device 101. FIG. 35C is a cross-sectional view taken along dashed-dotted line A-B in FIG. 35B, and FIG. 35F is a cross-sectional view taken along dashed-dotted line C-D in FIG. 35B.

The electronic device 101 includes the display panel 10, the power storage device 20, the circuit 30, and the sealing structure 40. In FIG. 35A and the like, a portion of the display panel 10 whose display can be viewed by users is referred to as the display portion 15 of the electronic device 101.

<Display Portion 15>

The electronic device 101 includes the display portion 15. In FIGS. 35A, 35C, 35F, and the like, the display portion 15 has a flat surface. In FIG. 35C and the like, a display surface of the electronic device 101 is denoted by arrows.

The display portion 15 may be flexible. In other words, the display portion 15 may be changed in shape so that the curvature of the display portion 15 can be changed from the curvature of the shape in FIG. 35A. Note that the shape of the display portion 15 may be fixed to a flat shape or a shape including a curved surface.

In the case where the flexibility of the display panel is lower than that of the sealing structure, when the electronic device of one embodiment of the present invention is worn on an arm or the like, it is preferable that a radius of curvature of the display portion 15 hardly change and end portions of the electronic device be bent.

<Sealing Structure 40>

The electronic device 101 includes the sealing structure 40. In FIG. 35A, the sealing structure 40 has a curved surface. The sealing structure 40 can be changed in shape from the shape including the curved surface as shown in FIG. 35A to a flat shape as shown in FIG. 35B. The sealing structure 40 that can be used in the electronic device 101 is similar to that in Embodiment 1; thus, detailed description thereof is omitted.

In the electronic device 101, the display panel 10, the power storage device 20, and the circuit 30 are stacked. This stacking order is not particularly limited as long as the display in the display panel 10 can be viewed by the users. Alternatively, these layers are not necessarily stacked, and any two or more of the display panel 10, the power storage device 20, and the circuit 30 may be provided on the same plane.

For example, as illustrated in FIG. 35F and the like, in the electronic device 101, the circuit 30 may be provided over the power storage device 20, and the display panel 10 may be provided over the circuit 30. When the sealing structure 40 is worn on an arm and the power storage device 20, the circuit 30, and the display panel 10 are stacked in this order from the arm side, the users can view the display in the display panel 10. Alternatively, the circuit 30, the power storage device 20, and the display panel 10 may be stacked in this order from the arm side.

A space sealed by the sealing structure 40 is preferably in a reduced-pressure atmosphere or an inert atmosphere. By such an atmosphere, the reliability of the display panel 10 or the like can be increased compared with an air atmosphere.

Figure 35G:
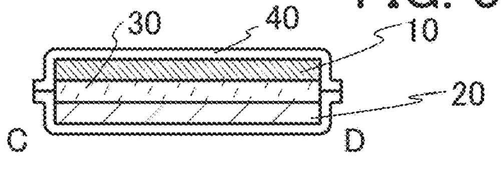

FIGS. 35D and 35E are each a cross-sectional view taken along dashed-dotted line A-B in FIG. 35B, which is different from the cross-sectional view in FIG. 35C. FIG. 35G is a cross-sectional view taken along dashed-dotted line C-D in FIG. 35B, which is different from the cross-sectional view in FIG. 35F.

In FIGS. 35C and 35F, the sealing structure 40 on the front (display surface) side of the electronic device 101 covers side surfaces of the sealed object, and a surface on the rear side of the electronic device 101 is flat; however, the present invention is not limited thereto. As illustrated in FIGS. 35D and 35G, the sealing structure 40 on both the front (display surface) side and the rear side of the electronic device 101 may cover side surfaces of the sealed object, and the electronic device 101 may include portions that project as compared with the other portions (e.g., a band portion) on both the front side and the rear side. Alternatively, as illustrated in FIG. 35E, the sealing structure 40 on the rear side of the electronic device 101 may cover side surfaces of the sealed object and a surface on the front side (display surface) of the electronic device 101 may be flat. Moreover, as illustrated in FIG. 35C, a portion including the display portion 15 of the electronic device 101 may project as compared with the other portions (e.g., a band portion). Alternatively, as illustrated in FIG. 35E, a portion that projects as compared with the other portions (e.g., a band portion) may be provided on the rear side of the electronic device 101.

FIGS. 36A and 36B, FIGS. 37A to 37F, FIGS. 38A to 38C, and FIGS. 39A to 39D illustrate electronic devices which are different from the electronic device 101.

Figure 36A:
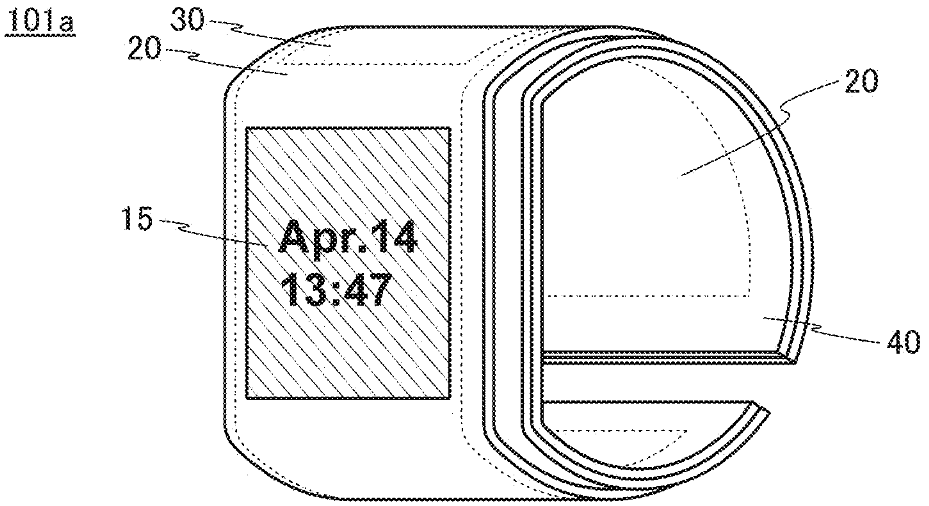
FIGS. 36A and 36B illustrate examples of an electronic device.

FIG. 36A is a perspective view of an electronic device 101*a*. FIG. 37A is a top view of the electronic device 101*a*, FIG. 37B is a cross-sectional view taken along dashed-dotted line E-F in FIG. 37A, and FIG. 37F is a cross-sectional view taken along dashed-dotted line G-H in FIG. 37A. In addition, FIG. 36B is a perspective view of an electronic device 101*b*.

Figure 36B:
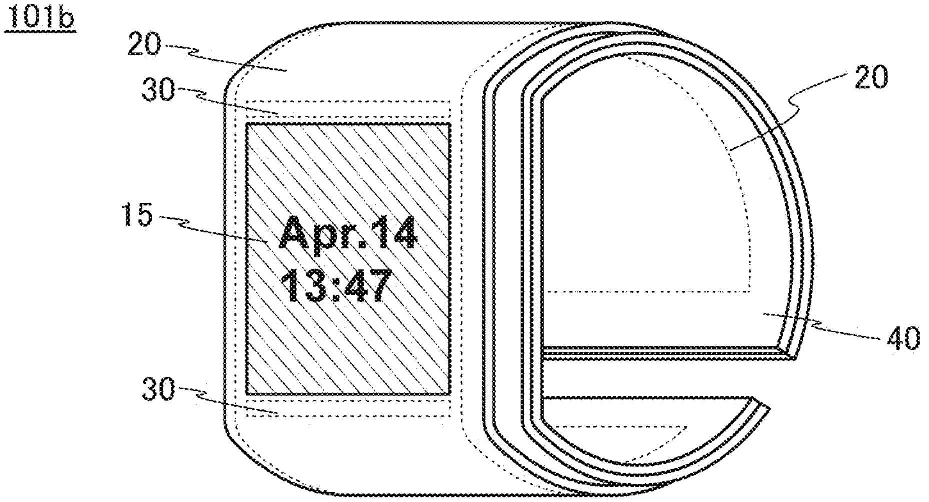
Figures 37A, 37B, 37C, 37D, 37E:
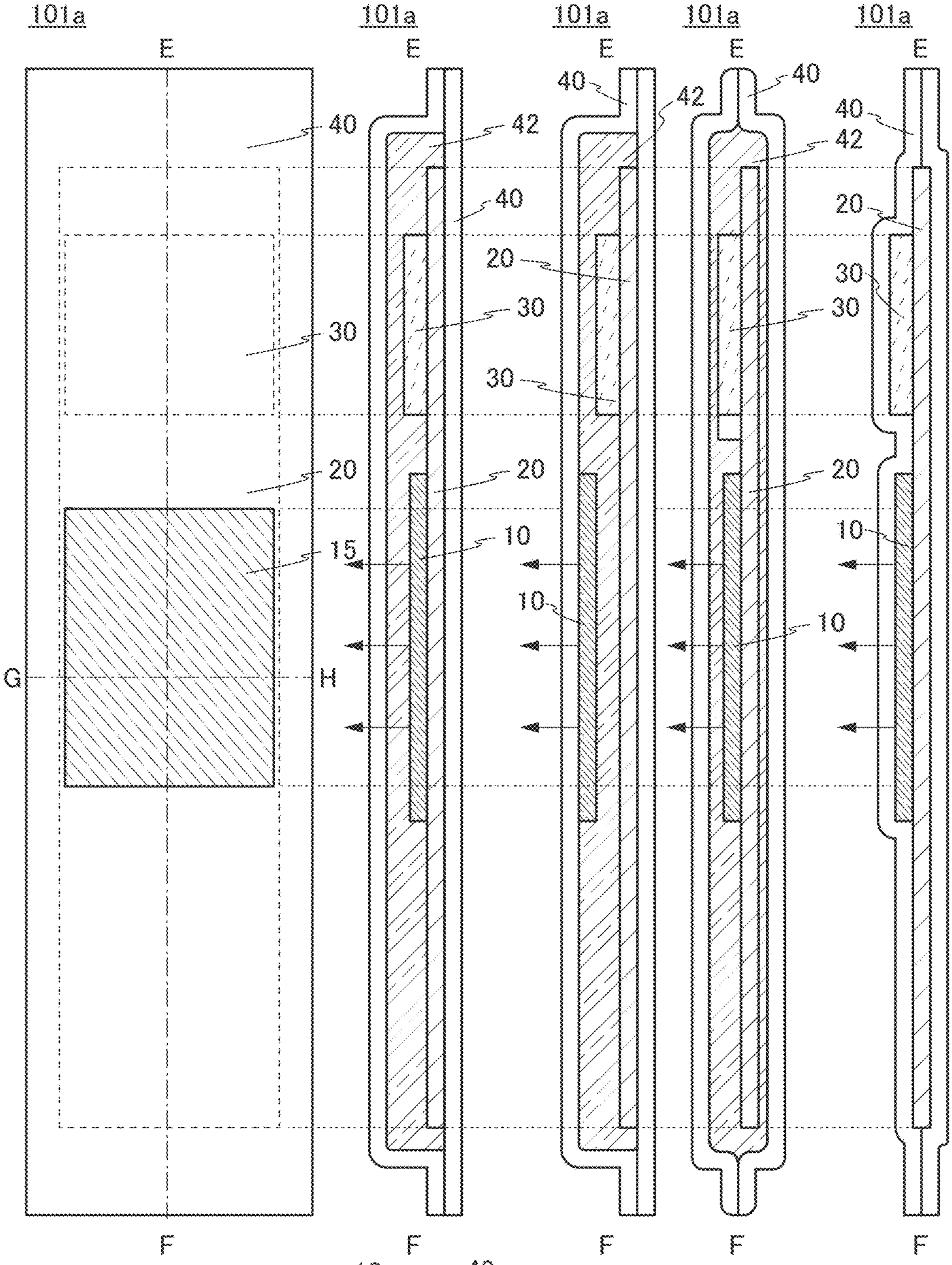
FIGS. 37A to 37F illustrate examples of an electronic device.
Figure 37F:
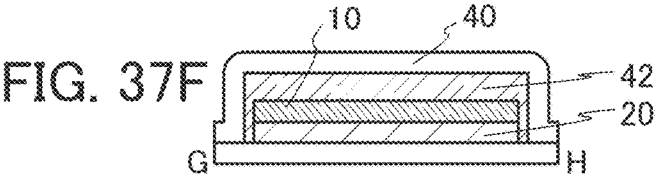

FIGS. 36A and 36B each show an example where the display portion 15 has a flat surface. FIG. 36A shows an example where the power storage device 20 and the circuit 30 are each flexible and have a curved surface. FIG. 36B shows an example where the power storage device 20 is flexible and has a curved surface. In FIGS. 36A and 36B, the display panel 10 is or is not necessarily flexible. In FIG. 36B, the circuit 30 is or is not necessarily flexible.

The electronic device 101*a* includes the display portion 15. In addition, the electronic device 101*a* includes the sealing structure 40. In the electronic device 101*a*, the display panel 10, the power storage device 20, and the circuit 30 are provided inside the sealing structure 40.

In the electronic device 101*a*, the display panel 10 and the power storage device 20 overlap, the circuit 30 and the power storage device 20 overlap, and the display panel 10 and the circuit 30 do not overlap. In this manner, the sealed object may be positioned in a portion functioning as a band in the sealing structure 40. For example, in the case where the flexible power storage device 20 is used, the power storage device 20 can be positioned in a wide region inside the sealing structure 40, and an electronic device that can be used for a long time per charge can be fabricated.

Inside the sealing structure 40, at least one of a buoyancy material and a member with rubber elasticity may be provided as described in detail in Embodiment 1.

FIGS. 37C to 37E are each a cross-sectional view taken along dashed-dotted line E-F in FIG. 37A, which is different from the cross-sectional view in FIG. 37B.

The buoyancy material or the member with rubber elasticity is preferably provided in the space 42 shown in FIGS. 37B, 37C, 37D, and 37F, for example.

As illustrated in FIG. 37B, the display panel 10 and the power storage device 20, and the circuit 30 and the power storage device 20 may be in contact with each other.

Alternatively, as illustrated in FIG. 37C, the display panel 10 and the power storage device 20 are not necessarily in contact with each other. Similarly, the circuit 30 and the power storage device 20 are not necessarily in contact with each other. In addition, the display panel 10, the power storage device 20, and the circuit 30 may each be in contact with the sealing structure 40. FIGS. 37B and 37C each show an example where the power storage device 20 is in contact with the sealing structure 40. FIG. 37C shows an example where the display panel 10 is in contact with the sealing structure 40. Alternatively, as illustrated in FIG. 37D, the sealing structure 40 is not necessarily contact with the sealed object. Note that in the case where there is a portion where any two or more of the display panel 10, the power storage device 20, the circuit 30, and the sealing structure 40 are in contact with each other, these may be fixed with an adhesive or the like or may be in contact with each other so that they can be moved relatively.

Alternatively, as illustrated in FIG. 37E, pressure inside the sealing structure 40 may be sufficiently reduced. Thus, degradation of the display panel 10, the power storage device 20, the circuit 30, and the like due to impurities and the like can be suppressed. Moreover, an electronic device can be thinner and more lightweight.

In FIGS. 37B and 37F, the sealing structure 40 on the front (display surface) side of the electronic device 101*a* covers side surfaces of the sealed object, and a surface on the rear side of the electronic device 101*a* is flat; however, the present invention is not limited thereto. As illustrated in FIG. 37D, the sealing structure 40 on both the front (display surface) side and the rear side of the electronic device 101*a* may cover side surfaces of the sealed object, and the electronic device 101*a* may include portions that project as compared with the other portions (e.g., a band portion) on both the front side and the rear side.

Figure 38A:
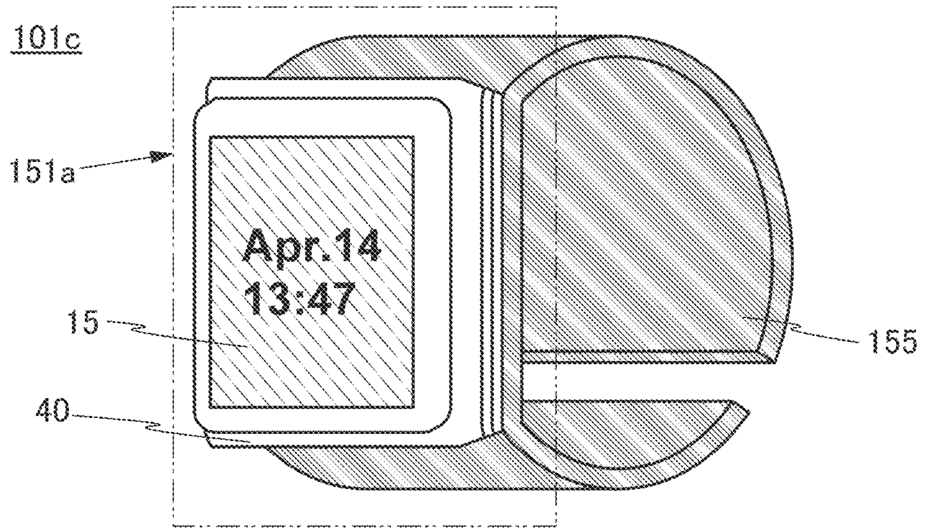
FIGS. 38A to 38C illustrate examples of an electronic device.
Figure 39A:
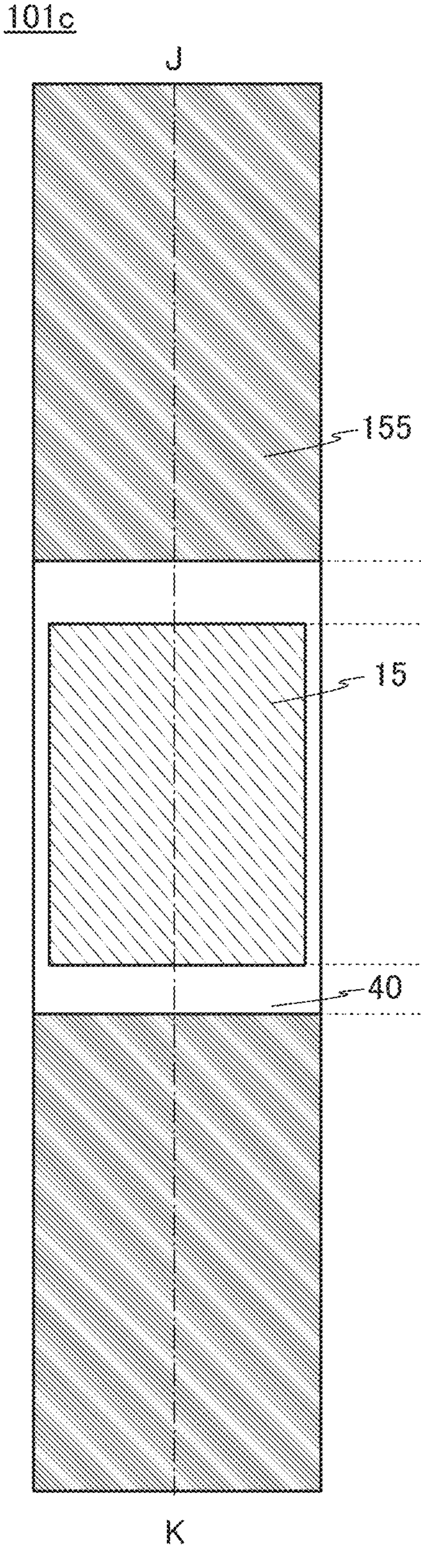
FIGS. 39A to 39D illustrate examples of an electronic device.
Figure 39B:
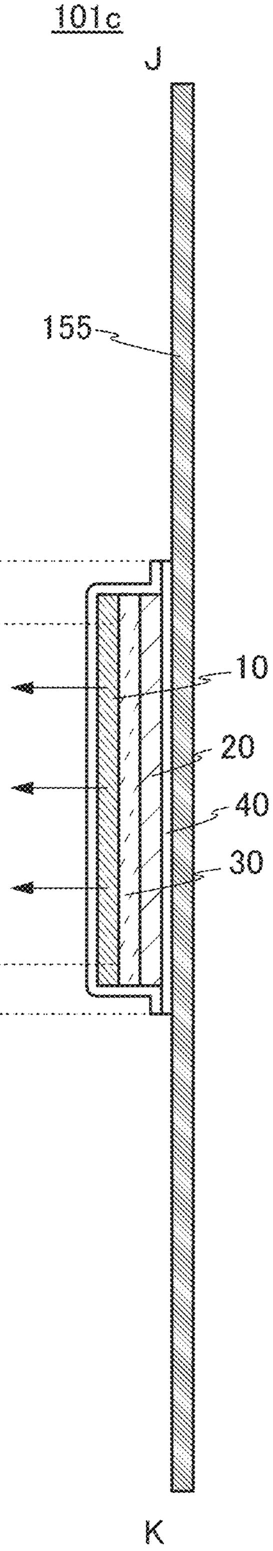

FIG. 38A is a perspective view of an electronic device 101*c*. FIG. 39A is a top view of the electronic device 101*c*, and FIG. 39B is a cross-sectional view taken along dashed-dotted line J-K in FIG. 39A.

The electronic device 101*c* includes the sealing structure 40 and the band 155. Inside the sealing structure 40, the display panel 10, the circuit 30, the power storage device 20, and the like are provided. The sealing structure 40 is connected to the band 155. The sealing structure 40 and the band 155 are preferably connected to each other detachably.

Figure 38B:
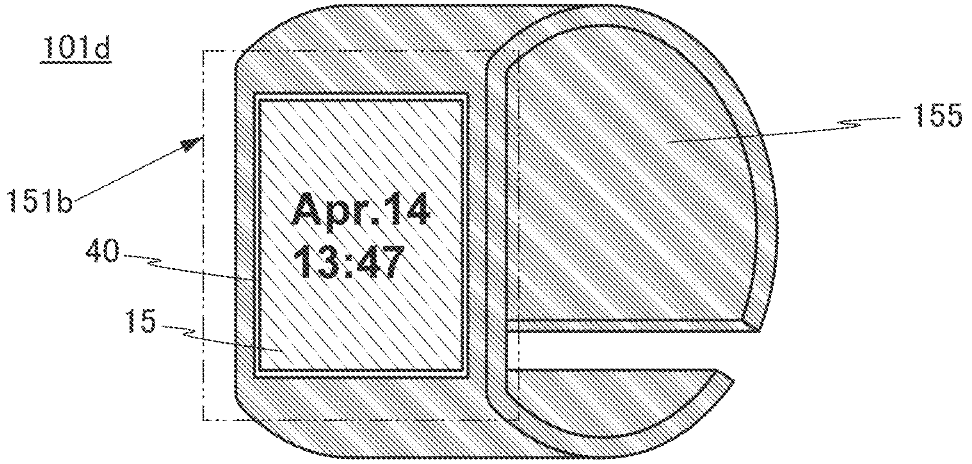
Figure 38C:
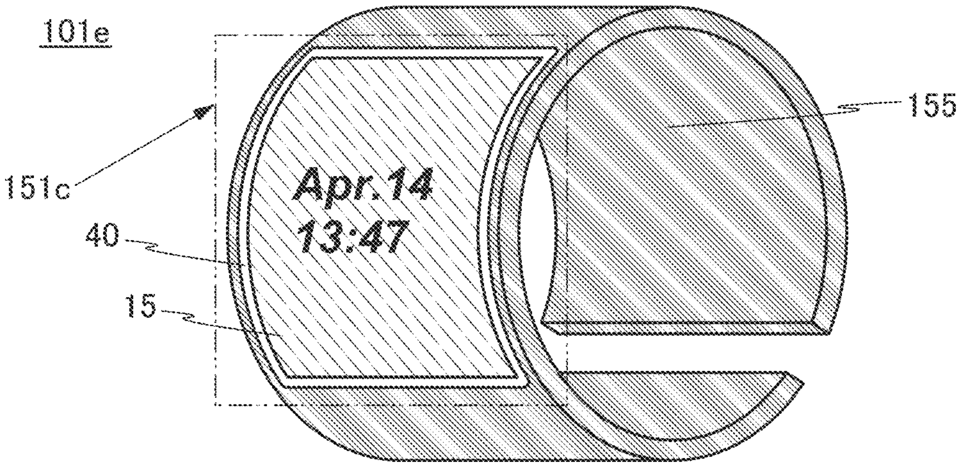

Like an electronic device 101*d* in FIG. 38B and an electronic device 101*e* in FIG. 38C, the band 155 may have a depression portion and the sealing structure 40 may be positioned in the depression portion. If the sealing structure 40 projects as compared with the band 155, when the electronic device rubs or bumps against another object while being used, the display portion 15 might be damaged, and moreover, the electronic device might be broken. Thus, the band 155 is preferably connected to the sealing structure 40 so that the surface of the band 155 and the surface of the sealing structure 40 can be in substantially the same plane. Note that the depth of the depression portion of the band 155 may be greater than the thickness of the sealing structure 40.

The electronic device 101*d* is an example where the display portion 15 has a flat surface. The electronic device 101*e* is an example where the display portion 15 has a curved surface.

Figure 39C:
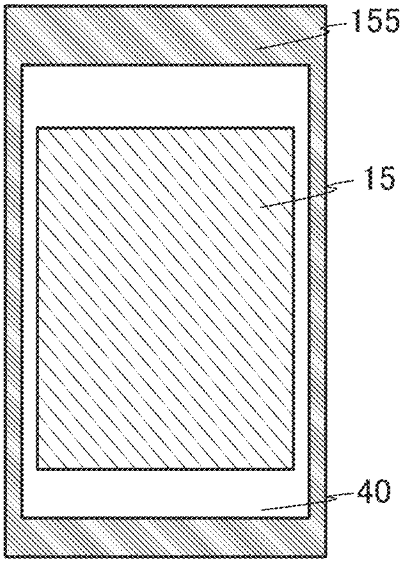
Figure 39D:
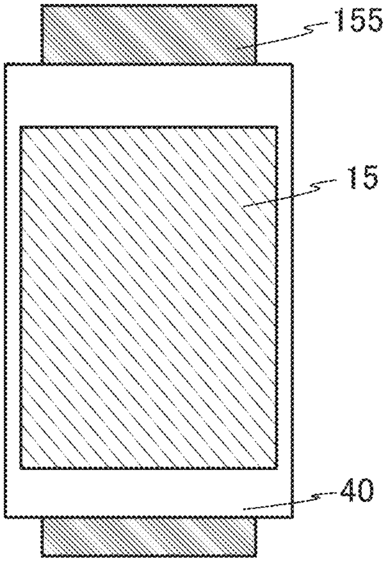

In FIG. 38A and FIG. 39A, an example where the width of the sealing structure 40 is equal to the width of the band 155 is shown; however, one embodiment of the present invention is not limited thereto. As illustrated in FIG. 39C, the width of the sealing structure 40 may be narrower than that of the band 155. Alternatively, as illustrated in FIG. 39D, the width of the sealing structure 40 may be broader than that of the band 155.

Next, examples of components of the electronic device in one embodiment of the present invention are shown.

Figure 40A:
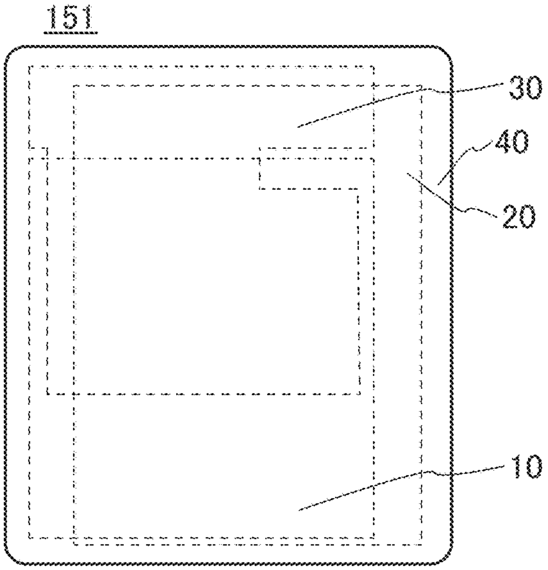
FIGS. 40A to 40D illustrate examples of components of an electronic device.

An element 151 in FIG. 40A includes the display panel 10, the power storage device 20, the circuit 30, and the sealing structure 40. The display panel 10, the power storage device 20, and the circuit 30 are provided inside the sealing structure 40. Hereinafter, the display panel 10, the power storage device 20, and the circuit 30 are collectively referred to as a sealed object in some cases.

The element 151 can be used so that the sealing structure 40 is connected to the band 155, like an element 151*a* in FIG. 38A, an element 151*b* in FIG. 38B, and an element 151*c* in FIG. 38C. Alternatively, as illustrated in FIGS. 37A to 37E, the sealing structure 40 is formed in a belt shape, whereby the sealing structure 40 itself may be worn on an arm.

Figure 40B:
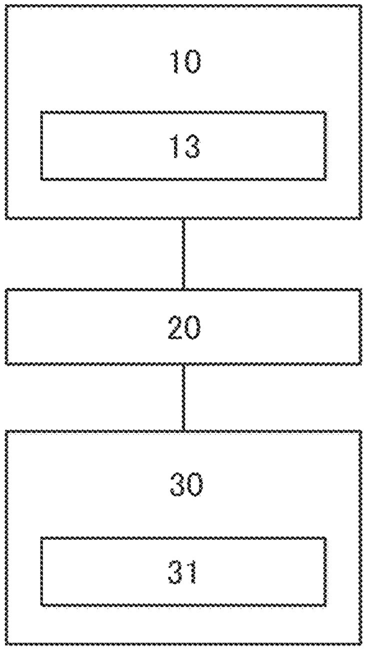

FIG. 40B is a block diagram illustrating an example of the connection relation in the sealed object.

The display panel 10 includes a display element 13. The display panel 10 has a function of displaying an image with power supplied from the power storage device 20.

Note that the display panel 10 may have a function of displaying an image with power supplied from a component other than the power storage device 20.

The power storage device 20 includes a portion overlapping with the display panel 10.

Note that the power storage device 20 may have a function of supplying power to a component other than the display panel 10.

The circuit 30 includes the antenna 31. The antenna 31 includes a portion overlapping with the display panel 10. The circuit 30 can charge the power storage device 20 wirelessly (without contact).

Providing the portion where the display panel 10 and the circuit 30 overlap with each other or the portion where the display panel 10 and the power storage device 20 overlap with each other enables a reduction in size of the element 151. In particular, it is preferred that a portion where the display panel 10, the power storage device 20, and the circuit 30 overlap with one another be provided. A reduction in size of the element 151 is particularly effective in the case where the sealing structure 40 and the band are separately provided. Note that in the case where a reduction in size of the element 151 is not needed, e.g., in the case where the sealing structure 40 is used as the band of the electronic device, the portion where the display panel 10 and the circuit 30 overlap with each other or the portion where the display panel 10 and the power storage device 20 overlap with each other is not necessarily provided.

It is preferred that the power storage device 20 include a portion overlapping with the circuit 30. For example, at least part of the antenna 31 may overlap with the power storage device 20. The display panel 10, the power storage device 20, and the circuit 30 preferably overlap with one another such that the user of the electronic device hardly perceives the antenna 31, e.g., the antenna 31 is provided between the display panel 10 and the power storage device 20, in which case the appearance of the electronic device can be maintained. Even if the display panel 10 is positioned between an external antenna and the antenna 31, radio waves can be transmitted and received. That is, a radio wave transmitted from the external antenna passes through the display panel 10, and the antenna 31 receives the radio wave.

In the case where the usage environment of the electronic device is determined, a display panel capable of displaying an image in the environment and a power storage device capable of supplying power to the display panel in the environment are used.

It is preferred that the electronic device of one embodiment of the present invention can be used at low temperatures and at high temperatures. The electronic device of one embodiment of the present invention can be used in a wide temperature range (e.g., higher than or equal to 0° C. and lower than or equal to 100° C., preferably higher than or equal to −25° C. and lower than or equal to 150° C., further preferably higher than or equal to −50° C. and lower than or equal to 200° C.). The electronic device of one embodiment of the present invention can be used either indoors or outdoors.

It is preferred that a display panel of the electronic device of one embodiment of the present invention can display an image at both temperatures of 0° C. and 100° C. Furthermore, it is preferred that a power storage device of the electronic device of one embodiment of the present invention can supply power to the display panel at both temperatures of 0° C. and 100° C.

Figure 40C:
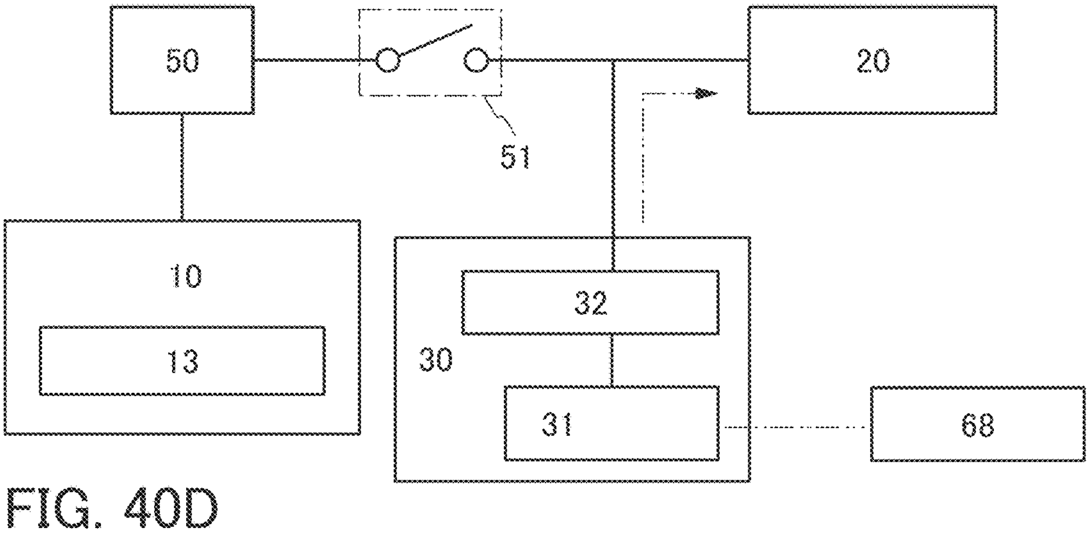
Figure 40D:
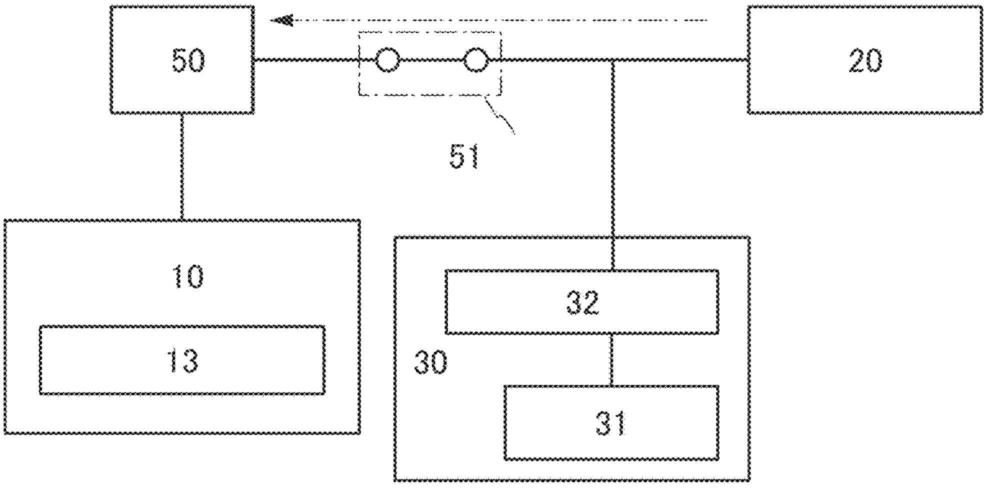

The electronic device may include a switch. In FIGS. 40C and 40D, the display panel 10, the power storage device 20, the circuit 30, a circuit 50, and a switch 51 are illustrated as a sealed object.

As illustrated in FIG. 40C, the circuit 30 can charge the power storage device 20 wirelessly when the switch 51 is off.

As illustrated in FIG. 40D, the power storage device 20 can supply power to the display panel 10 when the switch 51 is on.

Components of the electronic device of one embodiment of the present invention will be described in detail below.

<Display Panel 10>

The display panel 10 includes the display element 13. As a structure example of the display panel 10, a display device will be detailed in Embodiment 6. The display panel may include a sensing element such as a touch sensor.

In the display panel 10, an active matrix method or a passive matrix method can be used.

The display panel 10 may be flexible. For example, when a film is used for at least one of a supporting substrate and a sealing substrate of the display element 13, the flexibility of the display panel 10 can be increased.

For example, the electronic device can be preferably used while the display panel is bent with a radius of curvature from 1 m to 10 m, preferably from 1 m to 5 m. Note that in the case where the display panel is more flexible, the electronic device may be used while the display panel is bent with a radius of curvature of 1 mm or more and less than 1 m.

It is preferred that the display panel 10 be capable of displaying an image at low temperatures and at high temperatures. The range of low temperatures is, for example, higher than or equal to −100° C. and lower than or equal to 0° C., preferably higher than or equal to −100° C. and lower than or equal to −25° C., more preferably higher than or equal to −100° C. and lower than or equal to −50° C. The range of high temperatures is, for example, higher than or equal to 100° C. and lower than or equal to 300° C., preferably higher than or equal to 150° C. and lower than or equal to 300° C., more preferably higher than or equal to 200° C. and lower than or equal to 300° C. Note that the display panel 10 can display an image at higher than 0° C. and lower than 100° C., in addition to at low temperatures and at high temperatures. For example, the display panel 10 can display an image at a room temperature (higher than or equal to 20° C. and lower than or equal to 30° C.).

As the display element 13, a light-emitting element, a liquid crystal element, an electrophoretic element, a display element using micro electro mechanical systems (MEMS), or the like can be used. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

It is preferred that the heat resistance of the display element 13 be as high as possible. For example, in the case where an organic EL element is used as the display element 13, the glass transition temperature of each of organic compounds contained in the organic EL element is preferably higher than or equal to 100° C. and lower than or equal to 300° C., more preferably higher than or equal to 150° C. and lower than or equal to 300° C.

Power Storage Device 20

The details and the structure example of the power storage device 20 are not described here because Embodiments 1 and 2 can be referred to.

In the electronic device, the display element 13 and the power storage device 20 may be provided to overlap with each other. As the area where the display element 13 and the power storage device 20 overlap with each other is larger, the power storage device 20 can be made warm in a wider area by utilizing heat of the display element 13. The reliability of the electronic device can be increased even in the case where a power storage device which operates more hardly in a low-temperature environment than in a high-temperature environment is used.

<Circuit 30>

The details of the circuit 30 are not described here because Embodiment 1 can be referred to.

<Circuit 50>

The circuit 50 has a function of converting power supplied from the power storage device 20 into power which makes the display element 13 drive. For example, the circuit 50 may have a function of converting (stepping up or stepping down) output voltage of the power storage device 20 into voltage which makes the display element 13 drive.

<Switch 51>

The details of the switch 51 are not described here because Embodiment 1 can be referred to.

An environment where the electronic device of one embodiment of the present invention can be used is not limited to an air atmosphere. The electronic device of one embodiment of the present invention can be used in water at temperatures of higher than or equal to 0° C. and lower than or equal to 100° C., for example. The electronic device of one embodiment of the present invention can have high reliability even when used in water since the display panel and the power storage device can be used in a wide temperature range and are sealed by a sealing structure, for example.

For the components of the electronic device in this embodiment, the content described with reference to FIGS. 8A to 8C can be used.

The electronic device of this embodiment and the components thereof can be used in the arm-worn electronic devices illustrated in FIGS. 9A to 9D and FIGS. 10A to 10D.

This embodiment can be combined with any other embodiment as appropriate.

Embodiment 6

In this embodiment, a display device that can be used for the electronic device of one embodiment of the present invention is described with reference to drawings. In this embodiment, a display device including a liquid crystal element and an organic EL element is mainly shown as an example; however, one embodiment of the present invention is not limited thereto. Note that the above description can be referred to for the components of the display device, which are similar to those in Embodiment 3.

The display device of one embodiment of the present invention includes a first display element and a second display element. The first display element includes a reflective layer which has a function of reflecting light. The first display element has a function of controlling light transmission. The reflective layer has an opening portion. The second display element includes a portion overlapping with the opening portion. The second display element has a function of emitting light toward the opening portion. The opening portion preferably has an area greater than or equal to 5% and less than or equal to 20% of the area of the reflective layer.

For example, when a sufficient amount of external light enters the display device (e.g., in a bright place), display can be performed by utilizing external light and the first display element. Thus, the power consumption of the display device can be reduced. Even when the surroundings of the display device are dark and a small amount of external light enters the display device, display can be performed by utilizing the second display element. Note that in a dim place, both the first display element and the second display element can be driven to perform display. Alternatively, in a dim place, only the second display element may be utilized to perform display. In this manner, with one embodiment of the present invention, a convenient display device having high visibility irrespective of surrounding brightness or an all-weather display device can be fabricated.

The display device of one embodiment of the present invention may include one, or two second display elements corresponding to one first display element. For example, the number of pixels constituted by the first display element(s) is preferably equal to the number of pixels constituted by the second display element(s), in which case display performed using the first display elements and display performed using the second display elements have substantially the same degree of resolution.

It is preferable that the display device having the above structure further include a signal line, a pixel circuit, a first conductive layer, a second conductive layer, and an insulating layer. The second display element is electrically connected to the pixel circuit. The first display element is electrically connected to the first conductive layer. The first conductive layer includes a portion overlapping with the second conductive layer with the insulating layer provided therebetween. The first conductive layer is electrically connected to the second conductive layer. The second conductive layer is electrically connected to the pixel circuit. The pixel circuit is electrically connected to the signal line. The pixel circuit can drive both the first display element and the second display element between which the insulating layer is sandwiched.

Alternatively, the display device of one embodiment of the present invention includes a liquid crystal element and a light-emitting element. The liquid crystal element includes a liquid crystal layer, a first conductive layer, and a second conductive layer. The first conductive layer has a function of reflecting light. The first conductive layer has an opening portion. The light-emitting element includes a layer containing a light-emitting substance, a third conductive layer, and a fourth conductive layer. The light-emitting element includes a portion overlapping with the opening portion. The light-emitting element has a function of emitting light toward the opening portion. The opening portion preferably has an area greater than or equal to 5% and less than or equal to 20% of the area of the first conductive layer.

In the display device of one embodiment of the present invention, a reflective liquid crystal element is included as the first display element, and an organic EL element is included as the second display element.

Thus, when a sufficient amount of external light enters the display device, display can be performed by utilizing external light and the reflective liquid crystal element. When the surroundings of the display device are dark and a small amount of external light enters the display device, display can be performed by utilizing the organic EL element. In this manner, with one embodiment of the present invention, a convenient display device having high visibility irrespective of surrounding brightness or an all-weather display device can be fabricated.

It is preferable that the display device having the above structure further include a signal line, a pixel circuit, a fifth conductive layer, a sixth conductive layer, and an insulating layer. The light-emitting element is electrically connected to the pixel circuit. The liquid crystal element is electrically connected to the fifth conductive layer. The fifth conductive layer includes a portion overlapping with the sixth conductive layer with the insulating layer provided therebetween. The fifth conductive layer is electrically connected to the sixth conductive layer. The sixth conductive layer is electrically connected to the pixel circuit. The pixel circuit is electrically connected to the signal line. The pixel circuit can drive both the light-emitting element and the liquid crystal element between which the insulating layer is sandwiched.

Figure 41:
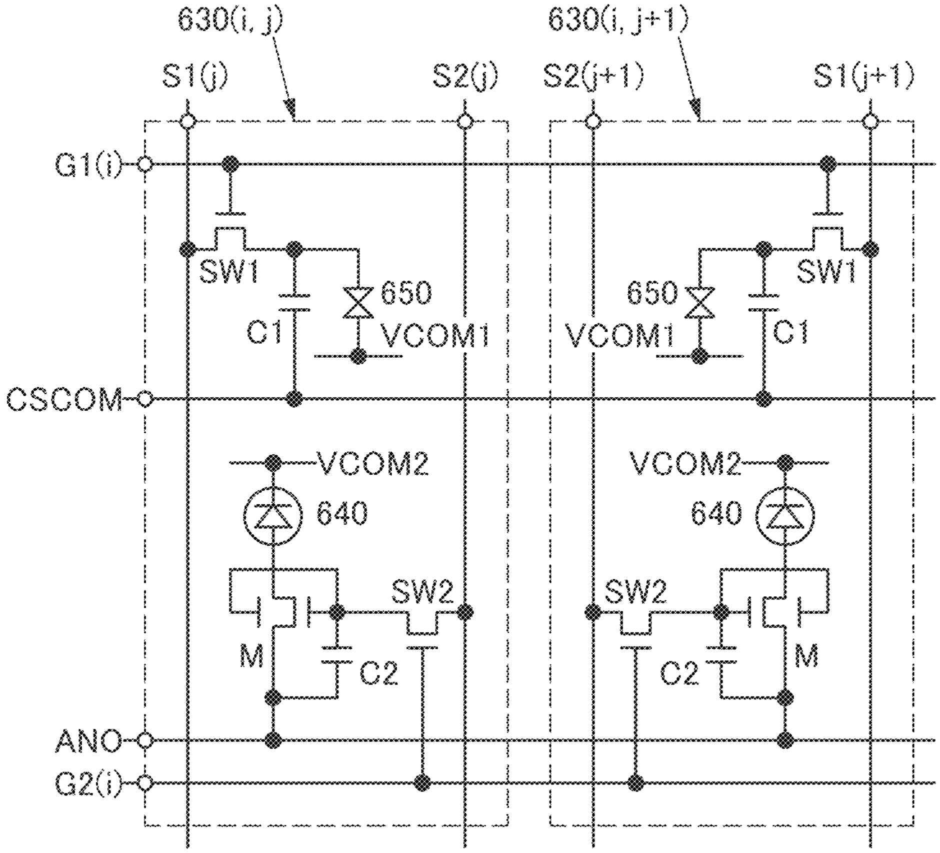
FIG. 41 illustrates an example of a pixel circuit of a display device.

FIG. 41 is a circuit diagram of pixel circuits included in the display device in this embodiment. FIG. 41 is a circuit diagram of a pixel circuit 630(*i,j*) and a pixel circuit 630(*i, j*+1).

The pixel circuits 630(*i,j*) and 630(*i,j*+1) illustrated in FIG. 41 each include a switch SW1, a switch SW2, a capacitor C1, a capacitor C2, and a transistor M. Although a first display element 650 and a second display element 640 are included in the dotted frame which denotes the pixel circuit in FIG. 41, hereinafter the case where the first display element 650 and the second display element 640 are not included in the pixel circuit is described.

FIG. 41 shows an example where the switch SW1 and the switch SW2 each include a transistor. The switch SW1 and the switch SW2 each preferably include a transistor using an oxide semiconductor.

The connection relation between the pixel circuits 630(*i,j*) and 630(*i,j*+1) in FIG. 41 is described.

The pixel circuit 630(*i,j*) is electrically connected to a signal line S1(*j*), a signal line S2(*j*), a scan line G1(*i*), a scan line G2(*i*), a wiring CSCOM, and a wiring ANO.

The pixel circuit 630(*i,j*+1) is electrically connected to a signal line S1(*j*+1), a signal line S2(*j*+1), a scan line G1(*i*), a scan line G2(*i*), a wiring CSCOM, and a wiring ANO.

In the case where a voltage of a signal supplied to the signal line S2(*j*) is different from a voltage of a signal supplied to the signal line S1(*j*+1), the signal line S1(*j*+1) is positioned apart from the signal line S2(*j*). In FIG. 41, the signal line S2(*j*+1) is positioned adjacent to the signal line S2(*j*).

A gate of the switch SW1 is electrically connected to the scan line G1(*i*). One of a source and a drain of the switch SW1 is electrically connected to the signal line S1(*j*) and the other is electrically connected to one electrode of the capacitor C1 and one electrode of the first display element 650.

The other electrode of the capacitor C1 is electrically connected to the wiring CSCOM.

The other electrode of the first display element 650 is electrically connected to a wiring VCOM1.

A gate of the switch SW2 is electrically connected to the scan line G2(*i*). One of a source and a drain of the switch SW2 is electrically connected to the signal line S2(*j*) and the other is electrically connected to a gate and a back gate of the transistor M and one electrode of the capacitor C2.

One of a source and a drain of the transistor M is electrically connected to the wiring ANO and the other electrode of the capacitor C2 and the other is electrically connected to one electrode of the second display element 640.

The other electrode of the second display element 640 is electrically connected to a wiring VCOM2.

The pixel circuit 630(*i,j*) is electrically connected to the first display element 650(*i,j*) and the second display element 640(*i,j*).

Figure 42A:
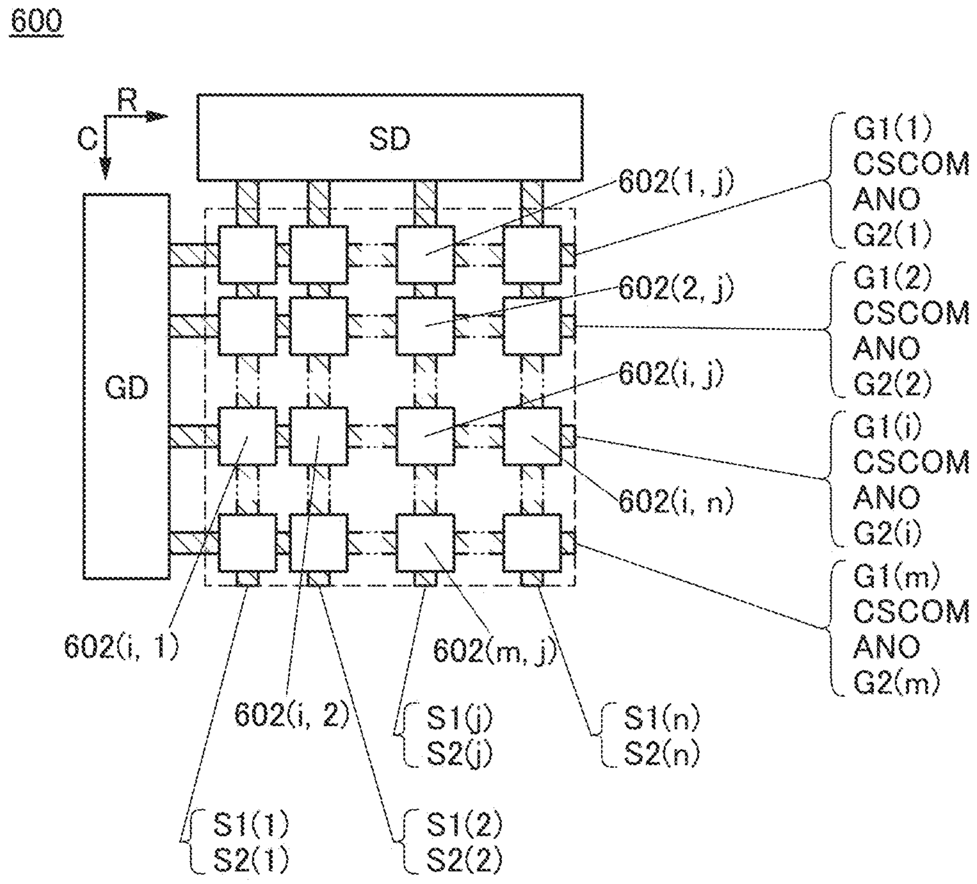
Figure 42A:
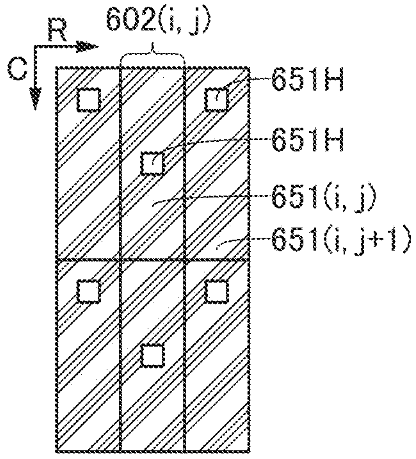
Figure 42A:
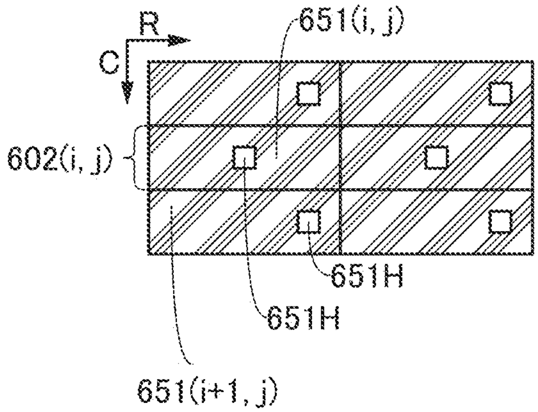

FIG. 42A is a block diagram illustrating arrangement of pixels, wirings, and the like included in a display device 600. FIGS. 42B1 and 42B2 are schematic views each illustrating opening portions 651H included in the display device 600.

As illustrated in FIG. 42A, the display device 600 includes i scan lines G1, i scan lines G2, j signal lines S1, j signal lines S2, j wirings CSCOM, j wirings ANO, m×n pixels 602, a driver circuit GD, and a driver circuit SD. Note that i is an integer greater than or equal to 1 and less than or equal to m, j is an integer greater than or equal to 1 and less than or equal to n, and m and n are each an integer greater than or equal to 1.

The display device 600 in FIGS. 42A, 42B1, and 42B2 includes the pixel 602(*i,j*).

The scan line G1(*i*), the scan line G2(*i*), the wiring CSCOM, and the wiring ANO are each electrically connected to a group of pixels 602(*i*,1) to 602(*i,n*) arranged in a row direction (a direction denoted by an arrow R in FIGS. 42A, 42B1, and 42B2).

The signal line S1(*j*) and the signal line S2(*j*) are each electrically connected to another group of pixels 602(1,*j*) to 602(*m,j*) arranged in a column direction (a direction denoted by an arrow C in FIGS. 42A, 42B1, and 42B2).

For example, the pixel 602(*i,j*+1) adjacent to the pixel 602(*i,j*) in the row direction preferably includes an opening portion in a position different from that of the opening portion 651H in the pixel 602(*i,j*) (FIG. 42B1).

Alternatively, for example, the pixel 602(*i*+1,*j*) adjacent to the pixel 602(*i,j*) in the column direction preferably includes an opening portion in a position different from that of the opening portion 651H in the pixel 602(*i,j*) (FIG. 42B2).

Alternatively, the opening portion 651H may be provided at the same position in all of the pixels.

The driver circuit GD is electrically connected to the scan line G1(*i*). As the driver circuit GD, any of a variety of sequential circuits such as a shift register can be used. In the driver circuit GD, a transistor, a capacitor, and the like can be used. A transistor included in the driver circuit GD can be formed in the same steps as the transistors included in the pixel circuit 630(*i,j*).

The driver circuit SD is electrically connected to the signal line S1(*j*). For example, an integrated circuit can be used as the driver circuit SD. Specifically, an integrated circuit formed on a silicon substrate can be used as the driver circuit SD.

For example, a chip on glass (COG) method can be used to mount the driver circuit SD on a pad electrically connected to the pixel circuit 630(*i,j*). Specifically, the integrated circuit can be mounted on the pad with the use of an anisotropic conductive film.

Figure 43A:
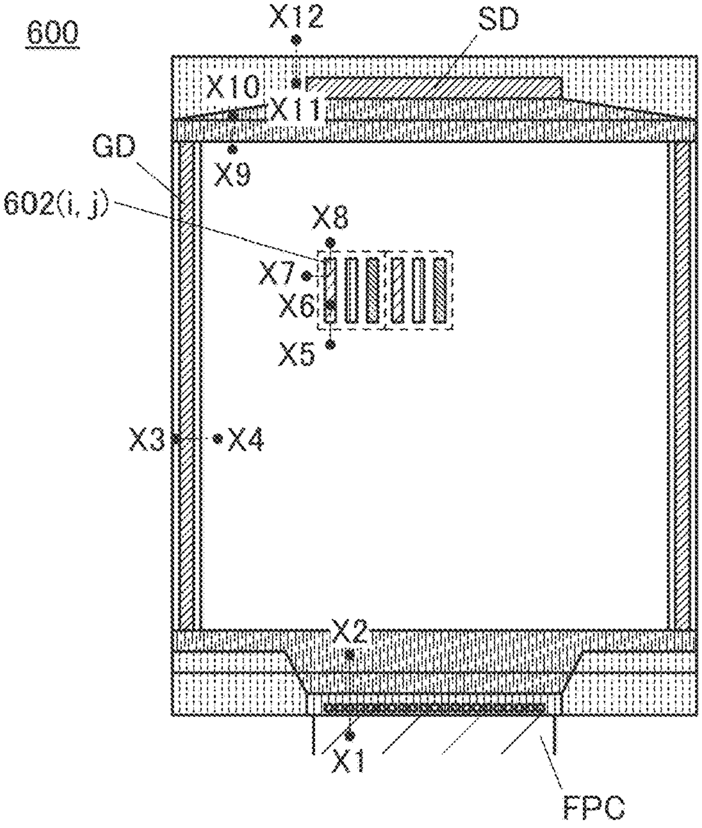
Figure 43A:
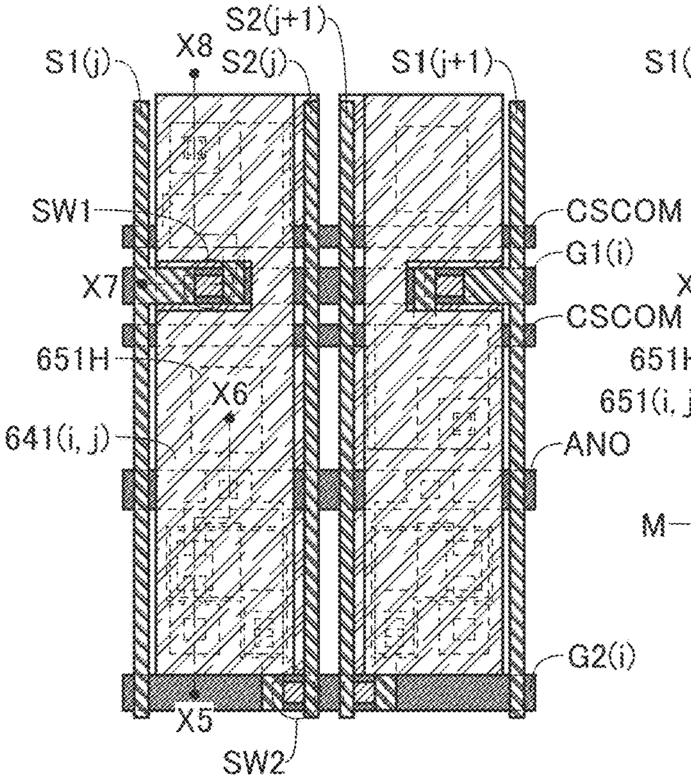
Figure 43A:
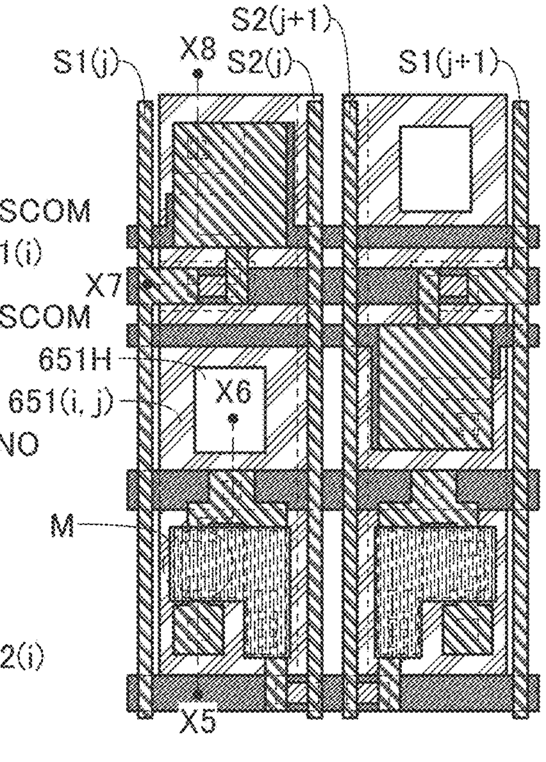

FIG. 43A is a bottom view (a view of a surface opposite to a display surface) of the display device 600. FIGS. 43B1 and 43B2 are each a bottom view illustrating a structure of part of the display device 600. FIG. 43B2 is a bottom view in which some components in FIG. 43B1 are not illustrated. FIG. 43A shows an example where one unit includes three pixels 602(*i,j*).

Figures 44A, 44B, 44C, 44D:
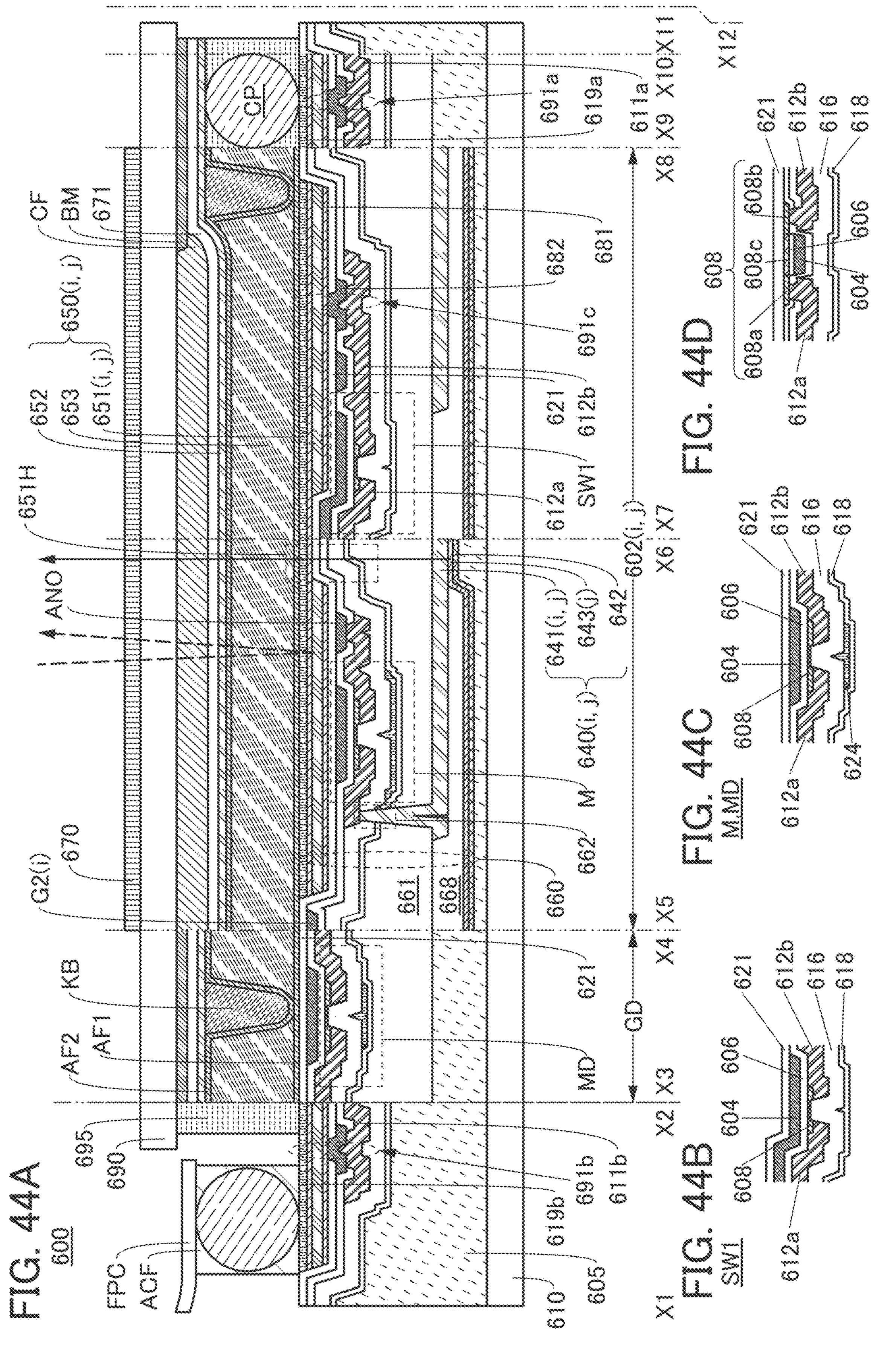
FIGS. 44A to 44D illustrate an example of a display device.

FIG. 44A is a cross-sectional view taken along dashed-dotted lines X1-X2, X3-X4, X5-X6, X7-X8, X9-X10, and X11-X12 in FIGS. 43A, 43B1, and 43B2. FIGS. 44B to 44D are each a structure example of a transistor which can be used in the display device 600.

In FIG. 44A, a dashed arrow denotes the direction in which the first display element 650(*i,j*) performs display by controlling the intensity of external light reflection. In addition, in FIG. 44A, a solid arrow denotes the direction in which the second display element 640(*i,j*) performs display. Thus, the first display element 650(*i,j*) and the second display element 640(*i,j*) can perform display in the same direction.

As illustrated in FIG. 44A, the driver circuit GD includes a transistor MD.

As illustrated in FIG. 44A, the pixel 602(*i,j*) includes the first display element 650(*i,j*), the second display element 640(*i,j*), a first conductive layer 681, a second conductive layer 682, an insulating layer 621, and the pixel circuit 630(*i,j*). In FIG. 44A, the transistor M and the switch SW1 in the pixel circuit 630(*i,j*) are illustrated.

The first display element 650(*i,j*) includes a first electrode 651(*i,j*), a second electrode 652, and a layer 653 containing a liquid crystal material. The second electrode 652 is positioned so that an electric field which controls the alignment of the liquid crystal material is generated between the second electrode 652 and the first electrode 651(*i,j*).

The display device 600 preferably includes an alignment film AF1 and an alignment film AF2. The layer 653 containing a liquid crystal material is positioned between the alignment film AF1 and the alignment film AF2.

The first display element 650(*i,j*) includes a reflective layer which has a function of reflecting incident light. In addition, the first display element 650(*i,j*) has a function of controlling the intensity of reflected light. The reflective layer includes the opening portion 651H. FIG. 44A shows an example where the first electrode 651(*i,j*) includes a stack of a conductive layer that transmits light and a conductive layer that reflects light. Note that the reflective layer may be provided separately from the first electrode 651(*i,j*).

As illustrated in FIG. 44A, side edge portions of the first electrode 651(*i,j*) are embedded in the insulating layer 621.

As the second display element 640(*i,j*), a light-emitting element can be used. The second display element 640(*i,j*) includes a third electrode 641(*i,j*), a fourth electrode 642, and a layer 643(*j*) containing a light-emitting substance. An insulating layer 668 covers end portions of the third electrode 641(*i,j*). The insulating layer 668 formed along the edges of the third electrode 641(*i,j*) can prevent a short circuit between the third electrode 641(*i,j*) and the fourth electrode 642.

The second display element 640(*i,j*) has a function of emitting light toward the opening portion 651H.

The second display element 640(*i,j*) can perform display in a region surrounded by a region in which the first display element 650(*i,j*) performs display (FIGS. 43B1 and 43B2). The first display element 650(*i,j*) performs display in a region overlapping with the first electrode 651(*i,j*), and the second display element 640(*i,j*) performs display in a region overlapping with the opening portion 651H.

The first conductive layer 681 is electrically connected to the first display element 650(*i,j*). In FIG. 44A, the first conductive layer 681 and the first electrode 651(*i,j*) are electrically connected to each other. The first conductive layer 681 can have a single-layer structure or a stacked-layer structure. The first conductive layer 681 may serve as the first electrode 651(*i,j*).

The second conductive layer 682 has a region overlapping with the first conductive layer 681. The second conductive layer 682 can have a single-layer structure or a stacked-layer structure.

The insulating layer 621 has a region sandwiched between the second conductive layer 682 and the first conductive layer 681.

In a region 691*c*, the second conductive layer 682 is electrically connected to the first conductive layer 681.

The second conductive layer 682 is electrically connected to the pixel circuit 630(*i,j*). In FIG. 44A, the second conductive layer 682 is electrically connected to a conductive layer 612*b*.

One of a conductive layer 612*a* and the conductive layer 612*b* functions as a source of the transistor serving as the switch SW1 and the other functions as a drain thereof. The conductive layer 612*a* is electrically connected to the signal line S1(*j*). Alternatively, the conductive layer 612*a* can be referred to as part of the signal line S1(*j*) (FIG. 41 and FIG. 44A).

The first electrode 651(*i,j*) included in the first display element 650(*i,j*) is electrically connected to the conductive layer 612*b* included in the switch SW1 through the first conductive layer 681 and the second conductive layer 682. In other words, the first display element 650(*i,j*) is electrically connected to the pixel circuit 630(*i,j*). Note that a method for electrically connecting the first display element 650(*i,j*) to the pixel circuit 630(*i,j*) is not limited thereto. For example, the first electrode 651(*i,j*) may be electrically connected to the conductive layer 612*b* through the first conductive layer 681 or the second conductive layer 682. Alternatively, the first electrode 651(*i,j*) may be directly connected to the conductive layer 612*b*.

One of the source and the drain of the transistor M is electrically connected to the wiring ANO. The third electrode 641(*i,j*) included in the second display element 640(*i,j*) is electrically connected to the other of the source and the drain of the transistor M in a connection portion 662.

Thus, the second display element 640(*i,j*) is electrically connected to the pixel circuit 630(*i,j*). The transistor M overlaps with the third electrode 641(*i,j*) with the insulating layer 661 provided therebetween.

The display device 600 further includes a conductive layer 619*b* and a conductive layer 611*b* (FIG. 44A).

The insulating layer 621 has a region sandwiched between the conductive layer 619*b* and the conductive layer 611*b*.

The conductive layer 619*b* is electrically connected to the conductive layer 611*b* in a region 691*b*. In addition, the conductive layer 611*b* is electrically connected to the pixel circuit 630(*i,j*).

The conductive layer 619*b* is electrically connected to a flexible printed circuit board (referred to as an FPC) through a connector ACF. As a result, power or signals can be supplied to the pixel circuit through the conductive layer 619*b*. In FIG. 44A, a connection portion between the conductive layer 619*b* and the FPC is positioned on a display surface side of the display device 600; however, the connection portion may be positioned on a surface opposite to the display surface.

The pixel 602(*i,j*) further includes a coloring layer CF, a light-blocking layer BM, an insulating layer 671, and a functional film 670.

The coloring layer CF has a region overlapping with the first display element 650(*i,j*). The light-blocking layer BM has an opening portion in a region overlapping with the first display element 650(*i,j*).

The coloring layer CF has a region overlapping with the second display element 640(*i,j*). The light-blocking layer BM has an opening portion in a region overlapping with the second display element 640(*i,j*).

The insulating layer 671 is provided between the layer 653 containing a liquid crystal material and the coloring layer CF or the light-blocking layer BM. Thus, unevenness due to the thickness of the coloring layer CF can be reduced. Alternatively, impurities can be prevented from being diffused from the light blocking layer BM, the coloring layer CF, or the like to the layer 653 containing a liquid crystal material.

The functional film 670 has a region overlapping with the first display element 650(*i,j*) and a region overlapping with the second display element 640(*i,j*). The functional film 670 is provided so that a substrate 690 is sandwiched between the functional film 670 and the first display element 650(*i,j*).

The second display element 640(*i,j*) is sealed by a bonding layer 605 and a substrate 610. A method for sealing the second display element 640(*i,j*) is not limited thereto. For example, the second display element 640(*i,j*) can be covered with an insulating film having a high gas barrier property. In this case, the bonding layer 605 and the substrate 610 are not necessarily provided.

The substrate 690 has a region overlapping with the substrate 610. A functional layer 660 is provided between the substrate 610 and the substrate 690. The functional layer 660 includes the pixel circuit 630(*i,j*), the second display element 640(*i,j*), an insulating layer 616, an insulating layer 618, the insulating layer 621, the insulating layer 661, and the insulating layer 668. A bonding layer 695 has a function of bonding the functional layer 660 to the substrate 690. A structure body KB has a function of providing a certain space between the functional layer 660 and the substrate 690.

The substrate 690 is preferably thin. For example, for the substrate 690, a non-alkali glass substrate polished to a thickness of 0.2 mm or 0.1 mm can be preferably used.

The display device 600 further includes a conductive layer 619*a*, a conductive layer 611*a*, and a conductor CP.

The insulating layer 621 has a region sandwiched between the conductive layer 619*a* and the conductive layer 611*a*.

The conductive layer 619*a* is electrically connected to the conductive layer 611*a* in a region 691*a*. In addition, the conductive layer 611*a* is electrically connected to the pixel circuit 630(*i,j*).

The conductor CP is sandwiched between the conductive layer 619*a* and the second electrode 652, and electrically connects the conductive layer 619*a* to the second electrode 652. For example, a conductive particle can be used as the conductor CP.

Examples of materials which can be used for the display device are described below. Note that the description of Embodiment 3 can be referred to for the materials which can be used for the substrate, the bonding layer, the transistor, the light-emitting element, the conductive layer, the insulating layer, the coloring layer, and the light-blocking layer included in the display device; thus, detailed description of the materials is omitted.

For example, a display element having a function of controlling transmission or reflection of light can be used as the first display element 650(*i,j*). For example, a combined structure of a polarizing plate and a liquid crystal element or a MEMS shutter display element can be used. The use of a reflective display element can reduce power consumption of a display panel. Specifically, a reflective liquid crystal display element can be used as the first display element 650(*i,j*).

A liquid crystal element that can be driven by any of the following driving methods can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

For example, thermotropic liquid crystal, low-molecular liquid crystal, high-molecular liquid crystal, polymer dispersed liquid crystal, ferroelectric liquid crystal, or anti-ferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

For the reflective layer, a material that reflects visible light is used. For example, a material containing silver, a material containing silver and palladium, and a material containing silver and copper can be used.

The reflective layer can reflect light transmitted through the layer 653 containing a liquid crystal material.

The reflective layer may have an uneven surface. In that case, incident light is reflected in various directions, which enables white display.

The first electrode 651(*i,j*) may be used for the reflective layer. Alternatively, the reflective layer may be positioned between the layer 653 containing a liquid crystal material and the first electrode 651(*i,j*). Alternatively, the light-transmitting first electrode 651(*i,j*) may be positioned between the reflective layer and the layer 653 containing a liquid crystal material.

The total area of the opening portion 651H can be set as appropriate. If the ratio of the total area of the opening portion 651H to the total area of the reflective layer other than the opening portion is low, bright images can be displayed using the first display element 650(*i,j*). If the ratio of the total area of the opening portion 651H to the total area of the reflective layer other than the opening portion is high, bright images can be displayed using the second display element 640(*i,j*). The area of the opening portion 651H is preferably set to obtain sufficient bright images using any display element.

Furthermore, if the area of the opening portion 651H is small, a uniform electric field can be applied to the layer 653 containing a liquid crystal material and a reduction in display quality of the first display element 650(*i,j*) can be suppressed. If the area of the opening portion 651H is large, light emitted from the second display element 640(*i,j*) can be extracted to the outside of the display device with high efficiency.

The shape of the opening portion 651H is not particularly limited, and may be a polygonal shape such as a quadrangular shape, an elliptical shape, a circular shape, a cross shape, a stripe shape, a slit-like shape, and a checkered pattern, for example. The opening portion 651H may be close to the adjacent pixel. The opening portion 651H is preferably provided close to a subpixel emitting light of the same color, in which case an undesired phenomenon in which light emitted from the second display element 640(*i,j*) enters a coloring layer of the adjacent subpixel emitting light of different color (also referred to as cross talk) can be suppressed.

For the second electrode 652, a conductive material transmitting visible light can be used. For example, a conductive oxide such as a conductive oxide containing indium can be used for the second electrode 652. Alternatively, a metal film that is thin enough to transmit light (e.g., a thickness of 1 nm or more and 10 nm or less) can be used as the second electrode 652. Alternatively, a metal nanowire such as a nanowire containing silver can be used for the second electrode 652.

Specifically, indium oxide, indium tin oxide, indium zinc oxide, zinc oxide, zinc oxide to which gallium is added, zinc oxide to which aluminum is added, or the like can be used for the second electrode 652.

For the structure body KB, an organic material, an inorganic material, or a composite material of an organic material and an inorganic material can be used. The structure body KB functions as a spacer. As the structure body KB, a particulate spacer may be used. For the particulate spacer, silica or an elastic material such as a resin or rubber is preferably used. In some cases, the particulate spacer may be vertically crushed.

For the alignment films AF1 and AF2, polyimide or the like can be used. The alignment films AF1 and AF2 are preferably formed by a rubbing process or an optical alignment technology so as to be aligned in a predetermined direction. For example, a film containing soluble polyimide can be used as the alignment films AF1 and AF2.

As the functional film 670, a polarizing plate, a retardation plate, a diffusing film, an anti-reflective film, a condensing film, or the like can be used. Alternatively, a polarizing plate containing a dichromatic pigment can be used for the functional film 670. Alternatively, an antistatic film preventing the attachment of a foreign substance, a water repellent film suppressing the attachment of stain, a hard coat film suppressing generation of a scratch in use, or the like can be used for the functional film 670.

The display device includes transistors with one or more kinds of structures. For example, in the display device, at least one kind of the transistors with the structures illustrated in FIGS. 44B to 44D can be used.

The switch SW1 illustrated in FIG. 44B includes a conductive layer 604, an insulating layer 606, a semiconductor layer 608, the conductive layer 612*a*, and the conductive layer 612*b*. The conductive layer 604 functions as a gate. One of the conductive layer 612*a* and the conductive layer 612*b* functions as a source and the other functions as a drain. The insulating layer 606 functions as a gate insulating layer. The structure of the switch SW1 is not limited to the structure in FIG. 44B, and may be the structure illustrated in FIG. 44C or 44D.

The transistor M and the transistor MD illustrated in FIG. 44C include the conductive layer 604, the insulating layer 606, the semiconductor layer 608, the conductive layer 612*a*, the conductive layer 612*b*, and a conductive layer 624. The conductive layer 604 functions as a gate. One of the conductive layer 612*a* and the conductive layer 612*b* functions as a source and the other functions as a drain. The insulating layer 606 functions as a gate insulating layer. The conductive layer 624 functions as a back gate. The insulating layer 616 is positioned between the conductive layer 624 and the semiconductor layer 608. The conductive layer 624 has a portion overlapping with the conductive layer 604 with the semiconductor layer 608 provided therebetween. The conductive layer 624 is positioned between the insulating layer 616 and the insulating layer 618. The transistor M and the transistor MD may have the same structure or different structures. For example, the transistor M and the transistor MD can each have any of the structures illustrated in FIGS. 44B to 44D. In the transistor M in FIG. 44A, the width of the conductive layer 604 is, but not limited to, smaller than that of the conductive layer 624. In the transistor MD in FIG. 44A, the width of the conductive layer 604 is, but not limited to, larger than that of the conductive layer 624; however, the present invention is not limited thereto.

A transistor illustrated in FIG. 44D includes the conductive layer 604, the insulating layer 606, the semiconductor layer 608, the conductive layer 612*a*, and the conductive layer 612*b*. The conductive layer 604 functions as a gate. The insulating layer 606 functions as a gate insulating layer.

The semiconductor layer 608 includes a first region 608*a* and a second region 608*b* which do not overlap with the conductive layer 604. The semiconductor layer 608 further includes a third region 608*c* between the first region 608*a* and the second region 608*b*. The third region 608*c* overlaps with the conductive layer 604.

The first region 608*a* and the second region 608*b* have lower resistivity than the third region 608*c*, and one of the first region 608*a* and the second region 608*b* serves as a source region and the other serves as a drain region. The first region 608*a* is electrically connected to the conductive layer 612*a*. The second region 608*b* is electrically connected to the conductive layer 612*b*.

Figure 45:
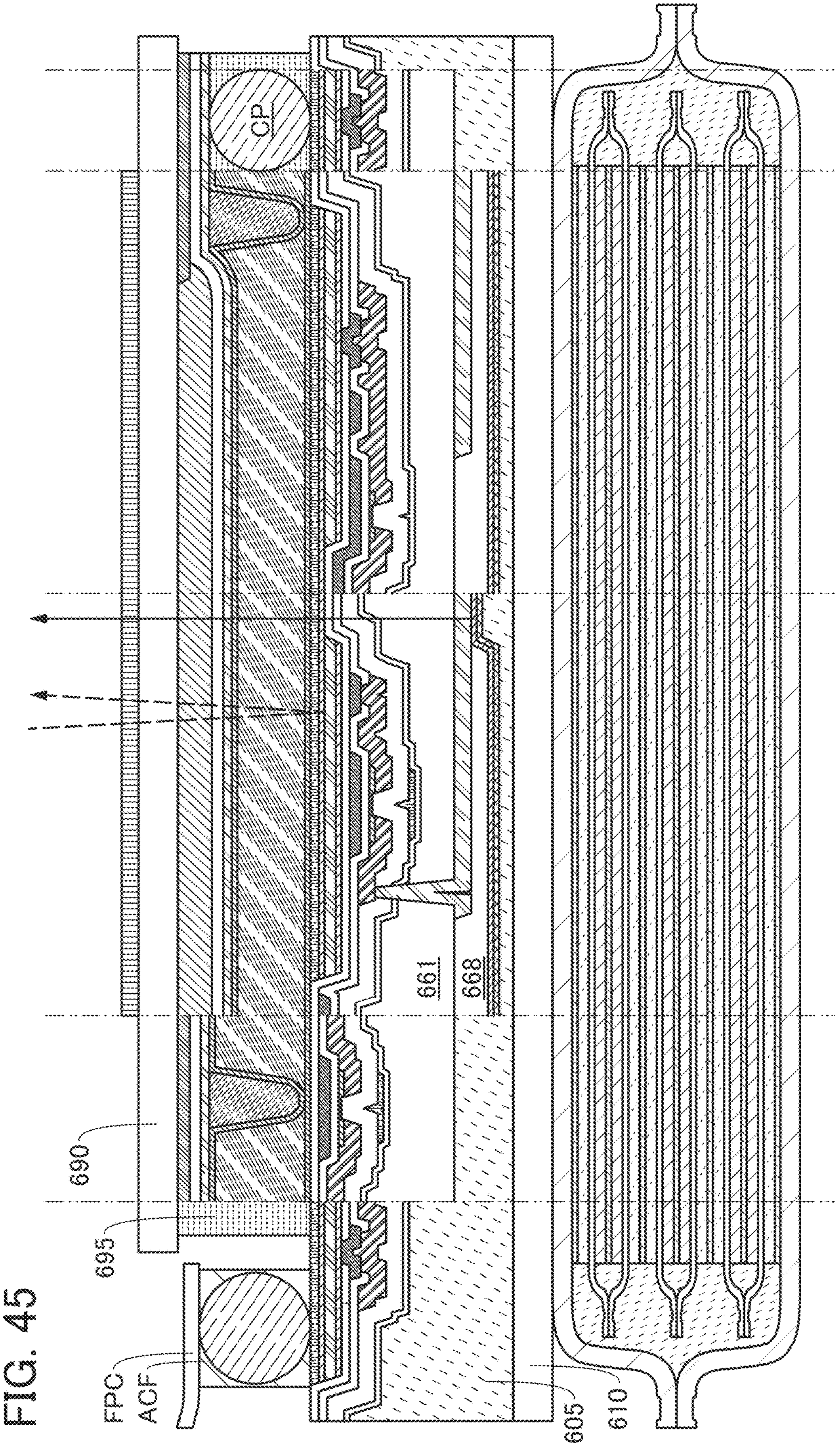
FIG. 45 illustrates an example of components of an electronic device.

As described in Embodiment 1 and the like, in the electronic device of one embodiment of the present invention, the display panel and the power storage device overlap with each other. FIG. 45 illustrates an example of a cross-sectional view in the case where a display panel and a thin secondary battery overlap with each other. The display panel in FIG. 45 has a structure similar to that of the display device 600 in FIG. 44A and the thin secondary battery in FIG. 45 has a structure similar to that of the battery unit 500 in FIG. 14A.

In FIG. 45, the substrate 610 included in the display panel and the exterior body 509 included in the battery unit are in contact with each other; however, one embodiment of the present invention is not limited thereto. The display panel and the battery unit may be fixed to each other with an adhesive or the like. Alternatively, a circuit board or the like may be provided between the display panel and the battery unit.

This embodiment can be combined with any other embodiment as appropriate.

This application is based on Japanese Patent Application serial no. 2015-088420 filed with Japan Patent Office on Apr. 23, 2015, and Japanese Patent Application serial no. 2015-157021 filed with Japan Patent Office on Aug. 7, 2015, and the entire contents of which are hereby incorporated by reference.

What is claimed is:

1. An electronic device comprising:
- a sealing structure;
- a plastic case;
- a first region comprising a display panel;
- a second region comprising a power storage device and a circuit; and
- a third region between the first region and the second region,
- wherein the first region is placed in a first space put into the plastic case,
- wherein the second region is placed in a second space put into the plastic case,
- wherein the third region is put into the plastic case,
- wherein the plastic case is sealed by the sealing structure,
- wherein the first space is apart from the second space,
- wherein at least one of the first space and the second space is in a reduced-pressure atmosphere,
- wherein the power storage device has flexibility,
- wherein the display panel has flexibility,
- wherein the sealing structure has flexibility,
- wherein at least part of the second region overlapping with the power storage device has flexibility,
- wherein the display panel is electrically connected to the power storage device and the circuit through wirings overlapping with the third region,
- wherein the third region is a flexible region,
- wherein the flexibility of the display panel is lower than the flexibility of the sealing structure, and
- wherein an end portion of the electronic device is configured to be bent.

2. The electronic device according to claim 1, wherein the circuit comprises an antenna and is configured to charge the power storage device wirelessly.

3. The electronic device according to claim 1,
- wherein the display panel comprises a light-emitting element, and
- wherein at least part of the sealing structure is configured to transmit light emitted from the light-emitting element.

4. The electronic device according to claim 1, further comprising a member is configured to worn the electronic device on an arm.

5. The electronic device according to claim 1, wherein a buoyancy material is inside the sealing structure.

6. The electronic device according to claim 5, wherein the buoyancy material is a gas-sealed type buoyancy material.

* * * * *